(12) United States Patent
Choi et al.

(10) Patent No.: US 12,471,427 B2
(45) Date of Patent: Nov. 11, 2025

(54) DISPLAY MODULE AND METHOD FOR MANUFACTURING DISPLAY MODULE

(71) Applicant: SAMSUNG ELECTRONICS CO., LTD., Suwon-si (KR)

(72) Inventors: Wonsik Choi, Suwon-si (KR); Doyoung Kwag, Suwon-si (KR); Byungchul Kim, Suwon-si (KR); Sangmoo Park, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 593 days.

(21) Appl. No.: 17/880,027

(22) Filed: Aug. 3, 2022

(65) Prior Publication Data
US 2022/0375907 A1   Nov. 24, 2022

Related U.S. Application Data

(63) Continuation of application No. PCT/KR2021/002301, filed on Feb. 24, 2021.

(30) Foreign Application Priority Data

Mar. 5, 2020  (KR) .................. 10-2020-0027600
Nov. 12, 2020 (KR) .................. 10-2020-0151353

(51) Int. Cl.
*H10H 29/02*   (2025.01)
*H01L 25/075*  (2006.01)
(Continued)

(52) U.S. Cl.
CPC ......... *H10H 29/02* (2025.01); *H01L 25/0753* (2013.01); *H10H 20/01* (2025.01); *H10H 29/0364* (2025.01)

(58) Field of Classification Search
CPC ...... H10H 20/01; H10H 20/857; H10H 29/02; H10H 29/012; H10H 29/857; H01L 25/167; H01L 33/62
See application file for complete search history.

(56) References Cited

U.S. PATENT DOCUMENTS 6,613,610 B2   9/2003  Iwafuchi et al.
6,872,635 B2   3/2005  Hayashi et al.
(Continued)

FOREIGN PATENT DOCUMENTS

CN   108010994 A   5/2018
CN   109449102 A   3/2019
(Continued)

OTHER PUBLICATIONS

Office Action dated Dec. 26, 2024, issued by the Korean Patent Office in Korean Patent Application No. 10-2020-0151353.
(Continued)

*Primary Examiner* — Lauren R Bell
(74) *Attorney, Agent, or Firm* — Sughrue Mion, PLLC

(57) ABSTRACT

A method for manufacturing a display module includes the steps of: transferring LEDs of a substrate to a first relay substrate; transferring the LEDs of the first relay substrate to a second relay substrate in a primary stretch array such that a gap between adjacent LEDs on the second relay substrate is greater than a gap between adjacent LEDs on the first relay substrate in one direction from among a row direction and a column direction; and transferring the LEDs of the second relay substrate to a target substrate in a secondary stretch array such that a gap between adjacent LEDs on the target substrate is greater than a gap between adjacent LEDs on the second relay substrate in a remaining direction from among the row direction and the column direction.

9 Claims, 70 Drawing Sheets

(51) Int. Cl.
   *H10H 20/01* (2025.01)
   *H10H 29/01* (2025.01)

(56) References Cited

U.S. PATENT DOCUMENTS

| | | | |
|---|---|---|---|
| 10,062,738 | B2 | 8/2018 | Forrest et al. |
| 10,070,568 | B2 | 9/2018 | Pourchet et al. |
| 10,089,908 | B2 | 10/2018 | Chen et al. |
| 10,177,123 | B2 | 1/2019 | Gardner et al. |
| 10,304,810 | B2 | 5/2019 | Gardner et al. |
| 10,325,893 | B2 | 6/2019 | Chong et al. |
| 10,622,241 | B2 * | 4/2020 | Shieh ............... H01L 21/67144 |
| 10,658,220 | B2 | 5/2020 | Koyanagi et al. |
| 10,863,658 | B2 | 12/2020 | Pourchet et al. |
| 11,004,705 | B2 | 5/2021 | Kwang et al. |
| 11,158,668 | B2 | 10/2021 | Lee et al. |

FOREIGN PATENT DOCUMENTS

| | | | |
|---|---|---|---|
| KR | 10-0853410 | B1 | 8/2008 |
| KR | 10-0937840 | B1 | 1/2010 |
| KR | 10-2015-0082414 | A | 7/2015 |
| KR | 10-2017-0079930 | A | 7/2017 |
| KR | 10-2017-0095914 | A | 8/2017 |
| KR | 10-2018-0069039 | A | 6/2018 |
| KR | 10-2019-0009230 | A | 1/2019 |
| KR | 10-2019-0014430 | A | 2/2019 |
| KR | 10-2019-0032064 | A | 6/2019 |
| KR | 10-2019-0105504 | A | 9/2019 |
| KR | 10-2019-0114128 | A | 10/2019 |
| KR | 10-2019-0121393 | A | 10/2019 |
| KR | 10-2019-0127666 | A | 11/2019 |
| KR | 10-2020-0014867 | A | 2/2020 |
| WO | 2018/170352 | A1 | 9/2018 |

OTHER PUBLICATIONS

International Search Report (PCT/ISA/210) issued Jun. 11, 2021 by the International Searching Authority in counterpart International Patent Application No. PCT/KR2021/002301.

Written Opinion (PCT/ISA/237) issued Jun. 11, 2021 by the International Searching Authority in counterpart International Patent Application No. PCT/KR2021/002301.

* cited by examiner

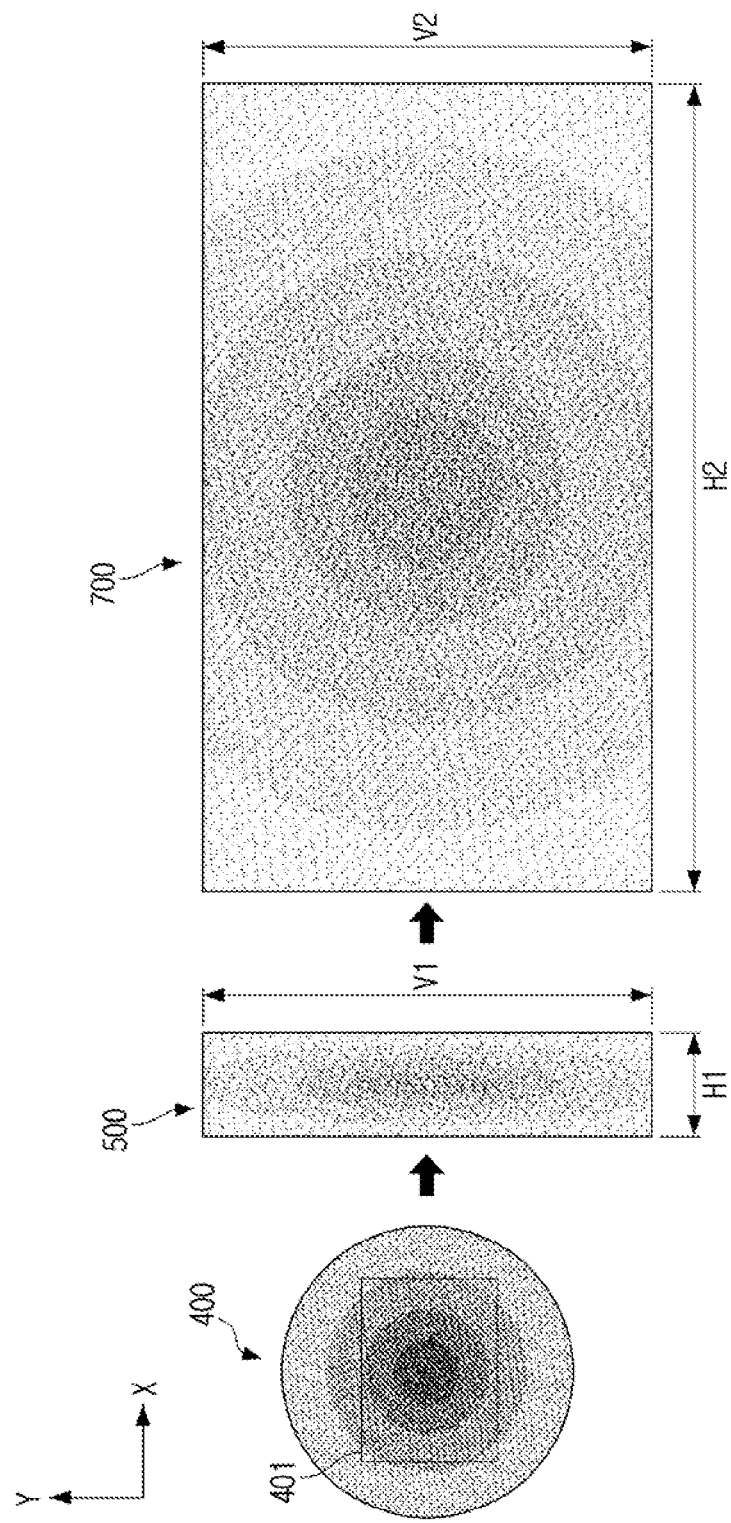

DISPLAY MODULE AND METHOD FOR MANUFACTURING DISPLAY MODULE

CROSS-REFERENCE TO RELATED APPLICATIONS

This application is a Bypass Continuation of International Application No. PCT/KR2021/002301, filed on Feb. 24, 2021, which claims priority to Korean Patent Application Nos. 10-2020-0027600, filed on Mar. 5, 2020, and 10-2020-0151353, filed on Nov. 12, 2020, at the Korean Intellectual Property Office, the disclosure of which are incorporated by reference herein in their entireties.

FIELD

The disclosure relates to a display module provided with multiple LEDs and a method for manufacturing a display module.

DESCRIPTION OF RELATED ART

Light emitting diodes (LEDs) include an inorganic light-emitting material which emits light on its own. When applying the LEDs as described to the display module, there is no need for a backlight. The LEDs formed on a wafer through an epitaxial (EPI) process may constitute the display module by being transferred to a target substrate.

The multiple LEDs formed on the wafer may show a difference in performance (color, brightness, etc.) between areas because of a manufacturing tolerance generated as a result of technical limitations in the manufacturing process. Compared to the LEDs distributed in one area of the wafer (e.g., a center part of a wafer), the performance of the LEDs distributed in an area growing farther from the one area may be lower.

The disclosure may maximize a number of LED chips per an epi substrate and accordingly lower a unit cost of the LED by forming the epi substrate through an etch process such as a photolithographic process and the like and a separation process between devices such as an isolation process so as to maintain grating direction gaps between the LEDs which are to be grown on a wafer to minimum processable gaps.

In addition, in an aspect of the disclosure, by consecutively stretch arraying multiple LEDs in a row direction and consecutively stretch arraying multiple LEDs in a column direction (or, stretch arraying in the column direction and stretch arraying in a row direction), ultimately periodic patterns may be prevented from appearing on a target substrate when transferring the multiple LEDs to a target substrate as a desired display pitch (or pixel pitch), and a seam may be prevented from appearing between display modules adjacent to one another when forming a large format display (LFD) by connecting the multiple display modules.

SUMMARY

In accordance with an aspect of the disclosure, a method for manufacturing a display module includes transporting light emitting diodes (LEDs) of a substrate to a first relay substrate; transporting the LEDs of the first relay substrate to a second relay substrate in a primary stretch array such that a gap between adjacent LEDs on the second relay substrate is greater than a gap between adjacent LEDs on the first relay substrate in one direction from among a row direction and a column direction; and transporting the LEDs of the second relay substrate to a target substrate in a secondary stretch array such that a gap between adjacent LEDs on the target substrate is greater than a gap between adjacent LEDs on the second relay substrate in a remaining direction from among the row direction and the column direction.

The LEDs of the substrate may be configured such that row direction gaps and column direction gaps between adjacent LEDs are maintained to a processable minimum gap.

The method may include transporting the LEDs of the substrate to the first relay substrate in a same array as an array on the substrate.

The LEDs may have a same color.

The method may include transferring the LEDs of the second relay substrate to the target substrate in a laser transfer method.

The method may include electrically and physically connecting the LEDs transferred to the target substrate through a conductive adhesive formed on the target substrate in a thermally pressing method.

The method may include transferring the LEDs of the second relay substrate to the target substrate in a thermally pressing method.

The method may include electrically and physically connecting the LEDs transferred to the target substrate to an anisotropic conductive film layer formed on the target substrate by the thermally pressing method.

In accordance with an aspect of the disclosure, a method for manufacturing a display module includes transporting light emitting diodes (LEDs) of a substrate to a first relay substrate in an array of the substrate; transporting the LEDs of the first relay substrate to a second relay substrate, the LEDs on the second relay substrate being arrayed at a first chip pitch in a row direction and at a second chip pitch in a column direction; transporting the LEDs of the second relay substrate to a third relay substrate, the LEDs on the third relay substrate being arrayed at a third chip pitch in one direction from among the row direction and the column direction; transporting the LEDs of the third relay substrate to a fourth relay substrate, the LEDs on the fourth relay substrate being arrayed at a fourth chip pitch in a remaining direction from among the row direction and the column direction; and transporting the LEDs of the fourth relay substrate to a target substrate to be arrayed at a first display pitch, which is equal to one from among the third chip pitch and the fourth chip pitch, and at a second display pitch, which is equal to a remaining one from among the third chip pitch and the fourth chip pitch.

The third chip pitch may include a row direction chip pitch that is greater than the first chip pitch, and the fourth chip pitch may include a column direction chip pitch that is greater than the second chip pitch.

The first display pitch may have a gap between adjacent LEDs that is equal to the third chip pitch in the row direction, and the second display pitch may have a gap between adjacent LEDs that is equal to the fourth chip pitch in the column direction.

In accordance with an aspect of the disclosure, a display module includes a target substrate formed with a thin film transistor (TFT) layer at one surface; and light emitting diodes (LEDs) mounted in a grating array on the TFT layer, wherein the LEDs are arrayed on the target substrate, based on being transferred to the target substrate from at least two relay substrates and from an epi substrate, the LEDs being primary stretch arrayed on the target substrate in one direction from among a row direction and a column direction and secondary stretch arrayed in a remaining direction from among the row direction and the column direction.

The LEDs may have a same color.

The target substrate may be formed with a conductive adhesion layer on the TFT layer, the conductive adhesion layer being configured to electrically and physically connect the LEDs with the TFT layer.

The target substrate may be formed with an anisotropic conductive film layer on the TFT layer, the anisotropic conductive film layer being configured to electrically and physically connect the multiple LEDs with the TFT layer.

BRIEF DESCRIPTION OF THE DRAWINGS

FIG. 10A is a schematic diagram illustrating a process of transferring multiple LEDs to a target substrate consecutively passing first and second relay substrates through a manufacturing method of a display module according to an embodiment;

DETAILED DESCRIPTION

Figure 1A:
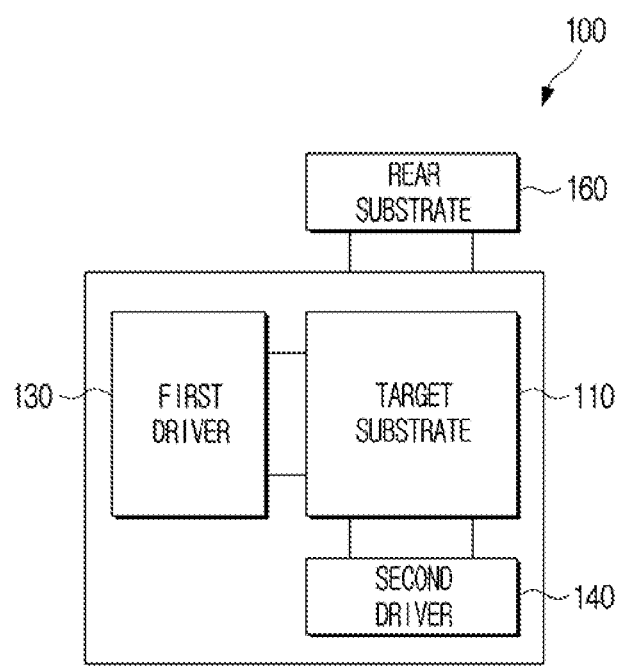
FIG. 1A is a block diagram illustrating schematically a display module according to an embodiment.

Various embodiments will be described in greater detail below with reference to the accompanied drawings. The embodiments described herein may be variously modified. Specific embodiments may be depicted in the drawings and described in detail in the detailed description. However, the specific embodiments described in the accompanied drawings are merely to assist in the understanding of various embodiments. Accordingly, the technical spirit is not to be limited by the specific embodiments described in the accompanied drawings, and should be interpreted to include all equivalents or alternatives of the embodiments included in the ideas and the technical scopes disclosed herein.

In the disclosure, expressions such as "comprise," "include" or the like are used to designate a presence of a characteristic, number, step, operation, element, component, or a combination thereof, and not to preclude a presence or a possibility of adding one or more of other characteristics, numbers, steps, operations, elements, components or a combination thereof. Terms including ordinals such as "first," and "second" may be used in describing the various elements, but the elements are not to be limited by the above-described terms. The above-described terms may be used only to distinguish one element from another.

A "module" or "part" with respect to the elements used herein may perform at least one function or an operation. Further, the "module" or "part" may perform a function or an operation implemented by a hardware or software, or a combination of hardware and the software. In addition, a plurality of "modules" or a plurality of "parts", except for a "module" or a "part" which needs to be performed from a specific hardware or performed in at least one processor, may be integrated to at least one module. A singular expression includes a plural expression, unless otherwise specified.

In describing each configuration in the disclosure, the expression 'is the same' which is used when describing a gap between configurations, a thickness of a configuration, a shape, a direction, and the like may mean as within a predetermined error range and not fully the same. For example, because 'same' in expressions such as same pitch, same chip pitch, same display pitch, and the like means being within a range allowing for an error range which may occur during a manufacturing process, it may mean even that of which is not fully the same. In addition, when describing transfer methods according to various embodiments, the expression 'same method' may mean including even cases in which all processes are not fully a match when formed of multiple processes.

In the disclosure, a "substrate" (or a wafer, an epi substrate) may include an epi layer in a single crystal substrate which is a basic material. The epi layer may be formed through a process of growing a single crystal thin film in the single crystal substrate which is the basic material. The epi process may mean a process of growing a compound semiconductor using a metal organic chemical vapor disposition (MOCVD) equipment over the substrate which is the basic material. For example, the epi process may be a process in which a n-type semiconductor (n-GaN) and an active layer (InGaN) emitting light, and then a p-type semiconductor (p-GaN) are deposited in order over a sapphire or a SiC substrate in the case of a blue LED.

In the disclosure, a "relay substrate" may be a substrate on which multiple LEDs are transported from the epi substrate and arrayed to have a predetermined pitch in an X-direction and a Y-direction. The relay substrate may be referred to as a temporary substrate. In addition, a process of separating micro LEDs from the substrate and arranging on the relay substrate (or, may be referred to as a temporary substrate or an interposer substrate) may be referred to as an interposer process. In addition, the operation of transferring the micro LEDs on the relay substrate over a display substrate may be referred to as a transfer process.

In the disclosure, a "target substrate" may be a substrate on which a thin film transistor (TFT) layer and multiple electronic devices are mounted to one surface thereof, and multiple LEDs may be transferred from the "relay substrate." In addition, the target substrate may be referred to as a display substrate. The target substrate on which multiple LEDs are transferred may form a unit display module. A gap of an X-axis direction (or row direction) and a gap of a Y-axis direction (or column direction) between the LEDs adjacent to one another which are arrayed on the relay substrate may be referred to as a chip pitch.

In the disclosure, the chip pitch may be distance from one side end of one LED to one side end of an LED which is most adjacent in an X-axis direction or a Y-axis direction. In addition, the chip pitch may be a distance from a center of one LED to a center of an LED most adjacent in the X-axis direction or the Y-axis direction.

In the disclosure, the gap in the X-axis direction and the gap in the Y-axis direction between the LEDs adjacent to one another which are arrayed on the target substrate may be referred to as a pixel pitch. Here, because the pixel pitch corresponds to a final pitch between the respective LEDs which are applied to the display module, it may be referred to as a display pitch. The pixel pitch (or display pitch) of the target substrate may be maintained at a greater gap than a chip pitch of the relay substrate.

In the disclosure, the display pitch and the pixel pitch may be a distance from one side end of one pixel (here, the pixel may be formed of at least two sub pixels (LEDs)) to one side end of a pixel most adjacent in the X-axis direction or the Y-axis direction. In addition, the display pitch and the pixel pitch may be a distance from a center of one pixel to a center of a pixel most adjacent in the X-axis direction or the Y-axis direction.

In the disclosure, a glass substrate may form multiple self-emissive devices arrayed at a front surface of the glass substrate and side surface wirings electrically connecting circuits located at a back surface of the glass substrate in an edge area of the glass substrate. A TFT layer formed with a TFT circuit is disposed at the front surface of the glass substrate, and circuits may not be disposed at the back surface of the glass substrate. The TFT layer attached to one surface of the glass substrate by being formed integrally on the glass substrate or by being manufactured in a separate film form.

In the disclosure, the display module may form a black matrix in between multiple LEDs arrayed on the TFT layer. The black matrix may enhance contrast ratio by blocking light leaking from a periphery of LEDs adjacent with one another. The display module may form a molding part capable of covering the multiple LEDs and the black matrix together in order to protect the multiple LEDs. The molding part may be formed of a transparent resin. A plate formed with materials such as synthetic resin or glass may be provided to substitute the molding part. The display module may stack and dispose a touch screen on the molding part or the plate.

In the disclosure, the glass substrate may be provided with multiple pixels. Each pixel may include multiple circuits for driving the multiple sub pixels and each pixel. Each sub pixel in the disclosure may include at least two LEDs having the same or different colors. For example, each sub pixel may include a red LED, a green LED and a blue LED.

In the disclosure, the LED and sub pixel may have the same meaning, and may use the same reference numeral. The LED may be formed of inorganic light-emitting material, and may be a semiconductor chip capable of emitting light on its own when a power source is provided. Although it is mainly described as 'LED' herein, the embodiment is not limited thereto, and LED may be used interchangeably as the same meaning as an 'LED' chip.

In the disclosure, the LED, for example, may have a flip chip structure in which anode and cathode electrodes are formed at a same side and a light-emitting surface is formed at an opposite side of the side on which the electrode is formed. The LEDs may have a predetermined thickness and may be formed as a square type in which a depth and a length are the same, or a rectangle type in which the depth and the length are different.

In the disclosure, a unit configuration in which LEDs are mounted in a circuit area of the TFT layer of the glass substrate may be referred to as a display module. The display module may be a single unit, and installed and applied to a wearable device, a portable device, a handheld device, and electronic products which require various displays or in electric fields, and applied to display devices such as, for example, and without limitation, a monitor for a personal computer (PC), a high-resolution TV, signage (or, digital signage), an electronic display, and the like through a plurality of assembly dispositions in a matrix type.

In in case it is determined that in describing the embodiments, detailed description of related known function or configuration may unnecessarily confuse the gist of the disclosure, the detailed description thereof will be omitted.

Referring to FIG. 1A, a display module in which multiple LEDs are transferred by a method for manufacturing a display module according to an embodiment is described.

Figure 1B:
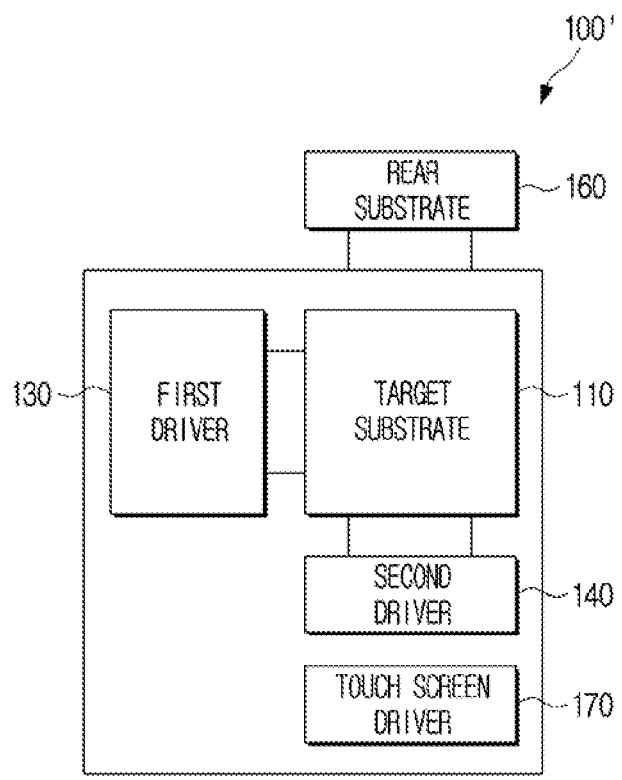
FIG. 1B is a block diagram illustrating schematically a display module with a touch screen driver added according to an embodiment.

FIG. 1A is a block diagram illustrating schematically a display module according to an embodiment, and FIG. 1B is a block diagram in which a touch screen driver is added to the display module according to an embodiment.

Referring to FIG. 1A, a display module 100 according to the disclosure may include a target substrate 110.

The target substrate 110 may include multiple light emitting diodes (LEDs) 161, 162, and 163 (referring to FIG. 2) transferred on the glass substrate. The target substrate 110 may include a glass substrate 111, a thin film transistor (TFT) layer 112 formed at one surface of the glass substrate 111, and wirings which electrically connect circuits disposed at the back surface of the glass substrate 111.

Figure 3:
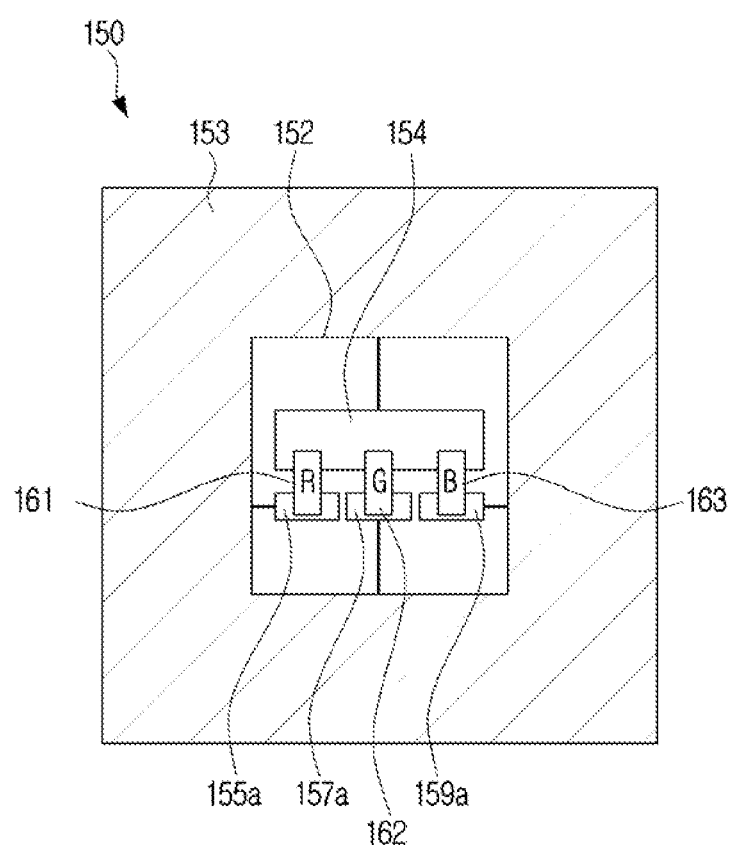
FIG. 3 is a diagram illustrating a unit pixel area in which a unit pixel of a glass substrate shown in FIG. 2 and a unit pixel are disposed.
Figure 4:
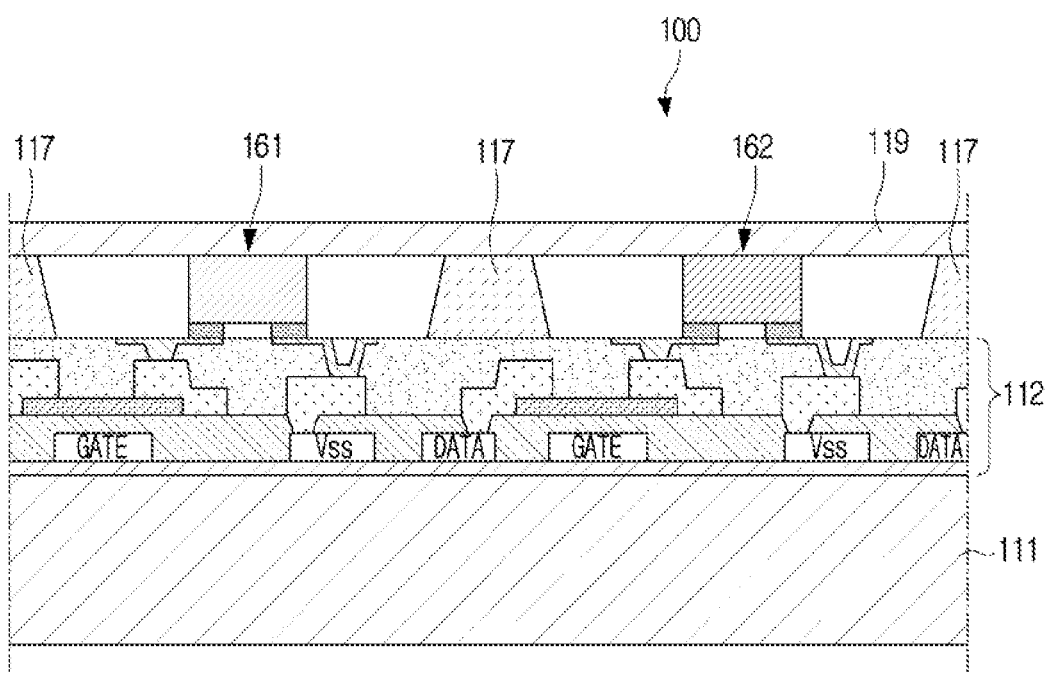
FIG. 4 is a diagram illustrating a part of a display shown in FIG. 1A.

The multiple LEDs 161, 162, and 163 (referring to FIG. 3) may be transferred to a pixel driving circuit area 153 (referring to FIG. 3) of the TFT layer and electrically connected to electrodes formed at the TFT layer 112 (referring to FIG. 4).

The display module 100 may be provided with first and second drivers 130 and 140 for driving pixels of the target substrate 110 and the TFT layer 112. A pixel driving method of the display module 100 may be an active matrix (AM) driving method or a passive matrix (PM) driving method. The display module 100 may form a pattern of wiring to which respective LEDs are electrically connected according to the AM driving method or the PM driving method.

The display module 100 may be disposed to the back surface of the target substrate 110 and further include a rear substrate 160 which is electrically connected through a flexible printed circuit (FPC), and the like.

The display module 100 may further include a communication device capable of receiving data.

Referring to FIG. 1B, the display module 100' may further include a touch screen panel disposed to a side of which multiple LEDs emit light, and a touch screen driver 170 for driving the touch screen panel.

Figure 2:
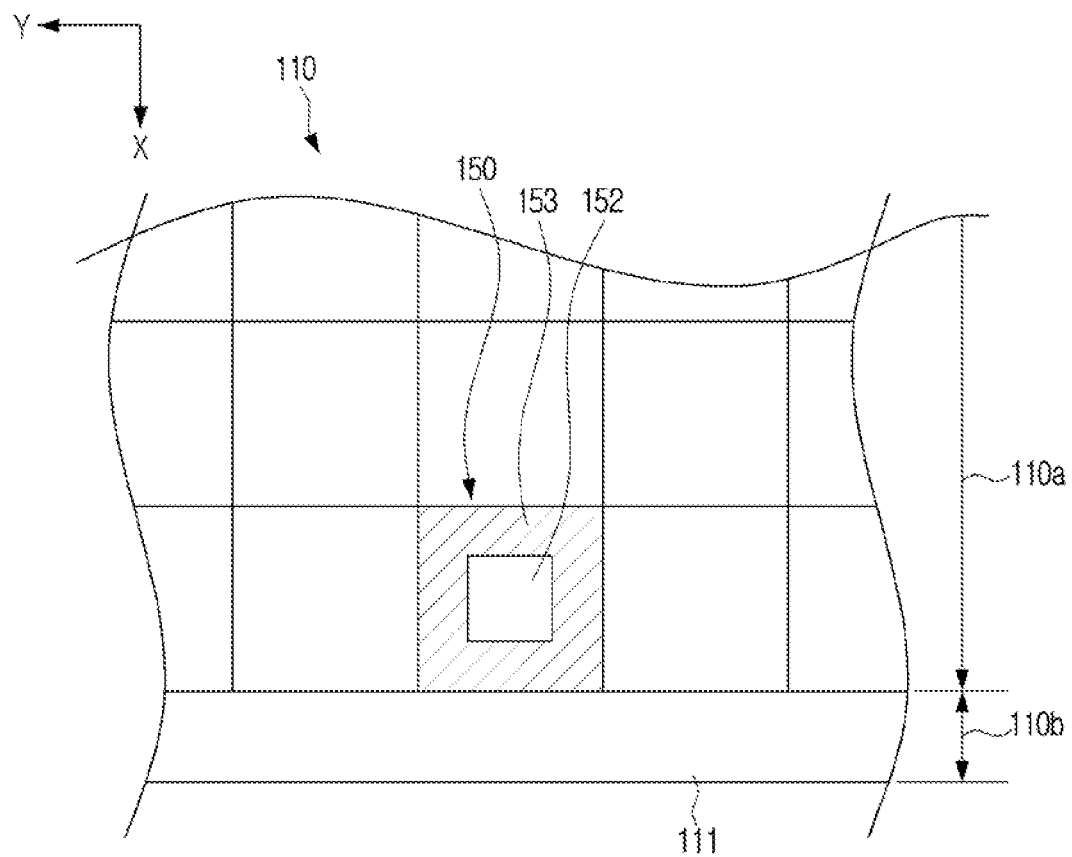
FIG. 2 is an enlarged plan view illustrating one part of a target substrate shown in FIG. 1A.

FIG. 2 is an enlarged plan view illustrating one part of the target substrate shown in FIG. 1A, and FIG. 3 is a diagram illustrating a unit pixel area in which a unit pixel of the glass substrate shown in FIG. 2 and a unit pixel are disposed.

Referring to FIG. 2, the target substrate 110 may include an active area 110a and an inactive area 110b.

The active area 110a may include multiple pixel areas 150 provided on the TFT layer 112 (referring to FIG. 4) on one surface of the glass substrate 111.

The inactive area 110b may be an edge area of the glass substrate 111 on one surface of the glass substrate 111. In addition, the inactive area 110b may be a remaining area except for the active area 110a on the glass substrate 111. The inactive area 110b may be referred to as a dummy area.

The active area 110a may include multiple pixel areas 150 in which a pixel (one pixel may include multiple sub pixels) is disposed respectively at a certain pitch.

The multiple pixel areas 150 may be divided into various forms, and as an example, may be divided into a matrix form. Each pixel area 150 may include multiple sub pixels, that is, a sub pixel area 152 onto which a red LED, a green LED and a blue LED are mounted, and a pixel driving circuit area 153 for driving each sub pixel.

Referring to FIG. 3, a common electrode 154 may be formed in a straight-line form taking into consideration an array of three LEDs 161, 162, and 163 which are arrayed in parallel. Electrode pads 155a, 157a and 159a may also be formed as shown in FIG. 3. A shape of the common electrode 154 may not necessarily be formed in the straight-line form, and may be formed to a different shape according to the array form of the LEDs within the one sub pixel area 152.

The glass substrate 111 may be formed, as in FIG. 2, such that multiple connection pads are formed in the inactive area 110b with gaps therebetween. The multiple connection pads may be electrically connected with each sub pixel through wiring, respectively. In this case, a number of connection pads which are formed in the inactive area 110b may vary according to a number of pixels implemented to the glass substrate, and may vary according to a driving method of the TFT circuit disposed in the active area 110a. For example, the active matrix (AM) driving method which drives each pixel individually may require more wiring and connection pads compared to when the TFT circuit disposed in the active area 110a is the passive matrix (PM) driving method which drives multiple pixels in a horizontal line and a vertical line.

FIG. 4 is a cross-sectional view illustrating a part of the target substrate shown in FIG. 1A. In FIG. 4, only two LEDs 161 and 162 are shown from among the LEDs 161, 162, and 163 which consist of three sub pixels included in the unit pixel for convenience.

Referring to FIG. 4, the display module 100 may be configured such that the multiple LEDs 161, 162, and 163 are divided by the black matrix 117, respectively. The display module 100 may include a transparent cover layer 119 for protecting the multiple LEDs 161, 162, and 163 together with the black matrix 117. In this case, the transparent cover layer 119 may be disposed to cover an upper part of the multiple LEDs 161, 162, and 163 and the black matrix 117 and an inside surface may contact the multiple LEDs 161, 162, and 163 and the black matrix 117. A touch screen panel may be stacked to an outer side surface of the transparent cover layer 119.

The multiple LEDs 161, 162, and 163 may be formed of inorganic light-emitting materials, and may be a semiconductor chip capable of emitting light on its own when a power source is provided. The respective LEDs may have the flip chip structure in which anode and cathode electrodes are formed at a same surface and the light-emitting surface is formed at the opposite side of the electrodes.

The respective LEDs 161, 162, and 163 may have a predetermined thickness and may be formed as the square type in which the depth and the length are the same, or the rectangle type in which the depth and the length are different. A size of each LED may exceed 100 μm or may be less than or equal to 100 μm. It is preferable for each LED to be less than or equal to 30 μm. The respective LEDs may implement real high dynamic range (HDR), and provide an increase in brightness relative to OLED and black expressiveness and a high contrast ratio.

Figure 5:
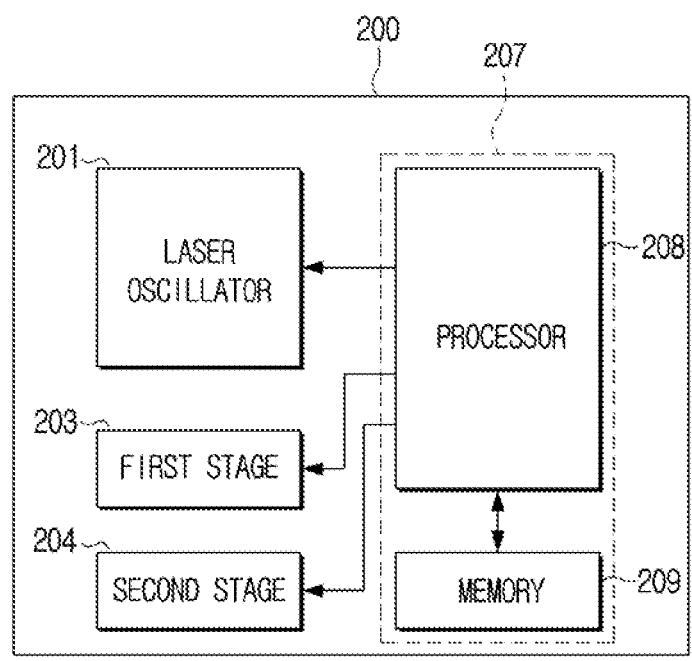
FIG. 5 is a block diagram illustrating schematically a laser transfer device according to an embodiment.

FIG. 5 is a block diagram illustrating schematically a laser transfer device according to an embodiment.

Referring to FIG. 5, the laser transfer device 200 according to an embodiment may include a laser oscillator 201, a first stage 203 disposed at a lower side of the laser oscillator 201 with a certain gap therebetween and configured to move a transfer substrate in a X-axis, a Y-axis, and a Z-axis directions, a second stage 204 disposed at a lower side of the first stage 203 with a certain gap therebetween and configured to move the target substrate to the X-axis, Y-axis, and Z-axis directions, and a controller 207.

The laser oscillator 201 may transfer multiple LEDs arrayed at the relay substrate to another relay substrate or the target substrate by irradiating a laser beam to the relay substrate. The laser oscillator 201 may transfer LEDs on the relay substrate to the another relay substrate or the target substrate through a laser lift-off (LLO) method.

The first stage 203 may load the relay substrate and move to a predetermined location (location to transfer LEDs, unloading location of the relay substrate, etc.).

The first stage 203 may be formed in a rough ring shape or in a quadrangle frame shape. For example, the first stage 203 may be formed with a periphery capable of grasping an edge part of the relay substrate and an opening at an inside of the periphery. Accordingly, the relay substrate may be disposed roughly at the opening of the first stage 203, and the multiple LEDs arrayed at one surface of the relay substrate may be configured to face the another relay substrate or the target substrate located at a lower side of the relay substrate.

The first stage 203 may be moved to the X-axis, the Y-axis, and the Z-axis by a first driver 130 (referring to FIG. 1A). The first stage 203 may move along a guide rail which is transposed and disposed vertically in the X-axis and Y-axis directions, and may be configured to move in a Z-axis direction together with the guide rail. The first stage 203 may be disposed at a random location so as to not interfere with the laser oscillator 201 when operating loading and unloading of the relay substrate.

The second stage 204 may load the target substrate and move to a predetermined location (location for receiving transfer of LEDs, a location for unloading the target substrate, etc.). The second stage 204 may load another relay substrate other than the target substrate and move to the predetermined location. Here, the another relay substrate may mean a relay substrate which receives transfer of LEDs from the relay substrate fixed to the first stage 203.

The second stage 204 may be disposed at a lower side of the first stage 203 with a certain gap therebetween when transferring. The second stage 204 may be formed in a plate form, and an opening may not be formed.

The second stage 204 may be moved to the X-axis, the Y-axis, and the Z-axis by a second driver 140 (referring to FIG. 1A). The second stage 204 may move along the guide rail which is transposed and disposed vertically in the X-axis and Y-axis directions, and may be configured to move in the Z-axis direction together with the guide rail. The second stage 204 may be disposed at the first stage 203 when operating loading and unloading of the target substrate and at a random location so as to not interfere with the relay substrate fixed to the first stage 203.

The controller 207 may perform LED transfer by controlling an operation of the respective configurations of the laser transfer device 200.

The controller 207 may be implemented in an integrated circuit (IC) form or a system on a chip (SoC) form. In addition, the controller 207 may be implemented to a form including a processor 208 and a memory 209. The processor 208 may execute an instruction stored in the memory 209, and perform a method for manufacturing a display module according to the various embodiments described herein. The memory 209 may be stored with various data and instructions.

Figure 6:
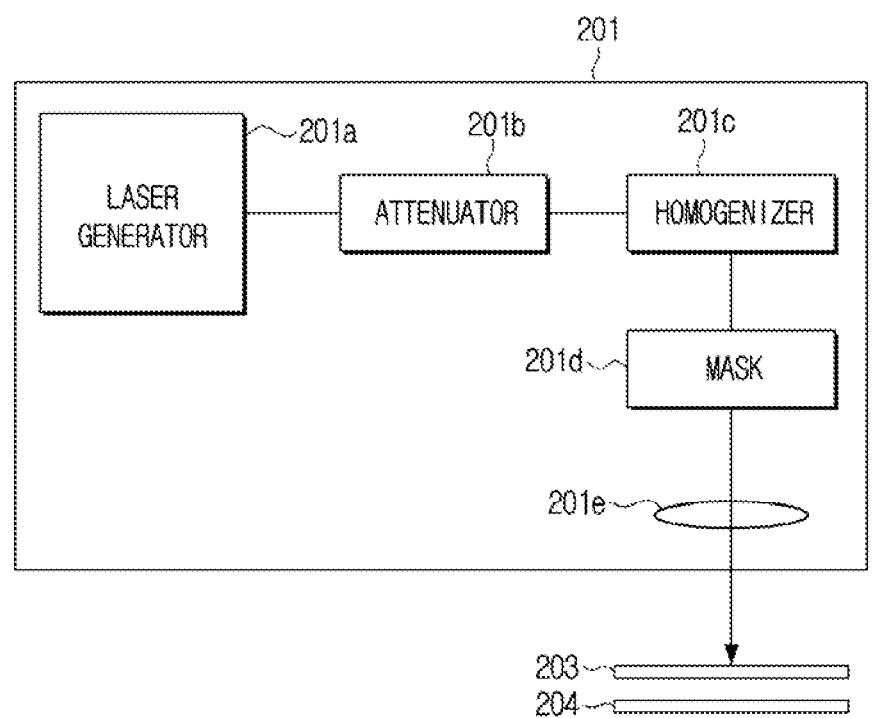
FIG. 6 is a block diagram illustrating schematically a laser oscillator of a laser electronic device according to an embodiment.

FIG. 6 is a block diagram illustrating schematically a laser oscillator of a laser electronic device according to an embodiment.

Referring to FIG. 6, the laser oscillator 201 may include a laser generator 201a which generates a laser beam, an attenuator 201b for attenuating an intensity of the laser beam output from the laser generator, a homogenizer 201c forming the laser beam which passed the attenuator to have an overall uniform distribution, and a projection lens (P-lens) 201e which reduces a pattern of the laser beam which passed the homogenizer and irradiates to a transfer area of the relay substrate (or a substrate for transferring LEDs to the target substrate).

Although not illustrated in the drawings, at least one mirror may be disposed in between the attenuator 201b and the homogenizer 201c, and in between the homogenizer 201c and the P-lens 201e to change a pathway of the laser beam, respectively.

The laser generator 201a may apply a laser generator of various types such as an excimer laser and a UV laser according to a wavelength of the laser beam.

The attenuator 201b and the homogenizer 201c may adjust the intensity of the laser beam output from the laser generator 201a by being disposed on a irradiation pathway of the laser beam.

The homogenizer 201c may homogenize the laser beam as a whole based on using the excimer laser and a quality of the laser beam passing the P-lens 201e may be made uniform. The homogenizer 201c may make homogenization possible by dividing sunlight with acute changes in luminous intensity into a small light source and then overlap at a surface which is to be the target.

The P-lens 201e may focus a patterned laser beam which passed the homogenizer 201c and irradiate toward the relay substrate loaded at the first stage 203 with the same pattern. In this case, the pattern of the laser beam irradiated to the relay substrate may correspond to points at which the multiple LEDs are disposed on the relay substrate, for example, to respective locations of the multiple LEDs present at the transfer location.

The mask 201d may be disposed between the homogenizer 201c and the P-lens 201e.

Figure 7A:
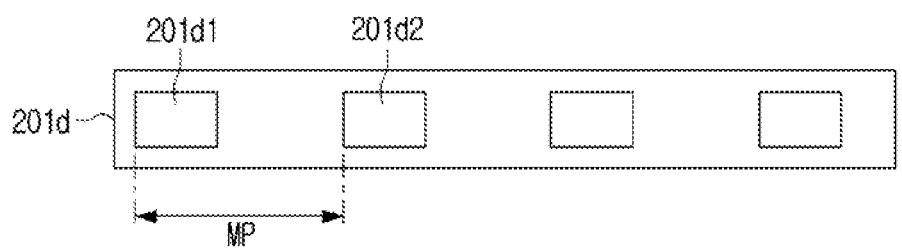
FIG. 7A is a schematic diagram illustrating a mask shown in FIG. 6.

FIG. 7A is a schematic diagram illustrating the mask shown in FIG. 6.

Referring to FIG. 7A, the mask 201d may be formed with multiple slits 201d1 and 201d2 which form a certain pitch (MP). The mask 201d may have a certain pattern based on the pitch, gap, size, and the like of the multiple slits 201d1 and 201d2. The mask 201d may be replaced with another mask so as to correspond to a transfer pattern.

Based on the patterned laser beam being irradiated to the relay substrate through the P-lens 201e as it passes the multiple slits 201d1 and 201d2 of the mask 201d, the LEDs arrayed on the relay substrate may be transferred to the another relay substrate or the target substrate disposed at the lower side of the relay substrate with a certain gap therebetween as a certain pattern or a certain pitch.

In the disclosure, the mask 201d is described as being disposed between the homogenizer 201c and the P-lens 201e, but is not limited thereto, and the mask 201d may be disposed at an outside of the laser oscillator 201. For example, the mask 201d may be disposed between the P-lens 201e and the first stage 203.

Figure 7B:
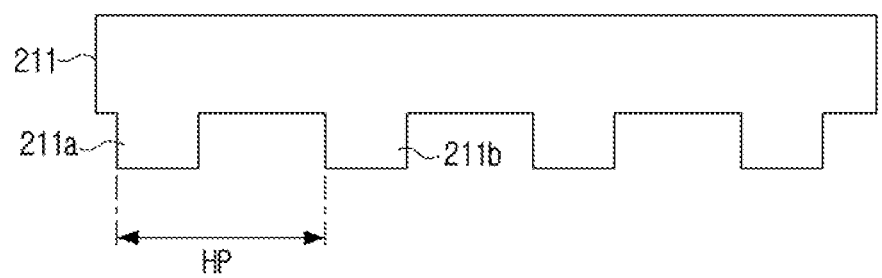
FIG. 7B is a schematic diagram illustrating a picker applied to a stamp transfer.

FIG. 7B is a schematic diagram illustrating a picker applied to a stamp transfer method.

Although the embodiment is described as transferring LEDs from the relay substrate to the another relay substrate or the target substrate through the laser transfer method when manufacturing the display module according to the disclosure, the embodiment is not necessarily limited thereto, and it may also be possible to transfer through the stamp transfer method which transfers at least two LEDs at one time.

Referring to FIG. 7B, when carrying out LED transfer with the stamp transfer method, a picker 250 may include multiple heads 211a and 211b. A pitch HP of the heads 211a and 211b picking the LEDs may be formed to correspond to a pitch MP (referring to FIG. 7A) of the slits 201dl and 201d2 of the mask 201d used in the laser transfer method.

The stamp transfer method may use a picker formed with a polymer material (Polydimethylsiloxane (PDMS)) with viscoelasticity or use an electrostatic head method to detach LEDs from the relay substrate and then transfer to the another relay substrate or the target substrate.

Figure 8A:
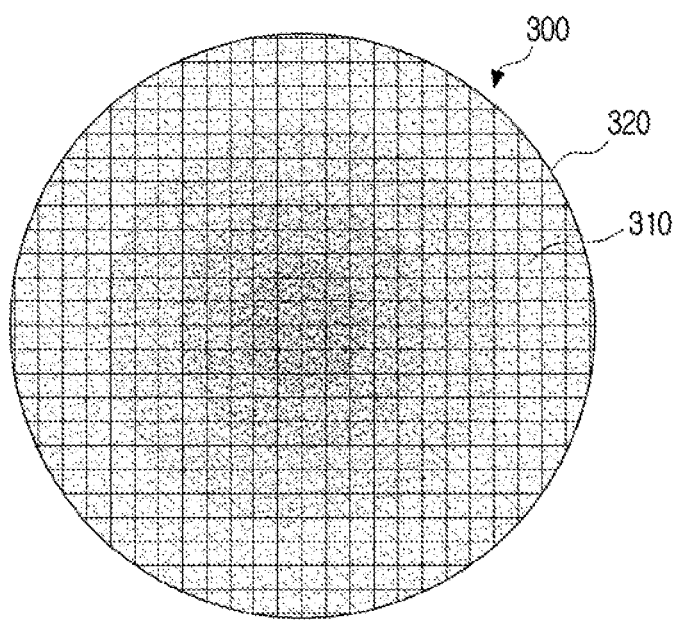
FIG. 8A is a schematic diagram illustrating an epi substrate.
Figure 8B:
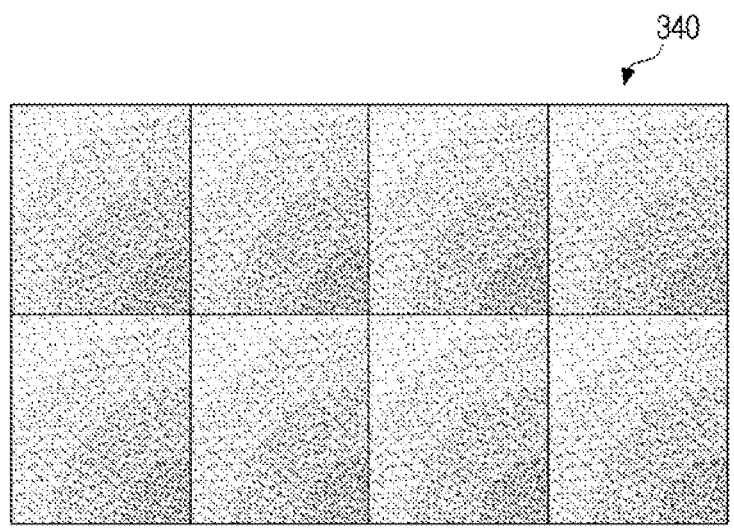
FIG. 8B is a diagram illustrating multiple LEDs arrayed on a relay substrate after a bin process showing periodic patterns.

FIG. 8A is a schematic diagram illustrating an epi substrate, and FIG. 8B is a diagram illustrating multiple LEDs which are arrayed on a relay substrate after a bin process showing periodic patterns.

In the disclosure, the epi substrate 300 may mean a substrate including multiple LEDs 310 which are grown through multiple depositions and an etching process from a growth substrate 320.

The epi substrate 300 may be configured such that characteristics (brightness, wavelength, etc.) of the LED per area may be non-uniform. For example, LED characteristic distribution may appear in which the characteristics of LED gradually degrade from the center of the epi substrate 300 toward the periphery as shown in FIG. 8A.

The LED characteristic distribution of the epi substrate 300 may appear in a circular form as shown in FIG. 8A, but may also appear in an elliptical shape or a closed curve shape biased toward one side of the epi substrate 300 according to a manufacturing environment for an equipment or the epi process.

The multiple LEDs 310 on the epi substrate 300 may be separated with the growth substrate 320 through laser lift-off (LLO) and then transported to the relay substrate. In this case, the multiple LEDs may be transported to the relay substrate while maintaining its array on the epi substrate 300 as is. Accordingly, Mura defects may appear per area according to the LED characteristic distribution of the epi substrate 300 in the relay substrate. In order to resolve the problem, multiple LEDs are transported to multiple areas divided in the relay substrate after mixing and shuffling, and then transferred from the relay substrate to the another relay substrate or the target substrate.

The relay substrate 340 applied with the LED transfer method as described above may show a repetitive pattern in respective areas. For example, a certain pattern may be repeated continuously on the relay substrate 340 according to the LED with a large characteristic difference being arrayed at a border part of the respective areas of the relay substrate 340 as in FIG. 8B.

Accordingly, when multiple LEDs arrayed on the relay substrate 340 are consecutively transferred to the another relay substrate or consecutively transferred to the target substrate per each area, a certain pattern may also appear continuously repeating per each area in the another relay substrate or the target substrate. The pattern appearing in the another relay substrate or the target substrate as described above may ultimately cause Mura defects and uniformity issues in the target substrate, and the large format display (LFD) formed by connecting multiple display modules manufactured with the target substrates described above has the problem of a seam being visible between the display modules adjacent to one another.

However, the method for manufacturing the display module according to the disclosure may prevent the repetitive pattern from appearing on the target substrate by transferring the LEDs to the target substrate while maintaining the LED characteristic distribution (referring to FIG. 8A) on the epi substrate as is and arraying (arraying in a stretched state) by widening the gaps in a row direction (or X-axis direction) and a column direction (or Y-axis direction). In addition, when forming the LFD by connecting multiple display modules manufactured with the target substrates described above, the seam may be prevented from appearing between the display modules adjacent to one another or minimized to the extent a viewer is not able to recognize the seam.

The method for manufacturing the display module according to the disclosure may transfer the multiple LEDs of the epi substrate to the target substrate via at least two relay substrates. A number of relay substrates used when LEDs being transferred to the target substrate are in multiple colors (at least two different colors) may be greater than when in a single color. This is because, when transferring multi-colored LEDs, a step in which LEDs of respective colors formed from different epi substrates (e.g., epi substrate which grew red LEDs, epi substrate which grew green LEDs, epi substrate which grew blue LEDs) are gathered to one piece of relay substrate and arrayed may be further necessary.

The method for manufacturing the display module according to the disclosure may transport while maintaining the array of the epi substrate as is when transporting the LEDs from the epi substrate to a first relay substrate. When transporting LEDs between the relay substrates, the respective LEDs may be widened to have a certain pitch in the row direction (X-axis direction) or the column direction (Y-axis direction) and arrayed (primary stretch array). As described above, the LEDs which have been primary stretch arrayed may be transferred as a secondary stretch array from the relay substrate to the target substrate.

The secondary stretch array may vary according to an LED stretch direction of the primary stretch array. For example, the secondary stretch array may be formed in the column direction based on the primary stretch array being formed in the row direction, and the secondary stretch array may be formed in the row direction based on the primary stretch array being formed in the column direction.

As described above, the method for manufacturing the display module according to the disclosure may maintain the LED characteristic distribution of the epi substrate as is onto the target substrate by stretch arraying the LEDs consecutively in the row direction and the column direction or the column direction and the row direction when LED transferring from the relay substrate to the target substrate. Accordingly, the method for manufacturing the display module according to the disclosure may omit the step of mixing or shuffling the LEDs of the relay substrate.

The method of manufacturing the display module according to the disclosure will be described consecutively below with reference to FIGS. 9 to 10B.

Figure 9:
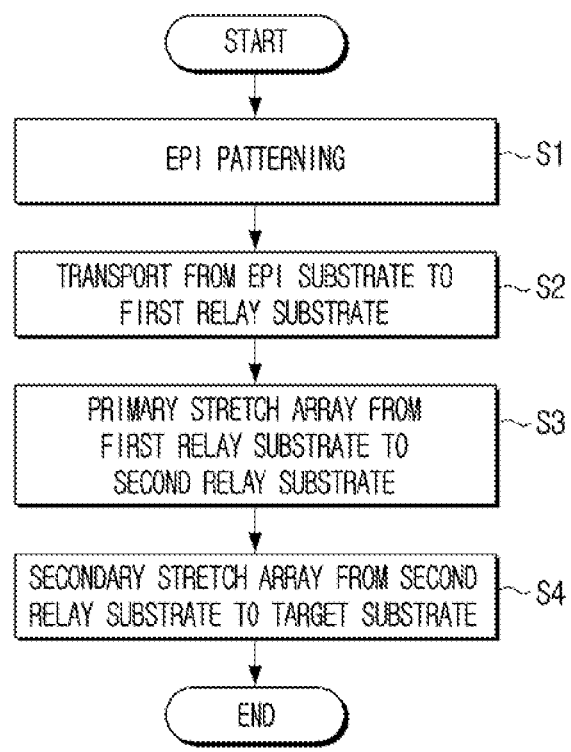
FIG. 9 is a flowchart illustrating a method for manufacturing a display module according to an embodiment.
Figure 10B:
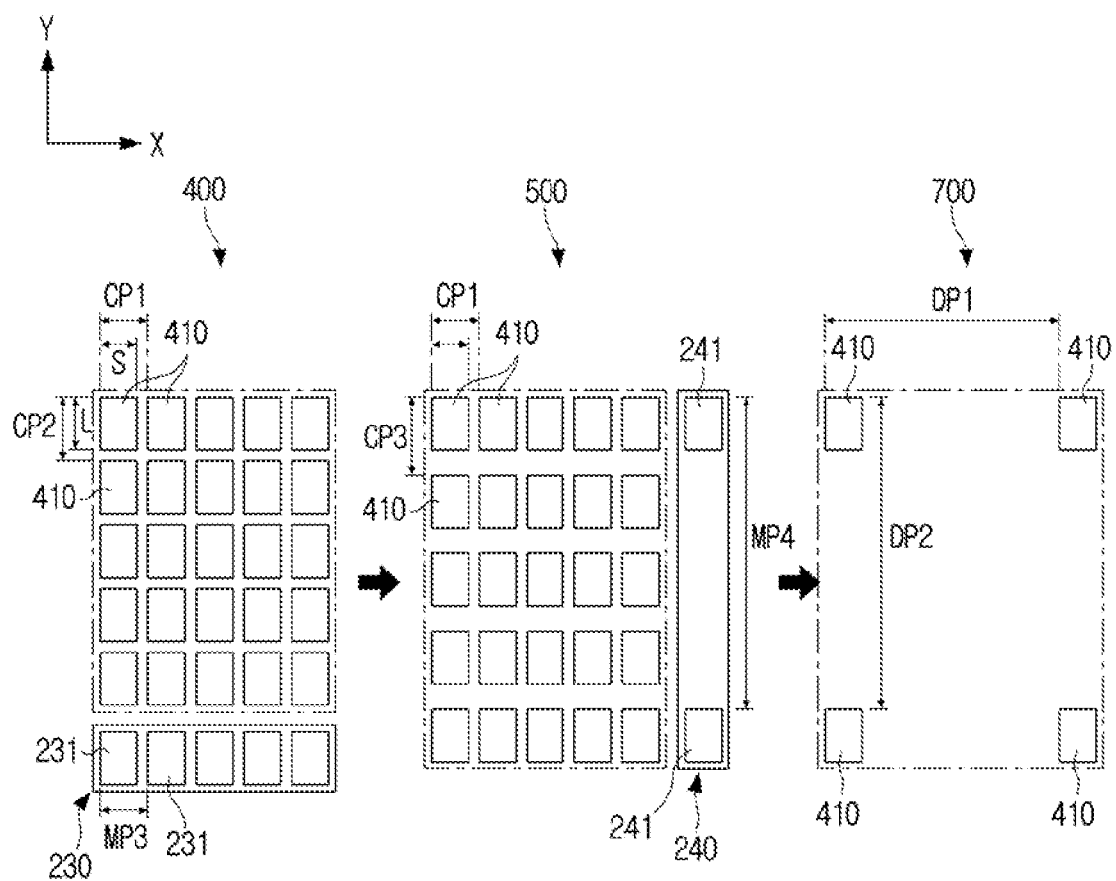
FIG. 10B is a schematic diagram illustrating an LED array on first and second relay substrates, and a target substrate.

FIG. 9 is a flowchart illustrating a method for manufacturing a display module according to an embodiment, FIG. 10A is a schematic diagram illustrating a process of transferring multiple LEDs to a target substrate consecutively passing the first relay substrate and the second relay substrate through a method for manufacturing a display module according to an embodiment, and FIG. 10B is a schematic diagram illustrating respectively a part of respective LED arrays on the first relay substrate and the second relay substrate, and the target substrate.

The method of manufacturing the display module according to an embodiment of the disclosure will be described below.

First, a photolithography process and an isolation process may be carried out (S1) so that gaps (row direction gaps and column direction gaps) between LED chips to be grown in the growth substrate 320 are able to maintain minimum gaps possible according to a process. The growth substrate 320 may be, for example, a sapphire wafer.

Based on forming the gap between the LED chips to be grown on the growth substrate 320 to a minimum gap through the processes, the number of LED chips per one epi substrate 300 may be maximized and thereby lowering a unit cost of the LED chip.

In addition, after manufacturing the epi substrate 300 which maintains the gaps between the LED chips to a minimum, and by stretch arraying the multiple LED chips consecutively in the row direction and the column direction (or stretch arranging in the column direction and stretch arranging in the row direction) as described below, ultimately, the multiple LED chips may be transferred in a desired display pitch (or pixel pitch) to the target substrate.

According to the disclosure, because the epi substrate 300 may be unified as there is no need to respectively manufacture to different chip gaps from one another according to the size of the target substrate when manufacturing the epi substrate 300, the unit cost of the epi substrate 300 may be lowered and management of materials may made be more convenient.

After manufacturing the epi substrate 300 (referring to FIG. 8A) in the method described above, the multiple LEDs of the epi substrate 300 may be transported to the first relay substrate 400 (S2).

In this case, in order to separate the multiple LEDs from the epi substrate 300, the first relay substrate 400 on which a bonding layer is deposited may be bonded to the epi substrate 300 by applying heat and pressure. Then, the multiple LEDs formed at the epi substrate 300 may be transported to the first relay substrate 400 through the laser lift-off (LLO) process. The LLO process may use the laser transfer device 200 (referring to FIG. 5) for the laser transfer.

The first relay substrate 400 may be formed with a photosensitive layer at a surface on which multiple LEDs attached. Based on the photosensitive layer formed on the first relay substrate 400 including an a predetermined adhesive force, the multiple LEDs may be fixed to the first relay substrate 400. In addition, as an example of a process which is to be performed hereafter, the photosensitive layer formed on the first relay substrate 400 may be fused by a laser beam emitted from the laser oscillator 201 of the laser transfer device 200 and perform the role of easily separating the multiple LEDs from the first relay substrate when transporting the multiple LEDs from the first relay substrate 400 to the second relay substrate 500.

Referring to FIG. 10A, the multiple LEDs transported to the first relay substrate 400 may be arrayed maintaining the LED characteristic distribution apparent from the epi substrate 300 as is to the first relay substrate 400. In this case, the first relay substrate 400 may be formed to a size and shape (e.g., circular shape) which is the same as or similar with the epi substrate 300.

Although the epi substrate 300 and the first relay substrate 400 are not illustrated in the drawings, a flat zone or a notch may be formed based on a reference example capable of recognizing a verticality and horizontality of the substrate.

Referring to FIG. 10B, the LEDs 410 arrayed in a grating direction (row direction and column direction) on the first relay substrate 400 may be arrayed in a row direction chip pitch CP1 (hereinafter, 'first chip pitch') and in a column direction chip pitch CP2 (hereinafter, 'second chip pitch'), respectively.

The first chip pitch CP1 and the second chip pitch CP2 on the first relay substrate 400 may be gaps maintained as closely as possible to the extent of not affecting the LEDs adjacent to one another. In FIG. 10B, the first chip pitch CP1 and the second chip pitch CP2 have been illustrated as the same, but it not limited thereto an may be different from each other.

In addition, the LEDs 410 on the first relay substrate 400 may be in a rectangular shape in which a flat surface has a long side L and a short side S as in FIG. 10B. In this case, the LED 410 has been illustrated such that the long side L is disposed parallel to the column direction (Y-axis direction), but is not limited thereto, and may be disposed to be parallel to the row direction (X-axis direction).

The LEDs arrayed in a predetermined area 401 (referring to FIG. 10A) on the first relay substrate 400 from among the multiple LEDs 410 transported to the first relay substrate 400 may be transported to the second relay substrate 500. Here, a width of the predetermined area 401 may be set relative to a size of the first relay substrate 400 and may not necessarily be limited to the width shown in FIG. 10A.

When the LED transfer to the first relay substrate 400 is complete, the multiple LEDs 410 arrayed on the first relay substrate 400 may be transported to the second relay substrate 500 to have the primary stretch array (S3).

Referring to FIG. 10B, the primary stretch array may mean disposing multiple LEDs 410 of the first relay substrate 400 to the second relay substrate 500 by widening the gaps between the LEDs in the column direction to maintain a certain chip pitch.

The primary stretch array may be carried out through the laser transfer method by the laser transfer device 200. In this case, the first relay substrate 400 may be loaded to the first stage 203 (referring to FIG. 6) of the laser transfer device 200. The second relay substrate 500 may be loaded to the second stage 204 (referring to FIG. 6) so as to dispose at a lower side of the first relay substrate 400.

Then, the first and second stages 203 and 204 may be moved to an irradiation location of a pre-set laser beam. Then, when the laser beam is irradiated toward the first relay substrate 400 from the laser oscillator 201 (referring to FIG. 6), the laser beam may pass the multiple slits 231 of the mask 230 shown in FIG. 10B and may be irradiated to the first relay substrate 400.

Each slit 231 may be disposed in the same pitch MP3 as the first chip pitch CP1. A number of the multiple slits 231 may correspond to a number of LEDs disposed in one row of the first relay substrate 400. Accordingly, the multiple LEDs 410 of the first relay substrate 400 may be transported to the second relay substrate 500 consecutively by one row each.

The second relay substrate 500 may be formed with the photosensitive layer at a surface on which multiple LEDs are attached like the first relay substrate. The photosensitive layer formed on the second relay substrate 500 may fix the multiple LEDs to the second relay substrate 500 according to having the predetermined adhesive force. In addition, the photosensitive layer formed on the second relay substrate 500 may, for example, be fused by the laser beam emitted from the laser oscillator 201 of the laser transfer device 200 and perform the role of easily separating the multiple LEDs from the second relay substrate when transporting the multiple LEDs from the second relay substrate 500 to the target substrate 700.

After the LEDs of a first row of the first relay substrate 400 are separated from the first relay substrate 400 and transported to the second relay substrate 500 by the laser beam irradiated to the first relay substrate 400, the first and second stages 203 and 204 may respectively move to pre-set laser irradiation locations to transport the LEDs of a second row of the first relay substrate 400 to the second relay substrate 500.

In this state, the LEDs of the second row of the first relay substrate 400 may be separated from the first relay substrate 400 and transported to the second relay substrate 500 by the laser beam irradiated to the first relay substrate 400. In this case, the LEDs of the second row transported to the second relay substrate 500 may have a certain column direction chip pitch CP3 (hereinafter, 'third chip pitch') with the LEDs of a first row of the second relay substrate 500 transported just previously. In this case, the third chip pitch CP3 may be set greater than the second chip pitch CP2. It may be preferable for the third chip pitch CP3 to be set taking into consideration the second display pitch DP2 of the target substrate 700, and will describe in detail below with respect to the above.

By repeating the process as described above, from the LEDs of a third row to the LEDs of a last row of the first relay substrate 400 may be transported consecutively to the second relay substrate 500 to have the third chip pitch CP3.

The respective rows of the multiple LEDs transported to the second relay substrate 500 may be arrayed to maintain the third chip pitch CP3 along the column direction, and the LEDs of the respective rows may maintain the first chip pitch CP1.

Accordingly, the multiple LEDs of the second relay substrate 500 may have the primary stretch array which is widened further in the column direction than the array on the first relay substrate 400.

Considering the primary stretch array in which the chip pitch is increased in the column direction, the second relay substrate 500 may be formed such that a vertical length Vi is formed longer than a horizontal length H1 as in FIG. 10A.

Based on the primary stretch array being completed, the multiple LEDs 410 arrayed on the second relay substrate 500 may be transported to the target substrate 700 to have the secondary stretch array (S4).

The secondary stretch array may be configured such that multiple LEDs 410 of the second relay substrate 500 are disposed to the target substrate 700 to maintain a certain pitch by widening the gaps between the LEDs in the row direction.

The secondary stretch array may also be carried out through the laser transfer device 200. To this end, the second relay substrate 500 may be loaded to the first stage 203 of the laser transfer device 200, and loaded to the second stage 204 to dispose the target substrate 700 to a lower side of the second relay substrate 500.

The first and second stages 203 and 204 may be moved to the irradiation direction of the pre-set laser beam. Then, when the laser beam is irradiated from the laser oscillator 201 toward the second relay substrate 500, the laser beam may be irradiated to the second relay substrate 500 through multiple slits 241 of the mask 240 shown in FIG. 10B.

Each slit 241 may be disposed as the same pitch MP4 as with the second display pitch DP2 of the target substrate 700. Accordingly, a number of multiple slits 241 may be provided differently from the number of LEDs disposed in one column of the second relay substrate 500. This takes into consideration the LEDs stretch arrayed in the row direction being transported to the target substrate 700 while concurrently maintaining the first display pitch DP1 or while concurrently maintaining close to the second display pitch DP2.

Accordingly, the multiple LEDs 410 of the second relay substrate 500 may be configured such that LEDs corresponding to the multiple slits 241 of the mask 240 with respect to one column are transported to the target substrate 700 in the first display pitch DP1. In this case, the LEDs are transported to the target substrate 700 while being widened in the row direction.

Among the LEDs of a first column of the second relay substrate 500, the LEDs of a pre-set location (e.g., location corresponding to the multiple slits 241 of the mask) may be transported to the target substrate 700 by the laser beam irradiated to the second relay substrate 500. Then, the first and second stages 203 and 204 may be moved respectively to the laser irradiation location to transport to the LEDs of the pre-set location from among the LEDs of a second column of the second relay substrate 500 to the target substrate 700.

In this state, the LEDs of the pre-set location from among the LEDs of the second column of the second relay substrate 500 may be transported to the target substrate 700 by the laser beam irradiated to the second relay substrate 500. In this case, the LEDs of the second column transported to the target substrate 700 may have the first display pitch DP1 as with the LEDs of the first column of the target substrate 700 transported just previously. In this case, the first display pitch DP1 may be set greater than the first chip pitch CP1.

From the LEDs of a third column to the LEDs of a last column of the second relay substrate 500 may be transported consecutively to the target substrate 700 to have the first display pitch DP1. Then, in order to transport the LEDs to be transported next from among the LEDs of the respective columns of the second relay substrate 500 to the target substrate 700, the second relay substrate 500 and the target substrate 700 may be moved respectively to the next transfer location by changing the location of the first and second stages 203 and 204.

By repeating the process as described above, the multiple LEDs may be transferred to the target substrate 700 to be arrayed in the first and second display pitches DP1 and DP2.

Figure 10C:
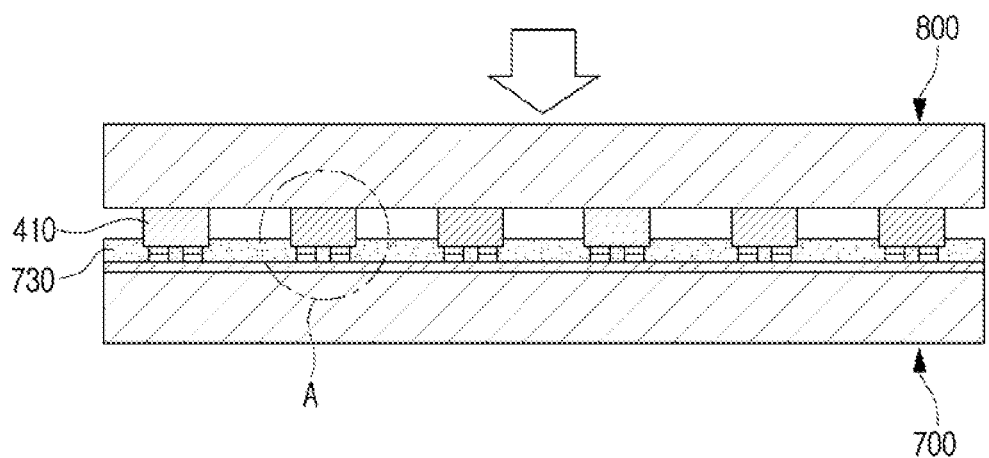
FIG. 10C is a schematic diagram illustrating a process of thermally pressing multiple LEDs transferred from a second relay substrate to a target substrate through a method for manufacturing a display module according to an embodiment.
Figure 10D:
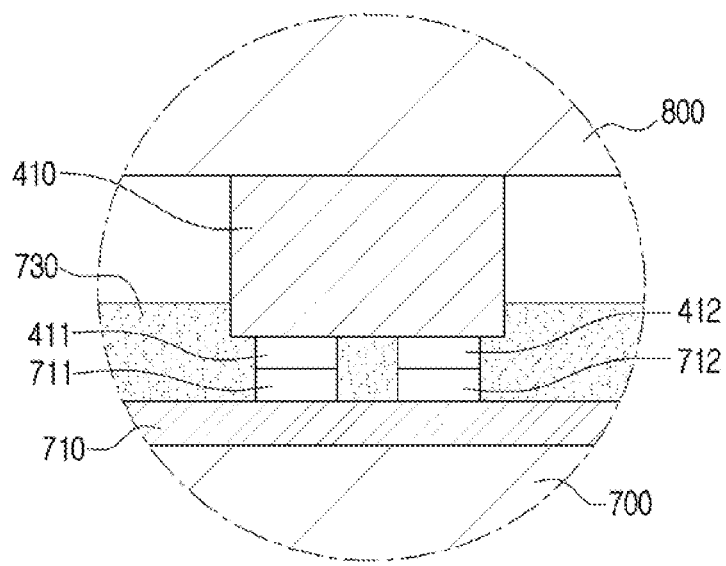
FIG. 10D is an enlarged diagram illustrating part A shown in FIG. 10C.

FIG. 10C is a schematic diagram illustrating a process of thermally pressing multiple LEDs transferred from the second relay substrate to the target substrate through a method for manufacturing a display module according to an embodiment, and FIG. 10D is an enlarged diagram illustrating part A shown in FIG. 10C.

Referring to FIGS. 10C and 10D, the target substrate 700 may be formed with a TFT layer 710 at a surface on which the multiple LEDs 410 are transferred. In this case, a conductive adhesion layer 730 may be stacked and formed on the TFT layer 710. The conductive adhesion layer 730 may be a flux layer included with fine metal grains in an adhesive.

Accordingly, after transferring all multiple LEDs from the second relay substrate 500 to the target substrate 700, the multiple LEDs may be stably fixed to the conductive adhesion layer 730 (e.g., the flux layer) based on pressing the multiple LEDs 410 arrayed on the target substrate 700 toward the target substrate 700 with a pressing member 800 embedded with a heater. In this case, electrodes 411 and 412 of the respective LEDs may be electrically connected with TFT electrodes 711 and 712 provided on the TFT layer 710.

According to the method for manufacturing the display module according to an embodiment, a characteristic distribution of an array which is same or nearly similar as with the LED characteristic distribution (referring to FIG. 8A) which appears on the epi substrate 300 as in FIG. 10A may appear on the target substrate 700 according to performing a row direction stretch array after a column direction stretch array of the multiple LEDs.

Accordingly, the target substrate 700 transferred with the LEDs through the method for manufacturing the display module according to an embodiment may not show periodic patterns (referring to FIG. 8B) per multiple sections within one piece of substrate. Based on manufacturing an LFD by connecting the multiple display modules 100 (referring to FIG. 1A) according to the disclosure manufactured using the target substrate 700 described above, the seam may not be visible from the border part between the display modules adjacent to one another.

Two embodiments of transferring multiple LEDs to the target substrate will be described consecutively below with reference to the drawings. Here, the multiple LEDs will be described as including a red (R) LED, a green (G) LED, and a blue (B) LED, but is not limited thereto, and may be formed with at least two colors only from among the three colors, further include a white (W) LED to the three colors, or formed with at least two colors only from among the red (R) LED, the green (G) LED, the blue (B) LED, and the white (W) LED.

Figure 11:
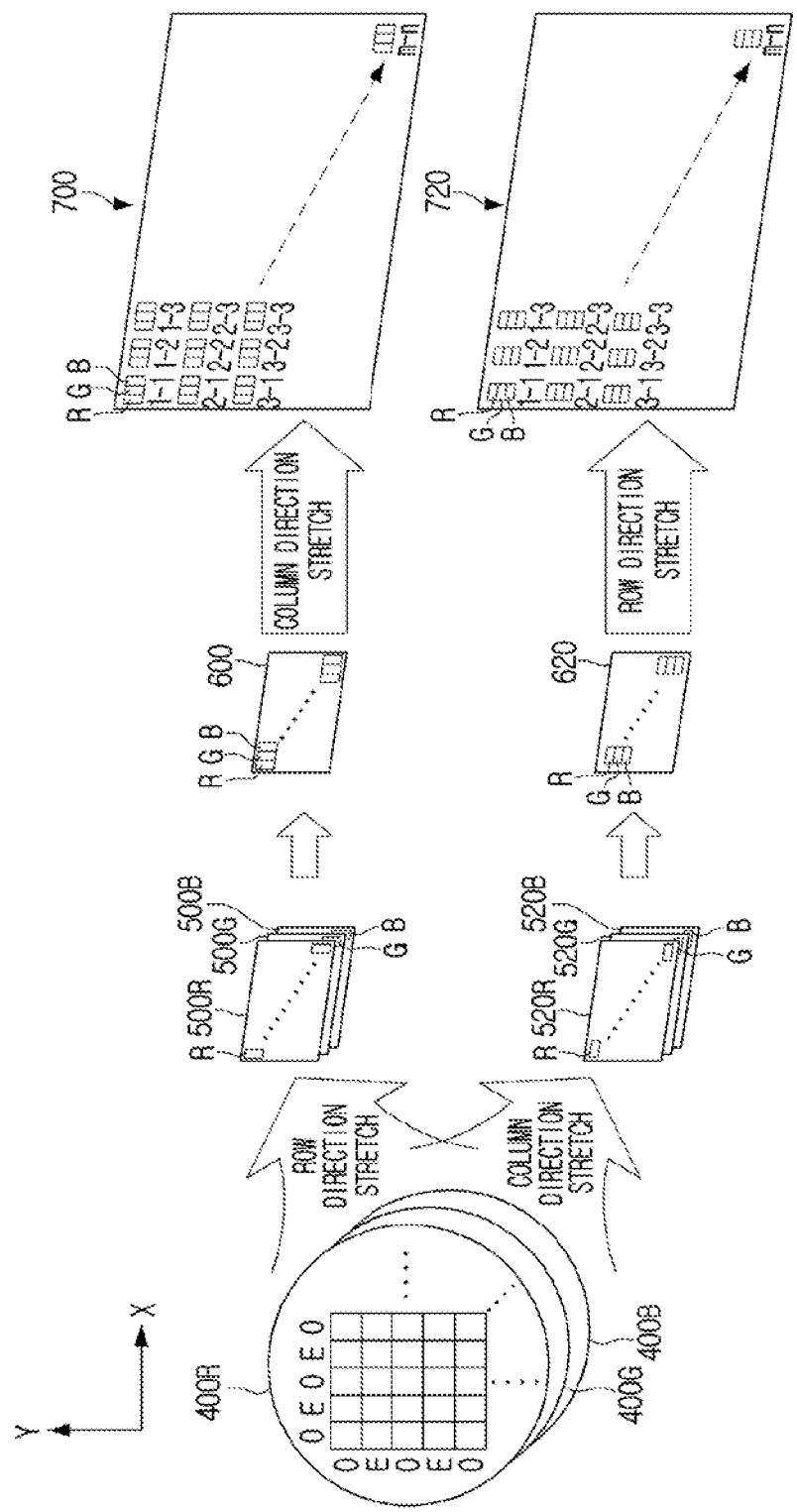
FIG. 11 is a diagram illustrating an example of having prepared first relay substrates in respective colors by one each respectively as a process diagram illustrating schematically a method for manufacturing a display module according to an embodiment.

FIG. 11 is a process diagram illustrating schematically a method of manufacturing a display module according to another embodiment, and FIGS. 12A to 12H are diagrams illustrating consecutively a process of transferring the LEDs of respective colors of the first relay substrates shown in FIG. 11 to the target substrate through stretch arraying in the column direction after stretch arraying in the row direction.

Referring to FIG. 11, a second red relay substrate 400R, a second green relay substrate 400G, and a second blue relay substrate 400B (hereinafter, referred to as 'second relay substrates') on which the multiple LEDs are formed respectively in a grating array may be provided by one piece each per color. In FIG. 11, an alphabet 'O' shown in the second red relay substrate 400R may mean odd, and an alphabet 'E' may mean even.

Figure 12A:
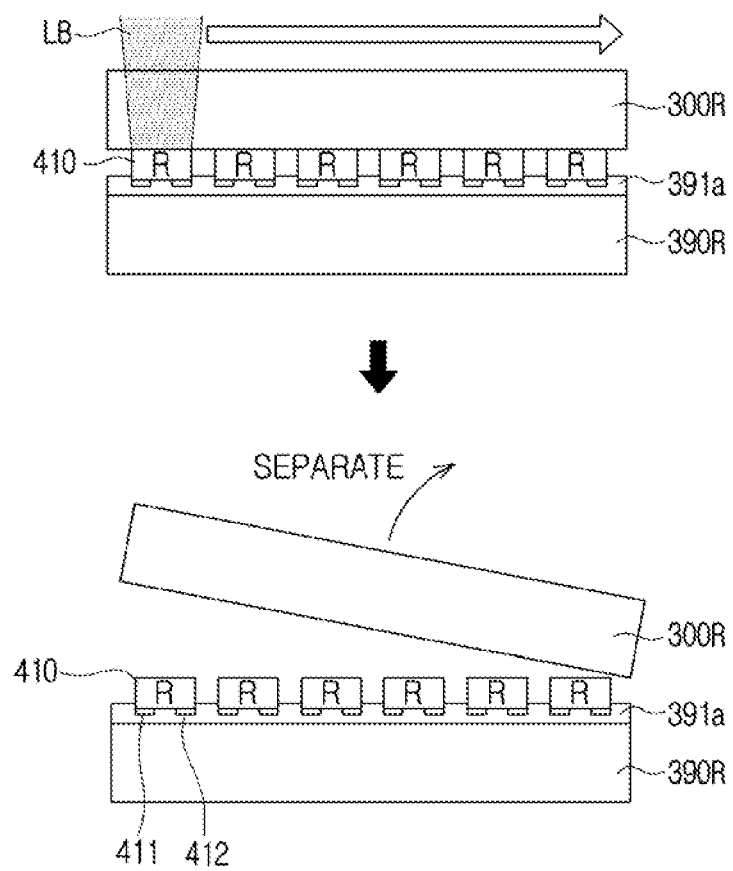
FIGS. 12A to 12H are diagrams illustrating consecutively a process of transferring LEDs of respective colors of first relay substrates shown in FIG. 11 to a target substrate through stretch arraying in a column direction after stretch arraying in a row direction.

For convenience of description, only parts (6×6) of the LEDs of respective colors arrayed on the second relay substrates 400R, 400G, and 400B will be shown and described as in FIG. 12A. Although the LEDs of respective colors arrayed on a third red relay substrate 500R, a third green relay substrate 500G, and a third blue relay substrate 500B (hereinafter, referred to as 'third relay substrates') may be a rectangular type disposed such that the long side is parallel to the column direction (Y-axis direction) as in FIG. 11, the LEDs of respective colors have been represented as roughly a square type in FIGS. 12C, 12B, 12F and 12H for convenience of description.

In addition, the laser transfer method or the stamp transfer method may be applied to transport the LEDs of respective colors from one piece of substrate to another substrate. In the embodiment below, the LEDs of respective colors being transferred in the laser transfer method will be described.

Referring to FIG. 12A, a red epi substrate 300R may be manufactured through the photolithography process and the isolation process so that the gaps (row direction gaps and column direction gaps) between the red LEDs 410 may maintain the processable minimum gaps.

A first red relay substrate 390R may be configured such that multiple red LEDs 410 are transported from the red epi substrate 300R by the laser transfer method. In this case, the first red relay substrate 390R may be formed with a photosensitive layer 391a of a predetermined thickness at a surface on which multiple red LEDs 410 are positioned. The multiple red LEDs positioned on the first red relay substrate 390R may be configured such that a pair of electrodes 411 and 412 is inserted inside the photosensitive layer 391a or contacted to a surface of the photosensitive layer 391a. The multiple red LEDs transported to the first red relay substrate 390R may be attached to the photosensitive layer 391a and not be separated from the first red relay substrate 390R even if the first red relay substrate 390R is turned over and the multiple red LEDs face a bottom direction.

The red epi substrate 300R may separate from the multiple red LEDs through the laser lift-off (LLO) method.

Although not illustrated in the drawings, through the process described above, multiple green LEDs may be transported from a green epi substrate to the first green relay substrate, and multiple blue LEDs may be transported from a blue epi substrate to the first blue relay substrate.

Figure 12B:
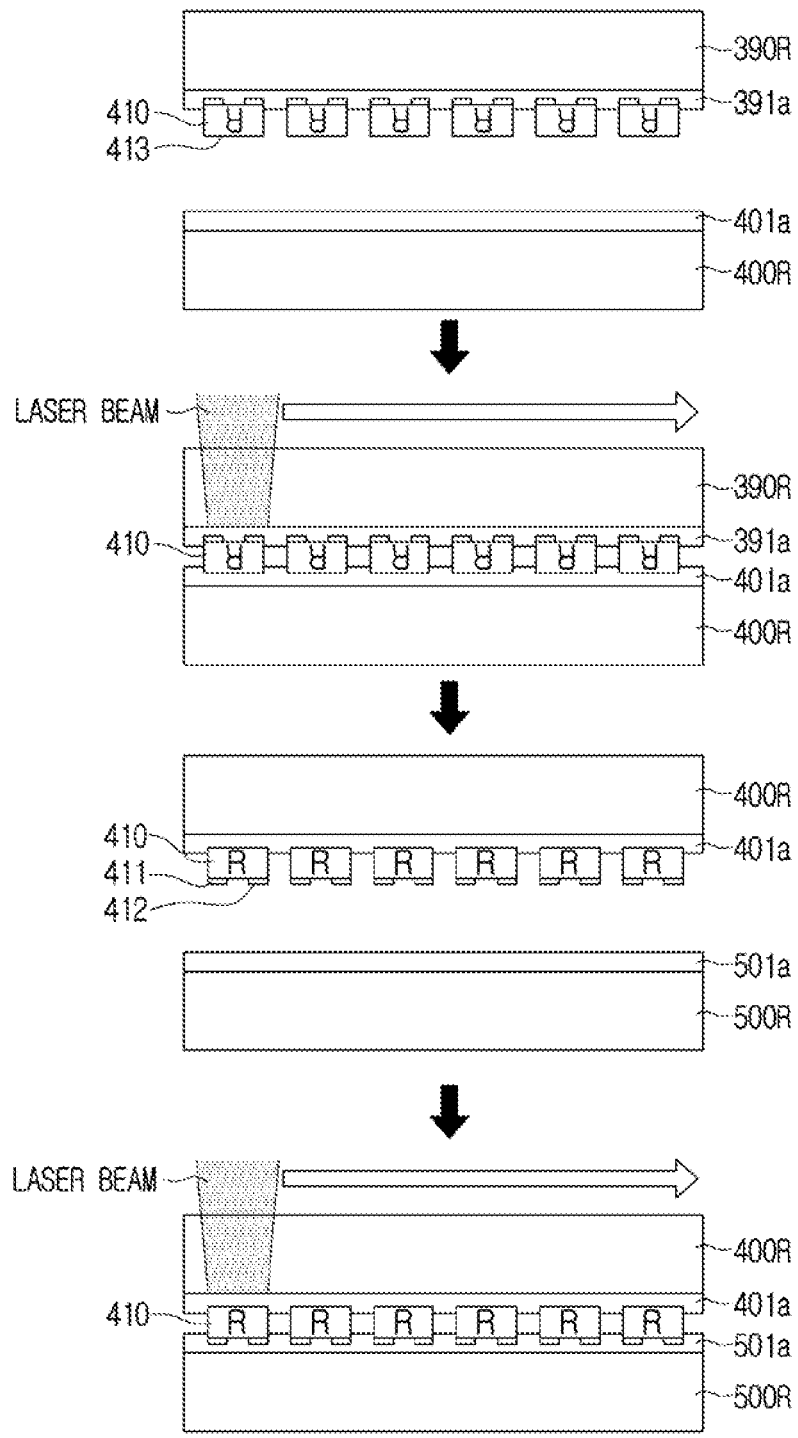

Referring to FIG. 12B, the multiple red LEDs may be transported from the first red relay substrate 390R to a second red relay substrate 400R. In this case, the first red relay substrate 390R may be disposed at an upper side of the second red relay substrate 400R, and the multiple red LEDs 410 may be configured such that a light-emitting surface 413 faces a photosensitive layer 401a of the second red relay substrate 400R.

The second red relay substrate 400R may be configured such that the multiple red LEDs 410 are transported from the first red relay substrate 390R by the laser transfer method. The multiple red LEDs 410 positioned on the second red relay substrate 400R may be configured such that the light-emitting surface 413 is inserted inside the photosensitive layer 401a or contacted to the surface of the photosensitive layer 401a. In this case, the multiple red LEDs transported to the second red relay substrate 400R may be attached to the photosensitive layer 401a and not be separated from the second red relay substrate 400R even if the second red relay substrate 400R is turned over and the multiple red LEDs face the bottom direction.

Through the process described above, the multiple green LEDs may be transported from the first green relay substrate to a second green relay substrate 400G, and multiple blue LEDs may be transported from the first blue relay substrate to a second blue relay substrate 400B.

Figure 12C:
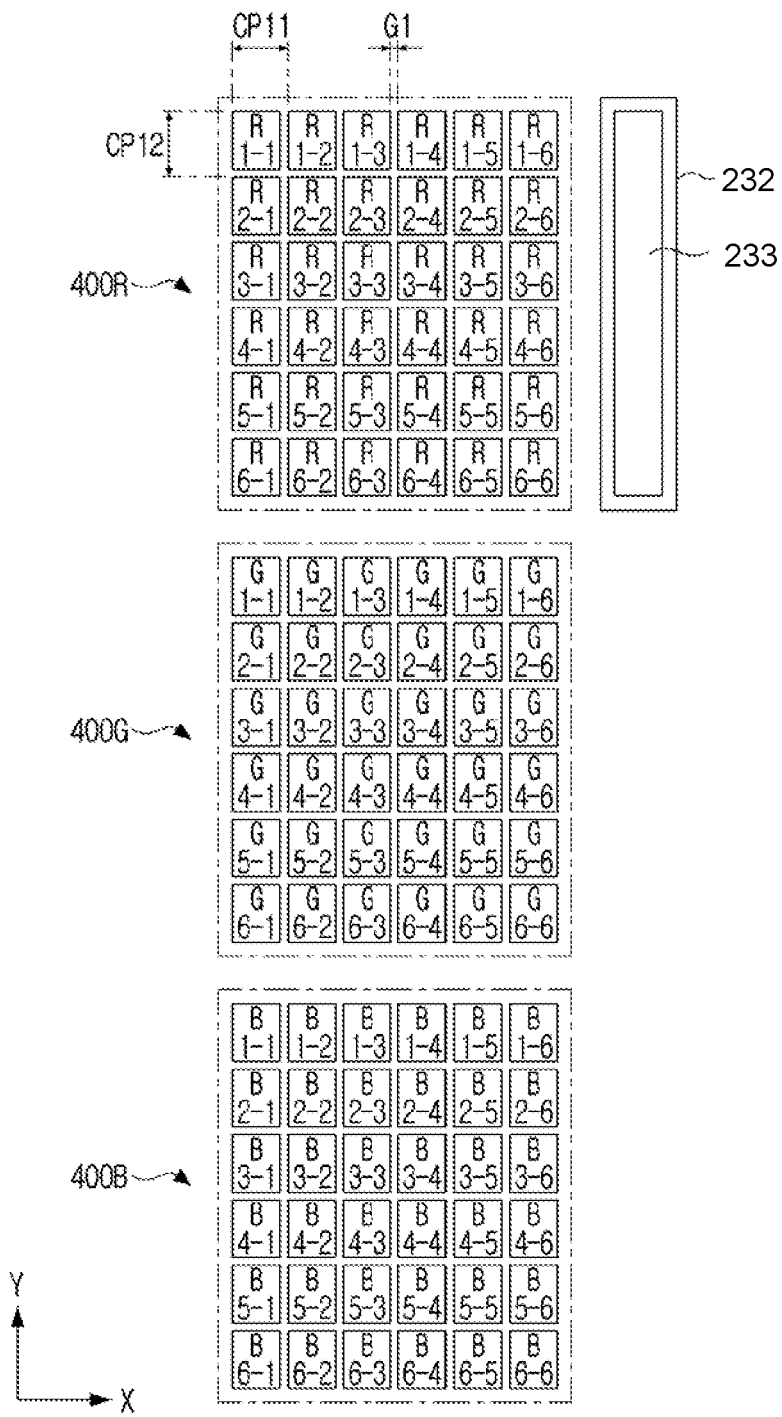

Referring to FIG. 12C, the multiple red LEDs arrayed on the second red relay substrate 400R may have the same chip pitch (hereinafter, referred to as 'first chip pitch') CP11 in the row direction, and have the same chip pitch (hereinafter, referred to as 'second chip pitch') CP12 in also the column direction. The first and second chip pitches CP11 and CP12 may be the same as a row direction pitch and a column direction pitch between the red LEDs arrayed on the red epi substrate and the first red relay substrate. The red LEDs adjacent to one another of the second red relay substrate 400R may maintain a first gap G1.

The second green relay substrate 400G and the second blue relay substrate 400B may also be arrayed with the multiple green LEDs and the multiple blue LEDs in the same process as the second red relay substrate 400R. In this case, the multiple green LEDs arrayed in the second green relay substrate 400G and the multiple blue LEDs arrayed in the second blue relay substrate 400B may have the first chip pitch CP11 in the row direction and have the second chip pitch CP12 in the column direction.

For convenience of description, the disclosure only shows and describes parts (6×6) of the LEDs of respective colors arrayed on the second relay substrates 400R, 400G, and 400B. In addition, the mask used in the laser transfer may also be reduced in its size and length and illustrated taking into consideration the number of LEDs of respective colors.

Figure 12D:
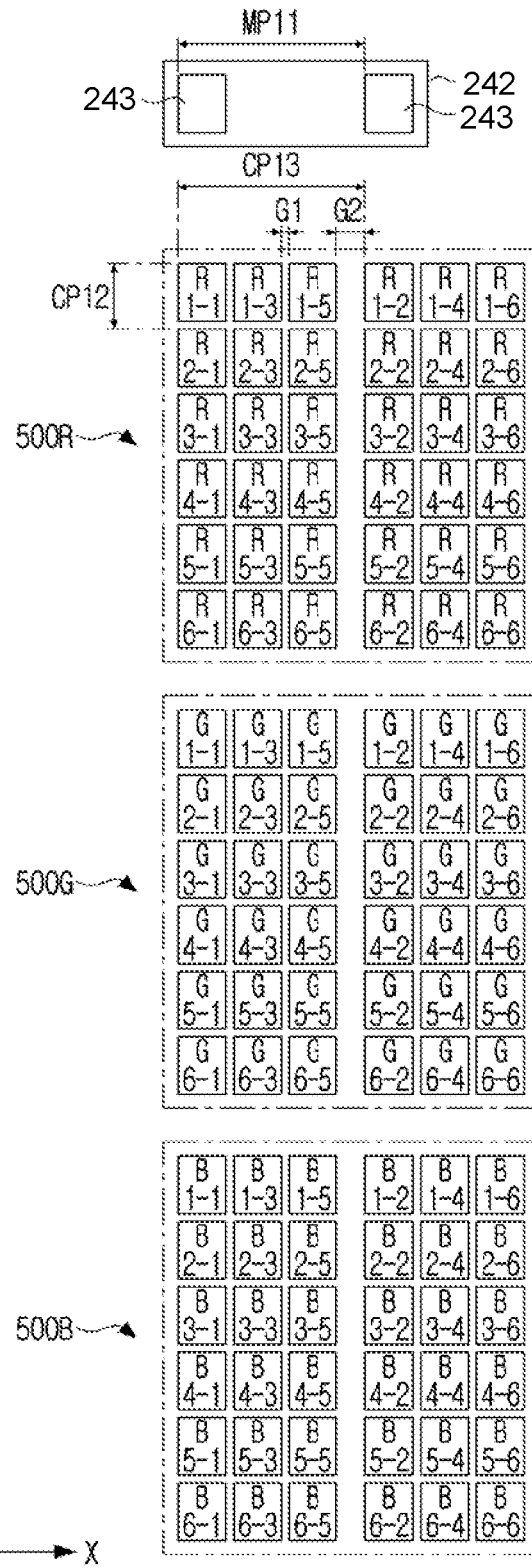

Referring to FIG. 12D, the red LEDs, the green LEDs and the blue LEDs of the second red relay substrate 400R, the second green relay substrate 400G, and the second blue relay substrate 400B may be transported in the row direction stretch array (primary stretch array) to third relay substrates 500R, 500G, and 500B corresponding respectively to the second relay substrates 400R, 400G, and 400B by the laser transfer method.

For example, the multiple red LEDs of the second red relay substrate 400R may be transported to a third red relay substrate 500R by one column each by the laser beam irradiated to the second red relay substrate 400R through a slit 233 of a first mask 232 (referring to FIG. 12C). The slit 233 of the first mask 232 may have a length and depth corresponding to one column of the multiple red LEDs of the second red relay substrate 400R.

Based on the red LEDs R 1-1 to R 6-1 of a first column of the second red relay substrate 400R being transported concurrently or close to concurrently to the third red relay substrate 500R, the red LEDs R 1-2 to R 6-2 of a second column of the second red relay substrate 400R may be transported to the third red relay substrate 500R so as to be separated to a chip pitch (hereinafter, referred to as 'third chip pitch') CP13 having a certain distance in the row direction from the red LEDs R 1-1 to R 6-1 of the first column of the third red relay substrate 500R. The third chip pitch CP13 may be greater than the first chip pitch CP11 and may correspond to a first display pitch DP11 which will be described below.

Based on the red LEDs R 1-2 to R 6-2 of the second column of the second red relay substrate 400R being transported to the third red relay substrate 500R, the red LEDs R 1-3 to R 6-3 of the third column of the second red relay substrate 400R may be transported to the third red relay substrate 500R to be spaced apart at the first chip pitch CP11 to a right side of the red LEDs R 1-1 to R 6-1 of the first column of the third red relay substrate 500R.

Based on the red LEDs R 1-3 to R 6-3 of the third column of the second red relay substrate 400R being transported to the third red relay substrate 500R, the red LEDs R 1-4 to R 6-4 of a fourth column of the second red relay substrate 400R may be transported to the third red relay substrate 500R to be spaced apart at the third chip pitch CP13 from the red LEDs R 1-3 to R 6-3 of the third column of the third red relay substrate 500R. In this case, the red LEDs R 1-4 to R 6-4 of the fourth column transported to the third red relay substrate 500R may be spaced apart by the first chip pitch CP11 to the right side of the red LEDs R 1-2 to R 6-2 of the second column.

The red LEDs R 1-5 to R 6-5 of a fifth column of the second red relay substrate 400R may be transported to the third red relay substrate 500R to be spaced apart at the first chip pitch CP11 to the right side of the red LEDs R 1-3 to R 6-3 of the third column in the same method as the transport method of the red LEDs R 1-3 to R 6-3 of the third column, and then the red LEDs R 1-6 to R 6-6 of a sixth column of the second red relay substrate 400R may be transported to the third red relay substrate 500R by the first chip pitch CP11 to the right side of the red LEDs R 1-4 to R 6-4 of the fourth column in the same method as the transport method of the red LEDs R 1-4 to R 6-4 of the fourth column.

In the respective rows of the third red relay substrate 500R, red LEDs may be disposed three each per one row with a second gap G2 therebetween to correspond to a unit pixel of the target substrate 700 which will be described below. The red LEDs disposed three each in the row direction may be disposed with the first gap G1 between one another. The first gap G1 may be the same as with the row direction gaps between the respective red LEDs from the second red relay substrate 400R.

In the same process as described above, the multiple green LEDs of the second green relay substrate 400G and the multiple blue LEDs of the second blue relay substrate 400B may be transported to a third green relay substrate 500G and a third blue relay substrate 500B, respectively.

The LEDs of respective colors of the second relay substrates 400R, 400G, and 400B may be transported to the respectively corresponding third relay substrates 500R, 500G, and 500B in the row direction stretch array (primary stretch array).

Figure 12E:
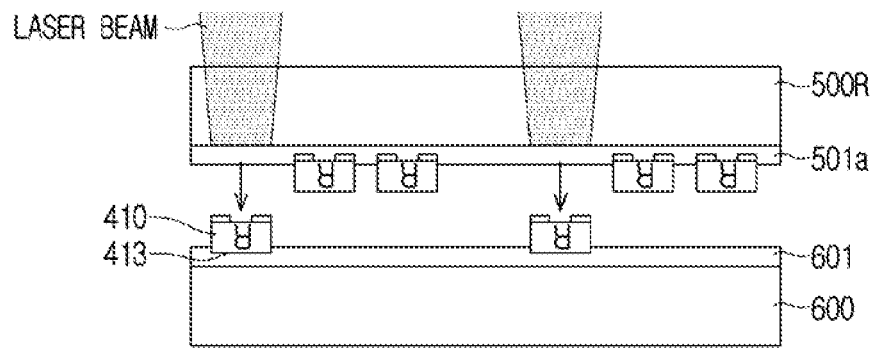
Figure 12E:
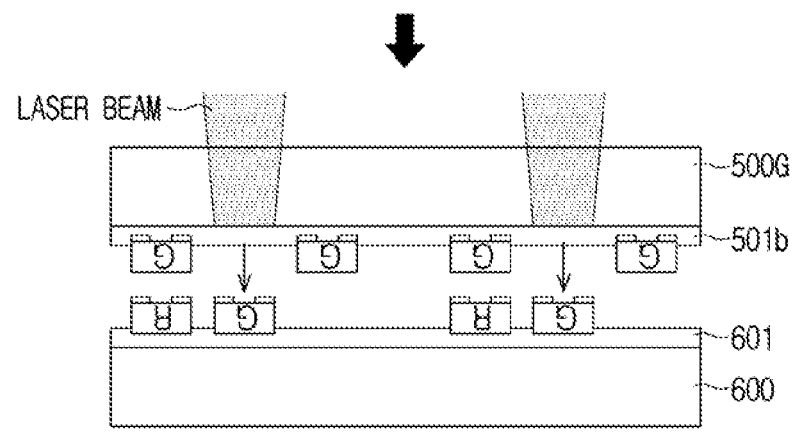
Figure 12E:
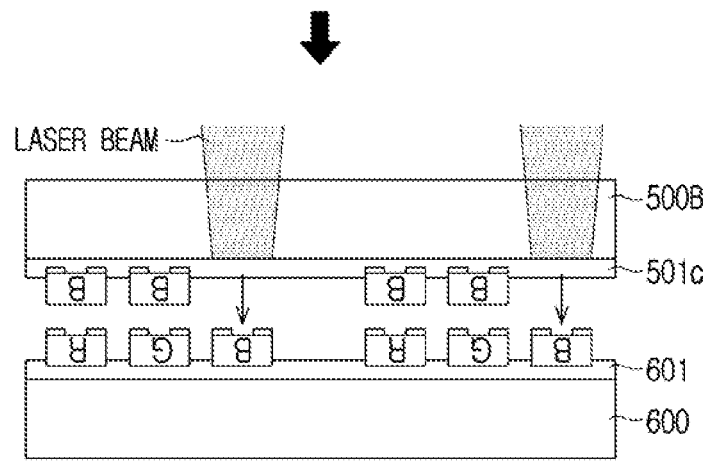
Figure 12F:
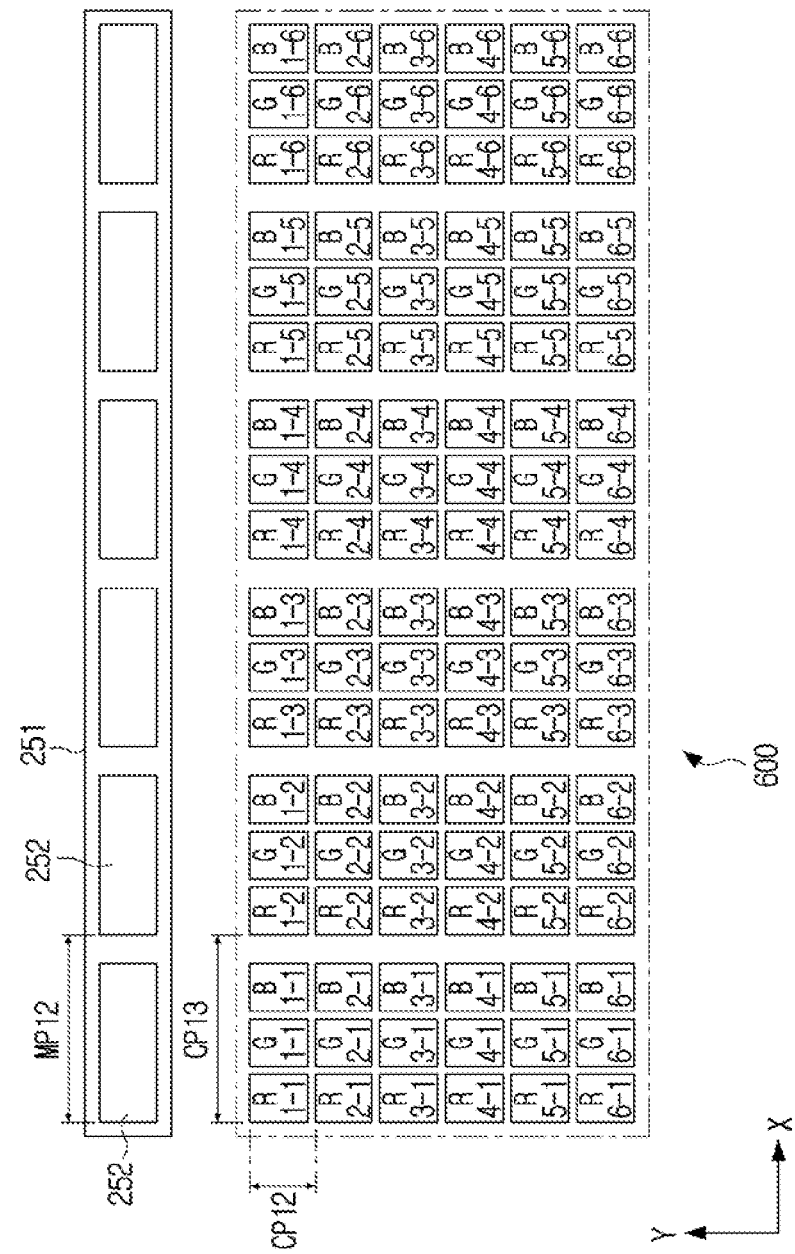

Referring to FIGS. 12E and 12F, the red LEDs, the green LEDs and the blue LEDs of the third relay substrates 500R, 500G, and 500B may be transported to one piece of a fourth relay substrate 600 in a certain array by the laser transfer method.

Referring to FIG. 12E, the multiple red LEDs 410 may be transported from the third red relay substrate 500R to a fourth relay substrate 600. In this case, the third red relay substrate 500R may be disposed to the upper side of the fourth relay substrate 600, and the multiple red LEDs 410 may be configured such that the light-emitting surface 413 faces a photosensitive layer 601 of the fourth relay substrate 600.

The third red relay substrate 500R may be configured such that the multiple red LEDs 410 are transported from the third red relay substrate 500R by the laser transfer method. The multiple red LEDs 410 positioned on the fourth relay substrate 600 may be configured such that the light-emitting surface 413 is inserted inside the photosensitive layer 601 or contacted to the surface of the photosensitive layer 601. In this case, the multiple red LEDs transported to the fourth relay substrate 600 may be attached to the photosensitive layer 601 and not be separated from the fourth relay substrate 600 even if the fourth relay substrate 600 is turned over and the multiple red LEDs face the bottom direction.

Through the process described above, the fourth relay substrate 600 may be transported with the multiple green LEDs and the multiple blue LEDs from the third green relay substrate 500G and the third blue relay substrate 500B, respectively.

Referring to FIG. 12F, the multiple red LEDs of the third red relay substrate 500R may be transported to the fourth relay substrate 600 by two each by the laser beam irradiated to the third red relay substrate 500R through a pair of slits 243 of a second mask 242 (referring to FIG. 12D). The pair of slits 243 of the second mask 242 may be respectively formed to a size corresponding to a single LED, and a pitch MP 11 between the slits 243 (referring to FIG. 12D) may correspond to the third chip pitch CP13.

The first and second red LEDs R 1-1 and R 1-2 of a first row of the third red relay substrate 500R may be transported to the fourth relay substrate 600 to be spaced apart at the third chip pitch CP13 by the laser transfer method.

Then, the third and fourth red LEDs R 1-3 and R 1-4 of the first row of the third red relay substrate 500R may be transported to a first row of the fourth relay substrate 600. In this case, the third red LED R 1-3 may be disposed at the fourth relay substrate 600 to be spaced apart at the third chip pitch CP13 to the right side of the second red LED R 1-2 of the fourth relay substrate 600. The fourth red LED R 1-4 may be disposed at the fourth relay substrate 600 in a state spaced apart at the third chip pitch CP13 to the right side of the third red LED R 1-3 of the fourth relay substrate 600.

Then, the fifth and sixth red LEDs R 1-5 and R 1-6 of the first row of the third red relay substrate 500R may be transported to the fourth relay substrate 600 in the same method as the transport method of the third and fourth red LEDs R 1-3 and R 1-4.

As described above, after transporting the red LEDs R 1-1 to R 1-6 of the first row of the third red relay substrate 500R to the fourth relay substrate 600, the remaining red LEDs R 2-1 to R 6-6 of the third red relay substrate 500R may be transported to the fourth relay substrate 600 consecutively by row. In this case, the red LEDs R 1-1 to R 6-6 transported to the fourth relay substrate 600 may be disposed to be spaced apart between the rows at the first chip pitch CP11.

In the same process described above, the multiple green LEDs of the third green relay substrate 500G and the multiple blue LEDs of the third blue relay substrate 500B may be transported to the fourth relay substrate 600, respectively.

Figure 12G:
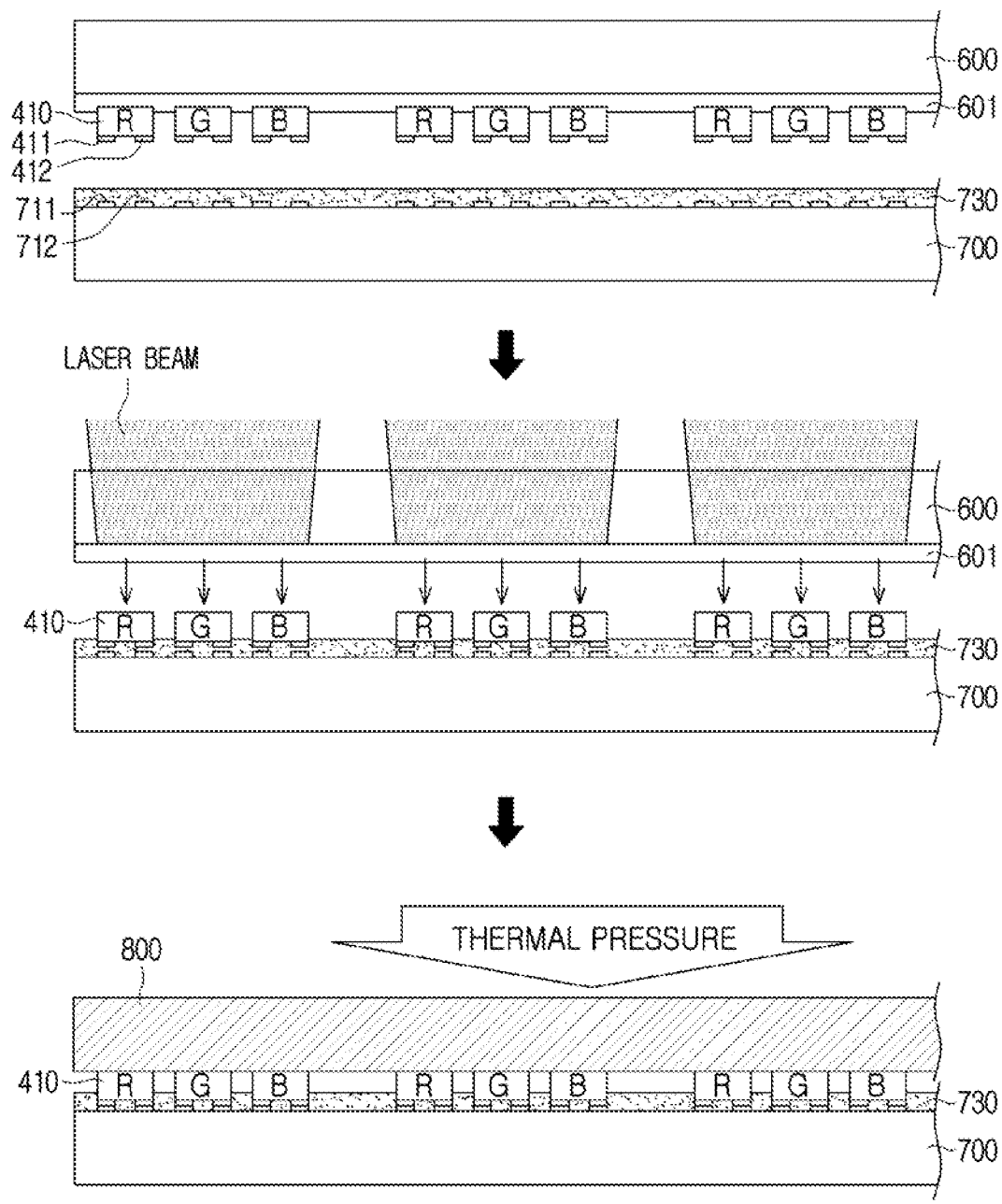
Figure 12H:
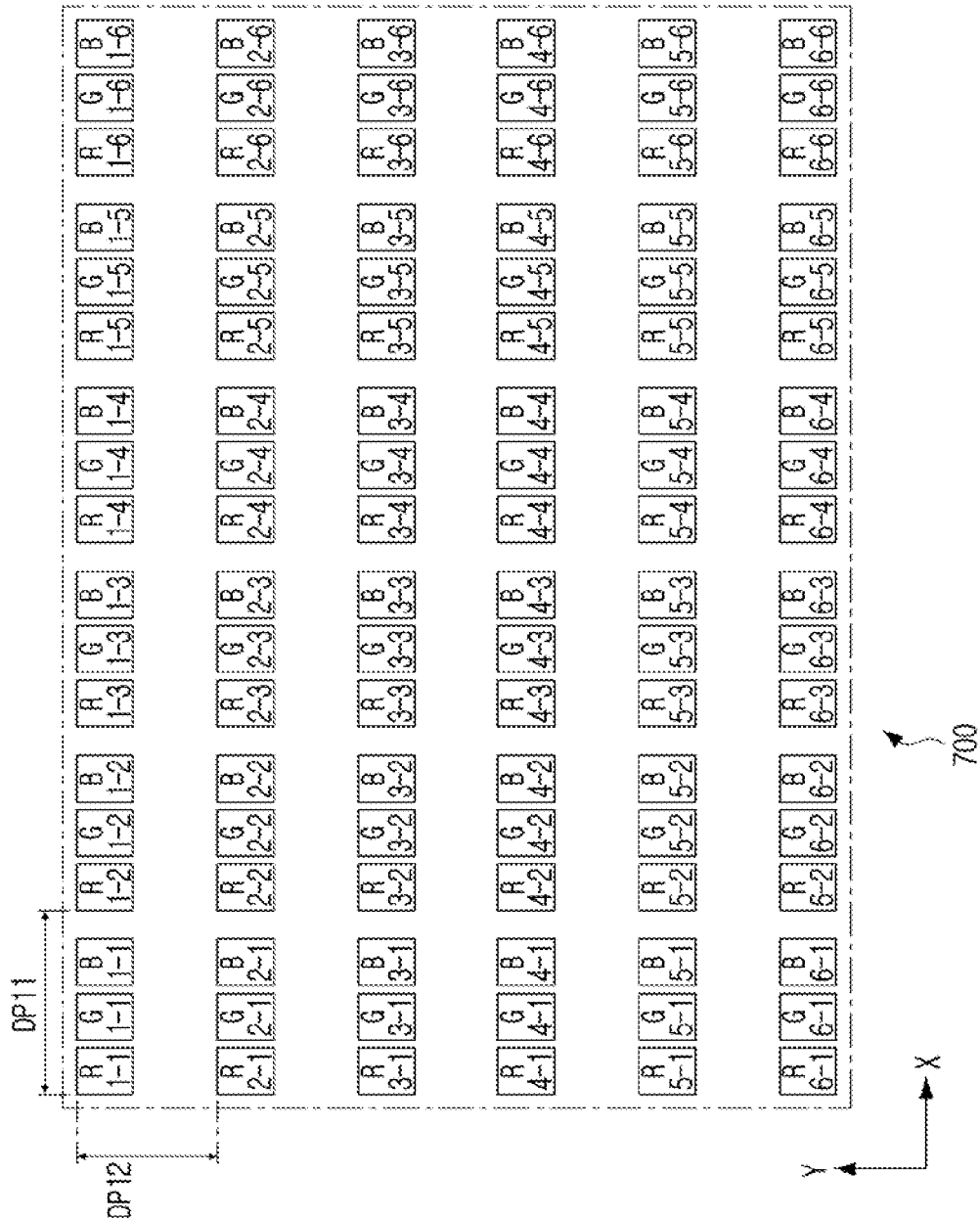

Referring to FIGS. 12G and 12H, the red LEDs, the green LEDs, and the blue LEDs (hereinafter referred to as multi-colored LEDs) of the fourth relay substrate 600 may be transported to the target substrate 700 in a certain array by the laser transfer method.

Referring to FIG. 12G, the fourth relay substrate 600 may be disposed to the upper side of the target substrate 700, and the multi-colored LEDs may be configured such that the pair of electrodes 411 and 412 faces the conductive adhesion layer 730 of the target substrate 700. The conductive adhesion layer 730 may be the flux layer included with fine metal grains in the adhesive.

The multi-colored LEDs of the fourth relay substrate 600 may be transported to the target substrate 700 by the laser transfer method in pixel units. The multi-colored LEDs positioned on the target substrate 700 may be configured such that the pair of electrodes 411 and 412 is inserted inside the conductive adhesion layer 730 or contacted to the surface of the conductive adhesion layer 730, respectively.

The multi-colored LEDs transported to the target substrate 700 are respectively in a state prior to being electrically connected with the TFT electrodes 711 and 712 because the pair of electrodes 411 and 412 is spaced apart from the TFT electrodes 711 and 712 of the target substrate 700 by a predetermined gap.

Based on all of the multi-colored LEDs of the fourth relay substrate 600 being transported to the target substrate 700 by the laser transfer method, the upper part (e.g., light-emitting surface) of the multi-colored LEDs may be pressed using a predetermined pressing member 800. In this case, the target substrate 700 may be fixed and disposed over a predetermined die.

The pressing member 800 may include the heater inside, or the heater may also be provided inside of the die on which the target substrate 700 is fixed and disposed. The respective heaters may heat the target substrate 700 in a pressing process. In this case, it is preferable for a heating temperature to be within a temperature range of an extent to which the target substrate 700 is not deteriorated.

Through a thermally pressing process as described above, the multi-colored LEDs of the target substrate 700 may be electrically connected with the TFT electrodes 711 and 712 corresponding to the pair of electrodes 411 and 412, respectively. In addition, the multi-colored LEDs may be firmly fixed physically to the conductive adhesion layer 730.

Referring to FIG. 12H, the multi-colored LEDs arrayed on the fourth relay substrate 600 may be transported to the target substrate 700 by the laser transfer method in the column direction stretch array (secondary stretch array).

For example, the multi-colored LEDs of the fourth relay substrate 600 may be transported to the target substrate 700 by one row each by the laser beam irradiated to the fourth relay substrate 600 through multiple slits 252 of a third mask 251 (referring to FIG. 12C). The multiple slits 252 of the third mask 251 may be spaced apart to correspond to the third chip pitch CP13 in the row direction, and each slit 252 may have a length and width corresponding to the three LEDs of red, green and blue corresponding to a unit pixel.

The multi-colored LEDs of a first row of the fourth relay substrate 600 may be transported concurrently or close to concurrently to the target substrate 700 to be spaced apart at the first display pitch DP11 in the laser transfer method.

Then, the multi-colored LEDs of a second row of the fourth relay substrate 600 may be transported to the target substrate 700 to be spaced apart at a second display pitch DP12 in the column direction from the multi-colored LEDs of a first row of the target substrate 700.

In the same process as described above, the multi-colored LEDs of the remaining third to sixth rows of the fourth relay substrate 600 may be transported to the target substrate 700 at the second display pitch DP12, respectively.

As described above, in the disclosure, the multi-colored LEDs may be ultimately transferred to the target substrate 700 consecutively passing the column direction stretch array and the row direction stretch array from the first relay substrates.

Figure 12I:
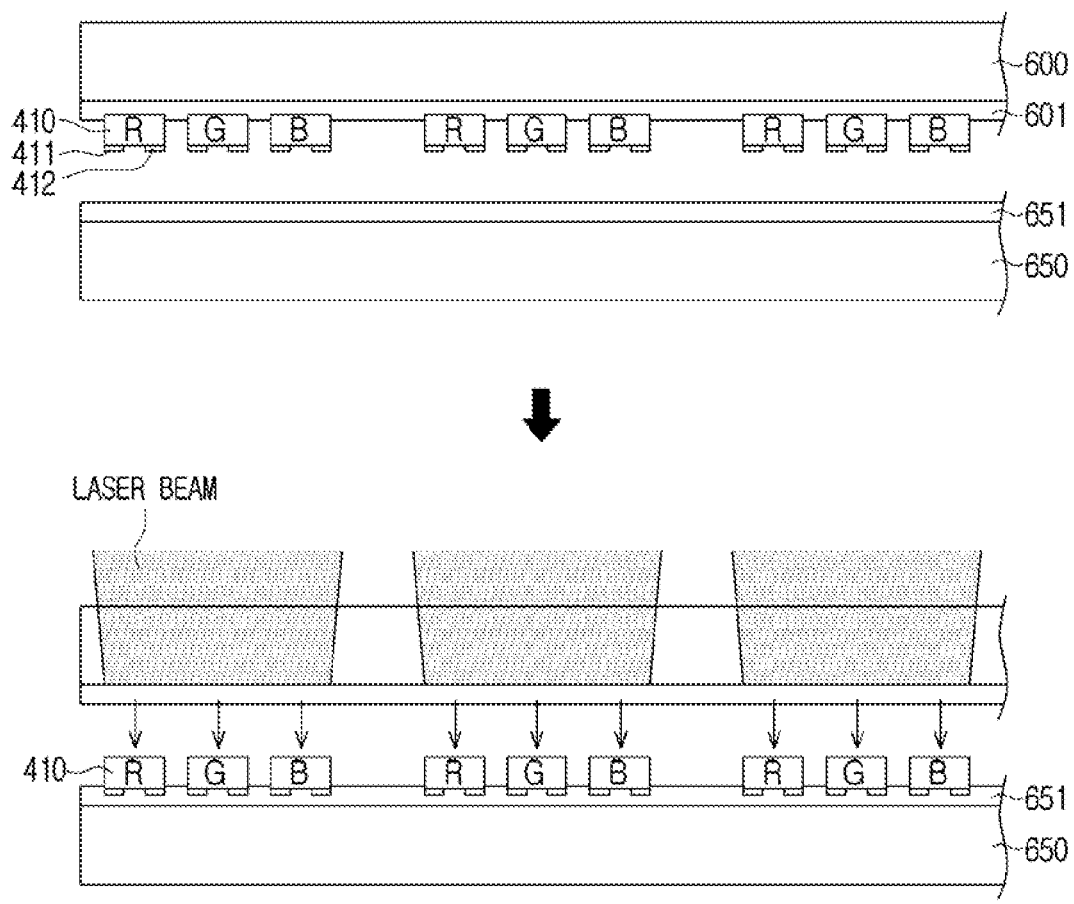
FIG. 12I to 12K are diagrams illustrating consecutively a process of transferring LEDs by using a target substrate on which an anisotropic conductive film (ACF) is formed.
Figure 12J:
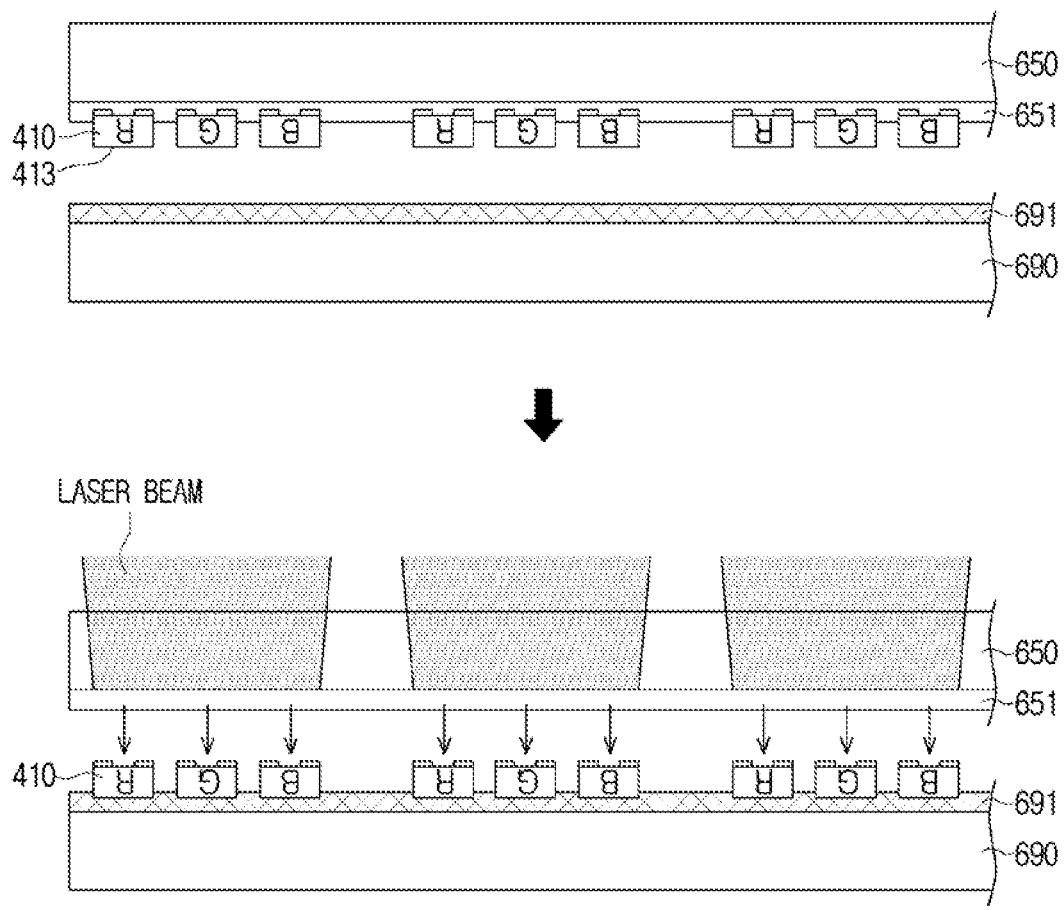
Figure 12K:
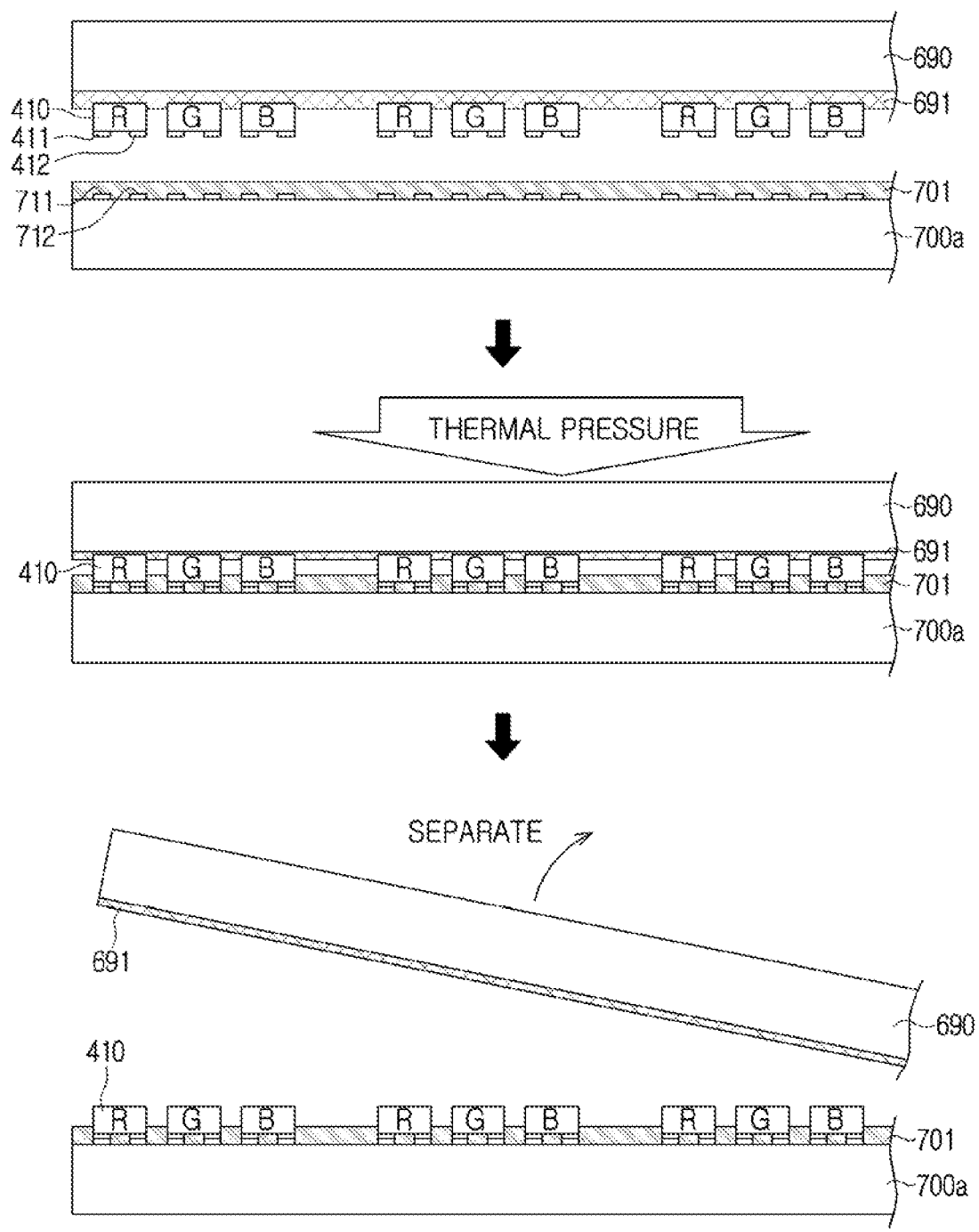

FIGS. 12I to 12K are diagrams consecutively illustrating a process of transferring LEDs by using a target substrate on which an anisotropic conductive film (ACF) is formed.

The above-described target substrate 700 may use the conductive adhesion layer 730 as a member for electrically and physically connecting the multi-colored LEDs, but is not limited thereto. For example, a target substrate 700a may include an anisotropic conductive film (ACF) layer 701 for electrically and physically connecting the multi-colored LEDs as in FIG. 12K.

In the disclosure, when using the target substrate 700a formed with the anisotropic conductive film (ACF) layer 701, the multi-colored LEDs may be transported in a process somewhat different from the above-described transfer process.

For example, as in FIG. 12I, the multi-colored LEDs of the fourth relay substrate 600 may not be directly transported to the target substrate 700a, and may be transported to a fifth relay substrate 650. In this case, the fourth relay substrate 600 may be disposed at an upper side of the fifth relay substrate 650, and the pair of electrodes 411 and 412 of the multi-colored LEDs may face a photosensitive layer 651 of the fifth relay substrate 650.

The multi-colored LEDs of the fourth relay substrate 600 may be transported to the fifth relay substrate 650 by the laser beam irradiated to the fourth relay substrate 600. The multi-colored LEDs positioned on the fifth relay substrate 650 may be configured such that the pair of electrodes 411 and 412 is inserted inside the photosensitive layer 651 or contacted to a surface of the photosensitive layer 651, respectively. In this case, the multi-colored LEDs transported to the fifth relay substrate 650 may be attached to the photosensitive layer 651 and not be separated from the fifth relay substrate 650 even if the fifth relay substrate 650 is turned over and the multi-colored LEDs face the bottom direction.

Referring to FIG. 12J, the multi-colored LEDs of the fifth relay substrate 650 may be transported to a sixth relay substrate 690 by the laser transfer method. In this case, the fifth relay substrate 650 may be disposed at an upper side of the sixth relay substrate 690, and the light-emitting surface 413 of the multi-colored LEDs may face an adhesive silicon (e.g., Polydimethylsiloxane (PDMS)) layer 691 of the sixth relay substrate 690.

The multi-colored LEDs of the fifth relay substrate 650 may be transported to the sixth relay substrate 690 by the laser beam irradiated to the fifth relay substrate 650. The multi-colored LEDs positioned on the sixth relay substrate 690 may be configured such that the light-emitting surface 413 is inserted inside the adhesive silicon layer 691 or contacted to a surface of the adhesive silicon layer 691, respectively. In this case, the multi-colored LEDs transported to the sixth relay substrate 690 may be attached to the adhesive silicon layer 691 and not be separated from the sixth relay substrate 690 even if the sixth relay substrate 690 is turned over and the multi-colored LEDs face the bottom direction.

The array of the multi-colored LEDs of the sixth relay substrate 690 may be the same as with the array of the multi-colored LEDs of the fourth relay substrate 600 (referring to FIG. 12F).

Referring to FIG. 12K, the multi-colored LEDs of the sixth relay substrate 690 may be transported to the target substrate 700a by the thermally pressing method. In this case, the sixth relay substrate 690 may be disposed to the upper side of the target substrate 700a, and the pair of electrodes 411 and 412 of the respective LEDs may face the anisotropic conductive film (ACF) layer 701 of the target substrate 700a.

In this case, the sixth relay substrate 690 may be descended toward the target substrate 700a pressing by a predetermined pressure. At this time, the target substrate 700a may be heated by operating the heaters respectively disposed inside the die to which the target substrate 700a is fixed and disposed.

Accordingly, the multi-colored LEDs of the sixth relay substrate 690 may be physically fixed to an anisotropic conductive film layer 701, and the electrodes 411 and 412 of the respective LEDs may be electrically connected with the corresponding TFT electrodes 711 and 712.

Then, the sixth relay substrate 690 may be separated from the target substrate 700a.

As described above, when using the target substrate 700a formed with the anisotropic conductive film layer 701, a final target substrate (e.g., sixth relay substrate 690) for transporting the multi-colored LEDs to the target substrate 700a may be configured such that the adhesive silicon layer 691 is formed to transfer the multi-colored LEDs of the final target substrate to the target substrate through the thermally pressing method.

FIGS. 13A to 13D are diagrams illustrating consecutively a process of transferring the multi-colored LEDs shown in FIG. 11 to the target substrate through stretch arraying in the row direction after stretch arraying in the column direction.

For convenience of description, only parts (6×6) of the LEDs of respective colors arrayed on a second red relay substrate 420R, a second green relay substrate 420G, and a second blue relay substrate 420B (hereinafter, referred to as 'second relay substrates') has been shown and described as in FIG. 13A. Although the LEDs of respective colors arrayed on a third red relay substrate 520R, a third green relay substrate 520G, and a third blue relay substrate 520B (hereinafter, referred to as 'third relay substrates') are a rectangular type disposed such that the long side is parallel to the row direction (X-axis direction) as in FIG. 11, the LEDs of respective colors have been represented as roughly a square type in FIGS. 13A to 13D for convenience of description. In addition, the mask used when laser transferring has also been shown reduced in its size or length taking into consideration the number of LEDs of respective colors.

The first red relay substrate, the first green relay substrate, and the first blue relay substrate (hereinafter, referred to as 'first relay substrates') may respectively receive transport of multiple red LEDs, multiple green LEDs, and multiple blue LEDs from the red, green and blue epi substrates respectively by the laser transfer method.

Figure 13A:
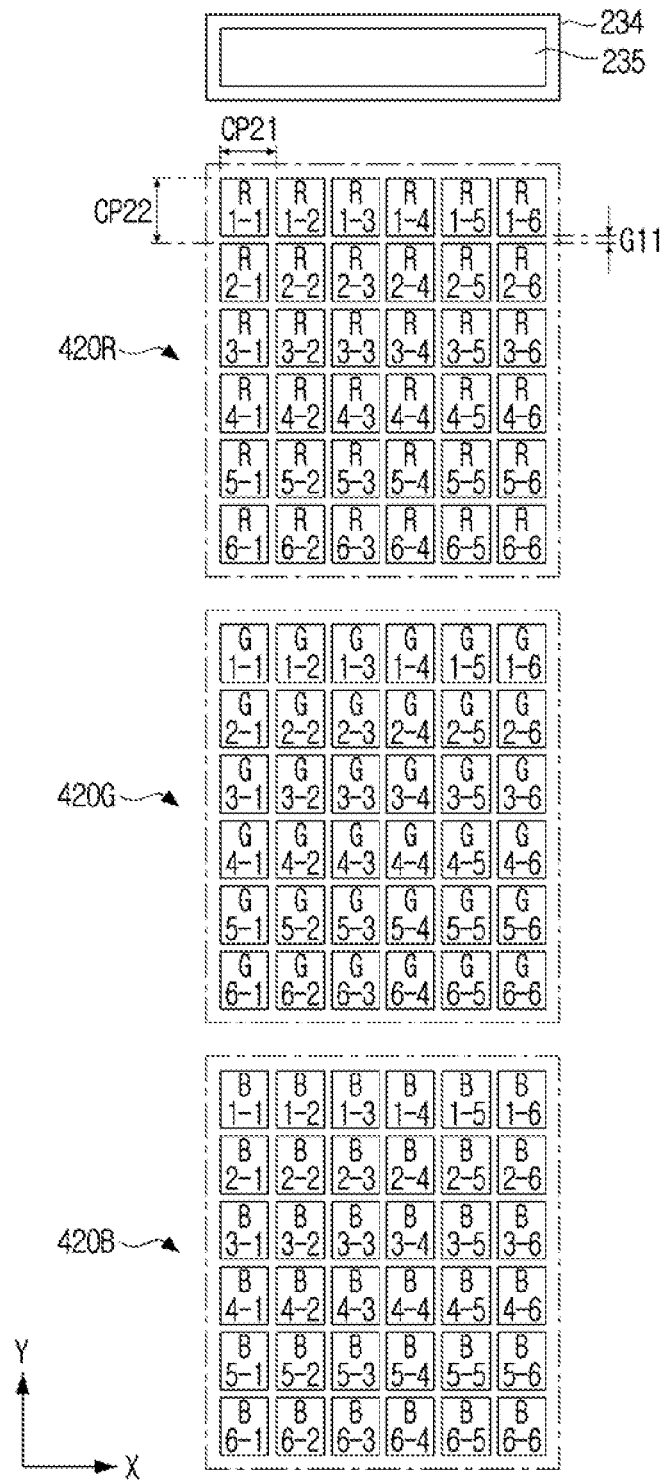
FIGS. 13A to 13D are diagrams illustrating consecutively a process of transferring LEDs of respective colors of first relay substrates shown in FIG. 11 to a target substrate through stretch arraying in a row direction after stretch arraying in a column direction.

Referring to FIG. 11 and FIG. 13A, the second red relay substrate 420R may be arrayed with multiple red LEDs transported from the first red relay substrate by the laser transfer method. The multiple red LEDs arrayed on the second red relay substrate 420R may have a first chip pitch CP21 in the row direction, and have a second chip pitch CP22 in the column direction. The first and second chip pitches CP21 and CP22 may be the same as the row direction pitch and the column direction pitch between the red LEDs arrayed on the red epi substrate.

Through the process described above, the second green relay substrate 420G and the second blue relay substrate 420B may also be transported with multiple green LEDs and multiple blue LEDs respectively from the first green relay substrate and the first blue relay substrate.

Figure 13B:
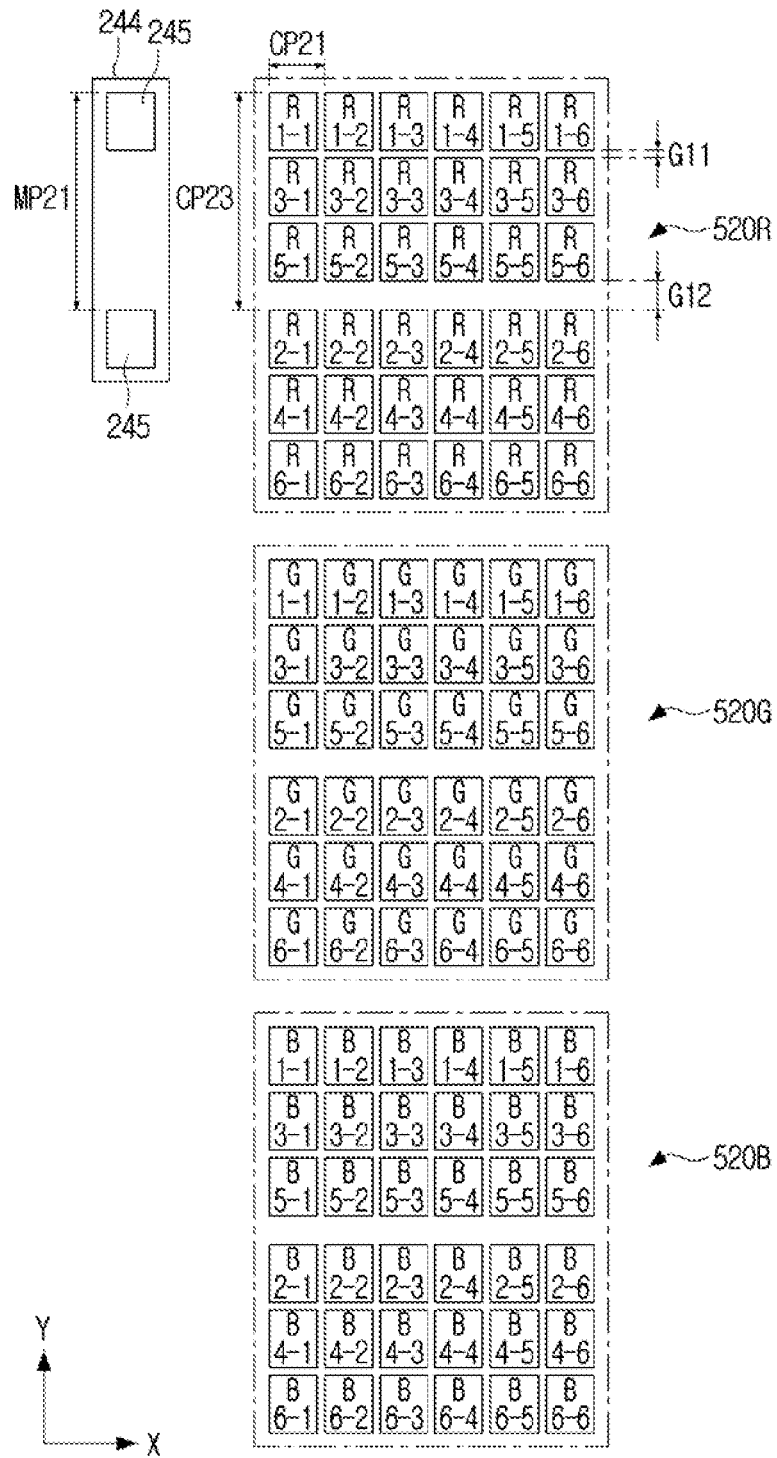

Referring to FIG. 11 and FIG. 13B, the red, green, and blue LEDs of the second relay substrates 420R, 420G, and 420B may be transported in the column direction stretch array (primary stretch array) to the third relay substrates 520R, 520G, and 520B corresponding respectively to the second relay substrates 420R, 420G, and 420B by the laser transfer method.

For example, when the laser beam is irradiated to the second red relay substrate 420R through a slit 231 of a first mask 230 (referring to FIG. 13A), the red LEDs R 1-1 to R 1-6 of a first row of the second red relay substrate 420R may be transported concurrently or close to concurrently to the third red relay substrate 520R.

Then, the red LEDs R 2-1 to R 2-6 of a second row of the second red relay substrate 420R may be transported to the third red relay substrate 520R to be spaced apart at a third chip pitch CP23 in the column direction from the red LEDs R 1-1 to R 1-6 of the third red relay substrate 520R. The third chip pitch CP23 may be greater than the first chip pitch CP21 and may correspond to a second display pitch DP22 which will be described below.

Then, the red LEDs R 3-1 to R 3-6 of a third row of the second red relay substrate 420R may be transported to the third red relay substrate 520R to be spaced apart at the first chip pitch CP21 at a lower side of the of the red LEDs R 1-1 to R 1-6 of the third red relay substrate 520R.

Then, the red LEDs R 4-1 to R 4-6 of a fourth row of the second red relay substrate 420R may be transported to the third red relay substrate 520R to be spaced apart at the third chip pitch CP23 from the red LEDs R 3-1 to R 3-6 of the third red relay substrate 520R. In this case, the red LEDs R 4-1 to R 4-6 transported to the third red relay substrate 520R may be spaced apart by the first chip pitch CP21 at a lower side of the red LEDs R 2-1 to R 2-6.

Then, the red LEDs R 5-1 to R 5-6 of a fifth row of the second red relay substrate 420R may be transported to the third red relay substrate 520R in the same method as the transport method of the red LEDs R 3-1 to R 3-6 of the third row of the second red relay substrate 420R, and the red LEDs R 6-1 to R 6-6 of a sixth row of the second red relay substrate 420R may be transported to the third red relay substrate 520R in the same method as the transport method of the red LEDs R 4-1 to R 4-6 of the fourth row of the second red relay substrate 420R.

In the respective rows of the third red relay substrate 520R, two pixels of the red LEDs may be disposed with three red LEDs each per one column to correspond to a unit pixel of a target substrate 720 which will be described below. The red LEDs within one pixel may be spaced apart by a first gap G11 in the column direction. Two pixels may be disposed with a second gap G12 therebetween in the column direction.

Like the process of transporting the multiple red LEDs of the second red relay substrate 420R to the third red relay substrate 520R, the multiple green LEDs of the second green relay substrate 420G and the multiple blue LEDs of the second blue relay substrate 420B may be transported to the third green relay substrate 520G and the third blue relay substrate 520B, respectively.

The LEDs of respective colors of the second relay substrates 420R, 420G, and 420B may be transported to the respectively corresponding third relay substrates 520R, 520G, and 520B in the column direction stretch array (primary stretch array).

Figure 13C:
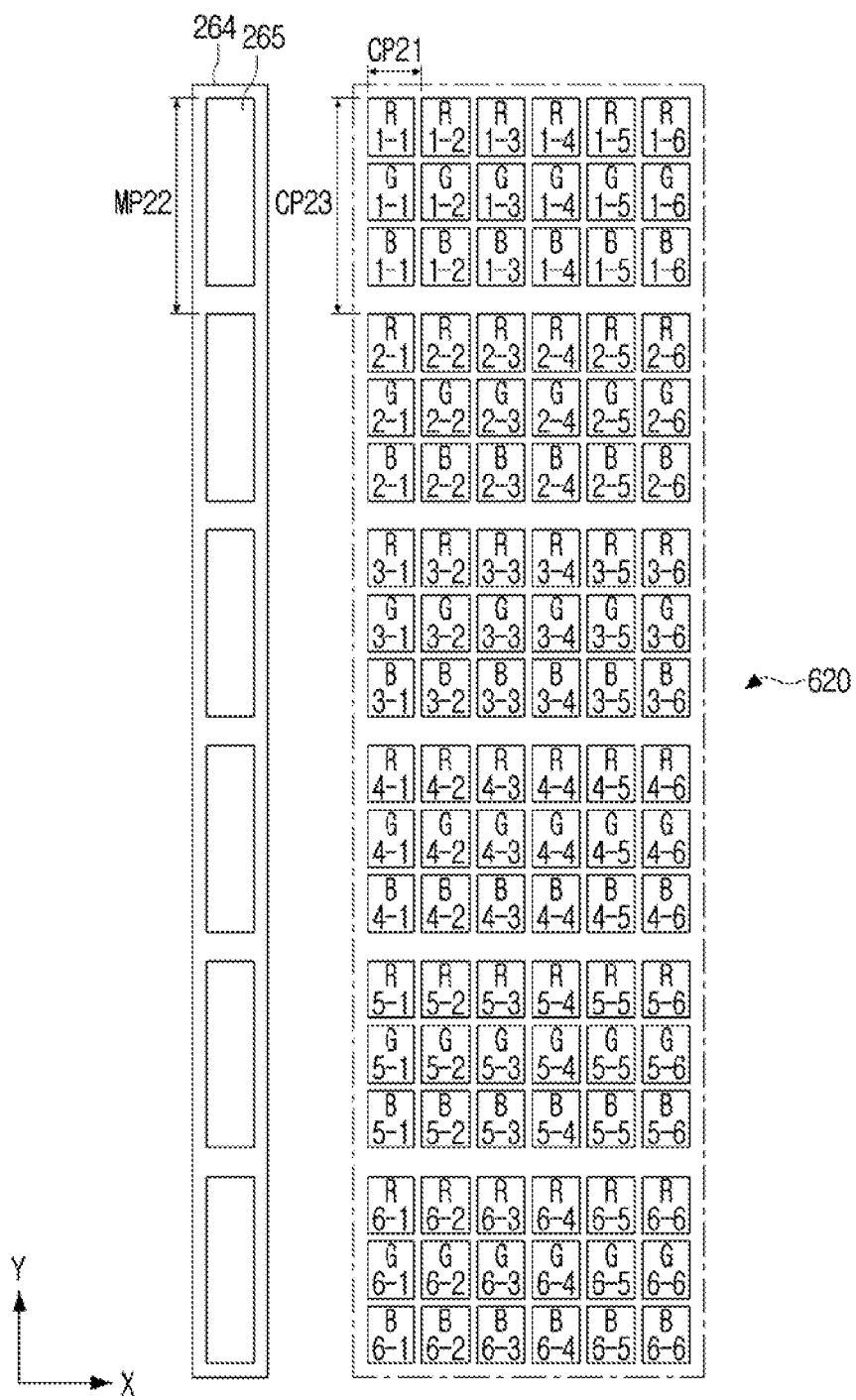

Referring to FIG. 11 and FIG. 13C, the red, green, and blue LEDs of the third relay substrates 520R, 520G, and 520B may be transported to one piece of a fourth relay substrate 620 in a certain array by the laser transfer method.

For example, the multiple red LEDs of the third red relay substrate 520R may be transported to the fourth relay substrate 620 by two each by the laser beam irradiated to the third red relay substrate 520R through a slit 245 of a second mask 244 (referring to FIG. 13B). The pair of slits 245 of the second mask 244 may be formed to a size corresponding a single LED respectively, and a pitch MP21 (referring to FIG. 13B) between the slits 245 may correspond to the third chip pitch CP23.

The first and second red LEDs R 1-1 and R 2-1 of a first column of the third red relay substrate 520R may be transported to the fourth relay substrate 620 to be spaced apart at the third chip pitch CP23 by the laser transfer method.

Then, the third and fourth red LEDs R 3-1 and R 4-1 of the first column of the third red relay substrate 520R may be transported to a first column of the fourth relay substrate 620. In this case, the third red LED R 3-1 may be disposed on the fourth relay substrate 620 to be spaced apart at the third chip pitch CP23 at a lower side of the second red LED R 2-1 of the fourth relay substrate 620. The fourth red LED R 4-1 may be disposed on the fourth relay substrate 620 in a state spaced part by the third chip pitch CP23 at a lower side of the third red LED R 3-1 of the fourth relay substrate 620.

Then, the fifth and sixth red LEDs R 5-1 and R 6-1 of the first column of the third red relay substrate 520R may be transported to the fourth relay substrate 620 in the same method as the transport method of the third and fourth red LEDs R 3-1 and R 4-1.

As described above, after transporting the red LEDs R 1-1 to R 6-1 of the first column of the third red relay substrate 520R to the fourth relay substrate 620, the remaining red LEDs R 1-2 to R 6-6 of the third red relay substrate 520R may be transported consecutively by column to the fourth relay substrate 620. In this case, the remaining red LEDs R 1-2 to R 6-6 to be transported to the fourth relay substrate 620 may be disposed to be spaced apart at the first chip pitch CP21 between the rows.

In the same process described above, the multiple green LEDs of the third green relay substrate 520G and the multiple blue LEDs of the third blue relay substrate 520B may be transported to the fourth relay substrate 620, respectively.

Figure 13D:
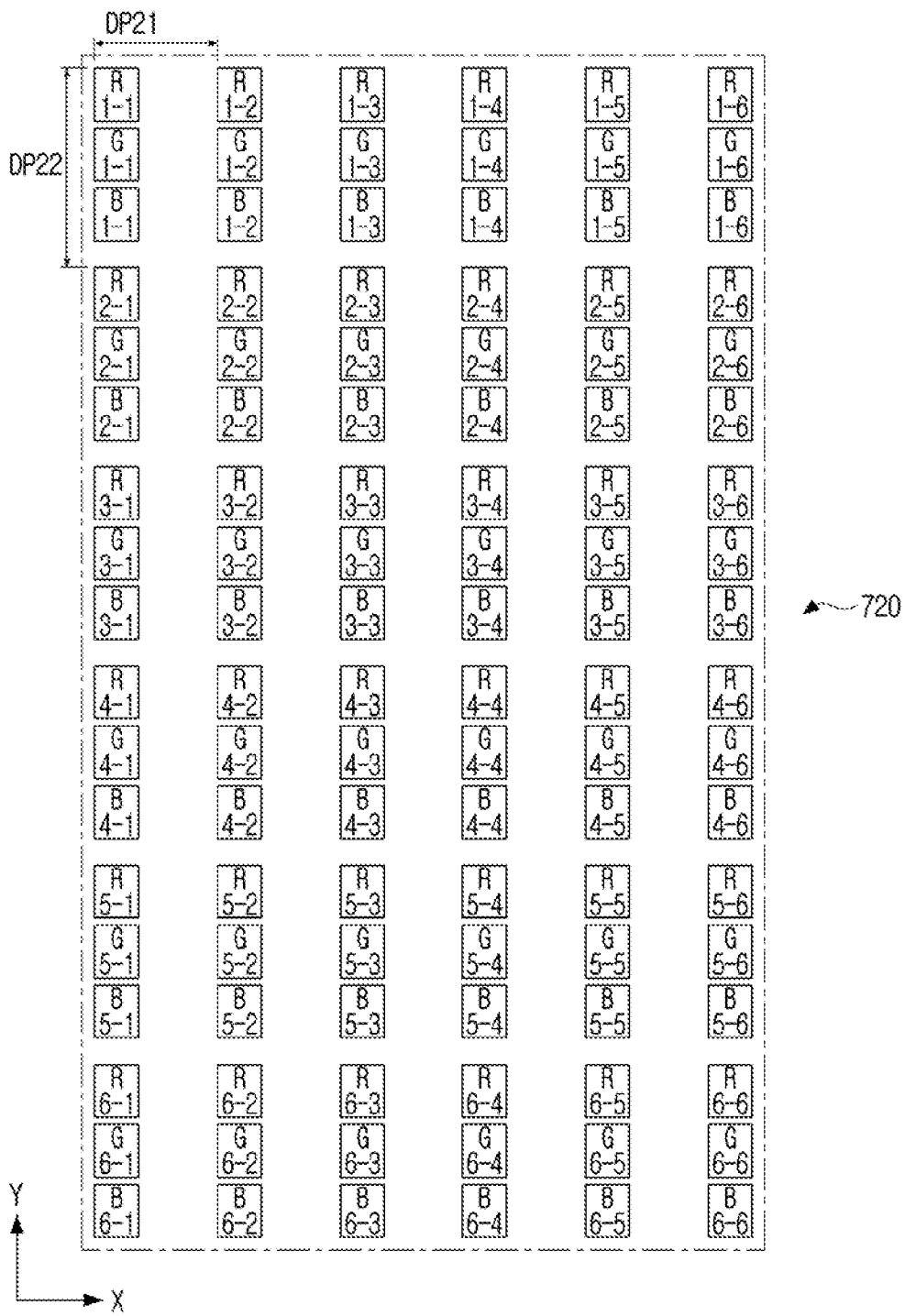

Referring to FIG. 11 and FIG. 13D, the multi-colored LEDs arrayed on the fourth relay substrate 620 may be transported in the row direction stretch array (secondary stretch array) state to the target substrate 720 by the laser transfer method.

For example, the multi-colored LEDs of the fourth relay substrate 620 may be transported to the target substrate 720 by one column each by the laser beam irradiated to the fourth relay substrate 620 through multiple slits 265 of a third mask 264 (referring to FIG. 13C). The multiple slits 265 of the third mask 264 may be spaced apart to correspond to the third chip pitch CP23 in the column direction, and each slit 265 may have a length and width corresponding to the three LEDs of red, green, and blue corresponding to a unit pixel.

The multi-colored LEDs of the first column of the fourth relay substrate 620 may be transported concurrently or close to concurrently to the target substrate 720 to be spaced apart at the second display pitch DP22 in the laser transfer method.

Then, the multi-colored LEDs of a second column of the fourth relay substrate 620 may be transported to the target substrate 720 to be spaced apart at a first display pitch DP21 in the row direction from the multi-colored LEDs of the first column of the target substrate 720.

In the same process as described above, the multi-colored LEDs of the remaining second to sixth columns of the fourth relay substrate 620 may be transported to the target substrate 720 at the first display pitch DP21, respectively.

As described above, in the disclosure, the multi-colored LEDs may be ultimately transferred to the target substrate 720 consecutively passing the column direction stretch array and the row direction stretch array from second relay substrates 420R, 420G, and 420B.

Figure 14:
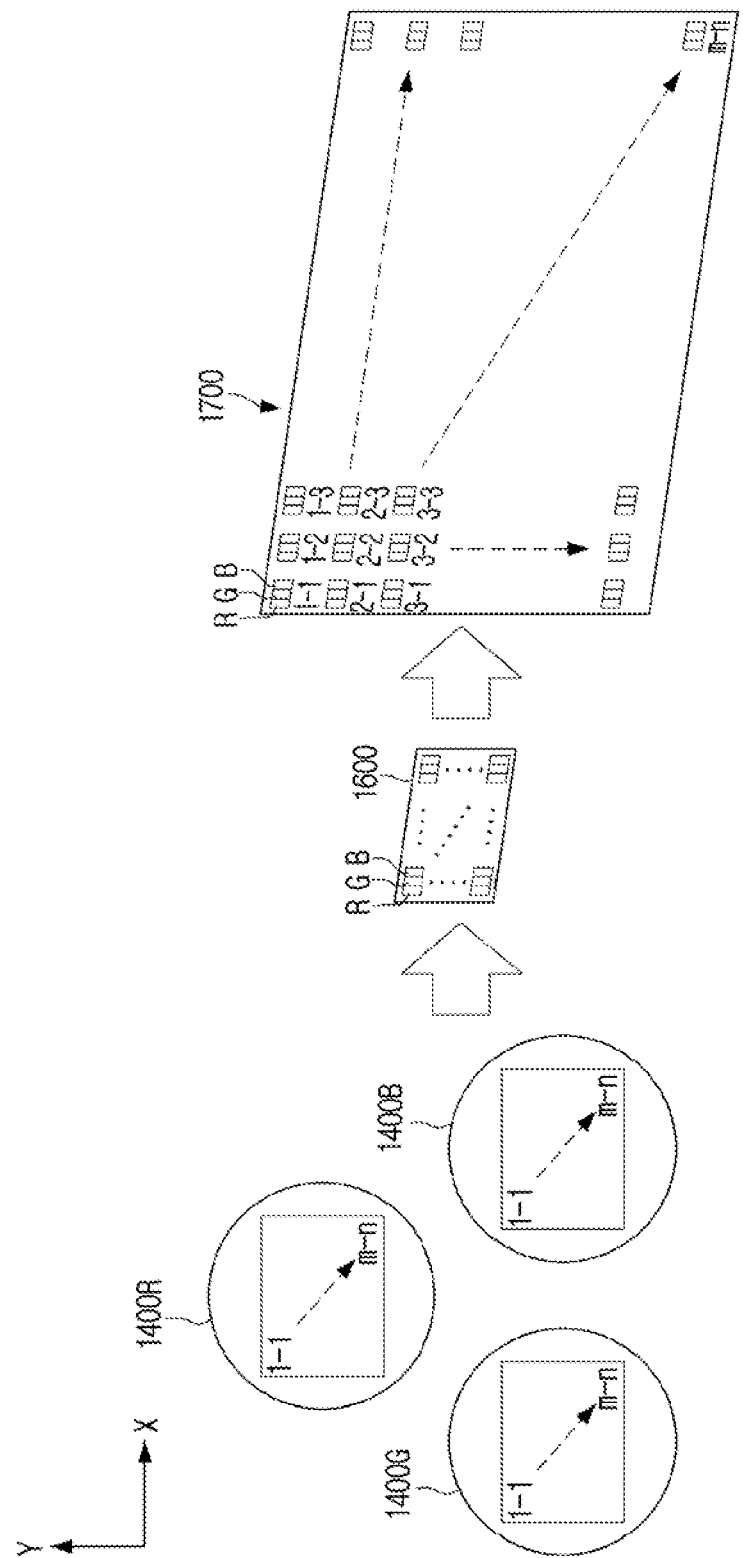
FIG. 14 is a diagram illustrating an example of having prepared first relay substrates of respective colors by one each respectively as a process diagram illustrating schematically a method for manufacturing a display module according to an embodiment.

FIG. 14 is a process diagram illustrating schematically a method for manufacturing a display module according to still another embodiment, and FIGS. 15A to 15F are diagrams illustrating consecutively a process of transferring LEDs of respective colors of the first relay substrates shown in FIG. 14 to a target substrate through stretch arraying in the column direction after stretch arraying in the row direction.

Although the LEDs of respective colors arrayed on a first red relay substrate 1400R, a first green relay substrate 1400G, and a first blue relay substrate 1400B (hereinafter, referred to as 'first relay substrates') are a rectangular type disposed such that the long side is parallel to the Y-axis direction as in FIG. 14, the LEDs of respective colors have been represented as roughly a square type in FIGS. 15B, 15D, and 15F for convenience of description. In addition, for convenience of description, only parts (6×6) of the LEDs of respective colors arrayed on the first relay substrates 1400R, 1400G, and 1400B will be shown and described. In addition, the mask used when laser transferring may also be reduced in its size or length and shown taking into consideration the number of LEDs of respective colors.

Figure 15A:
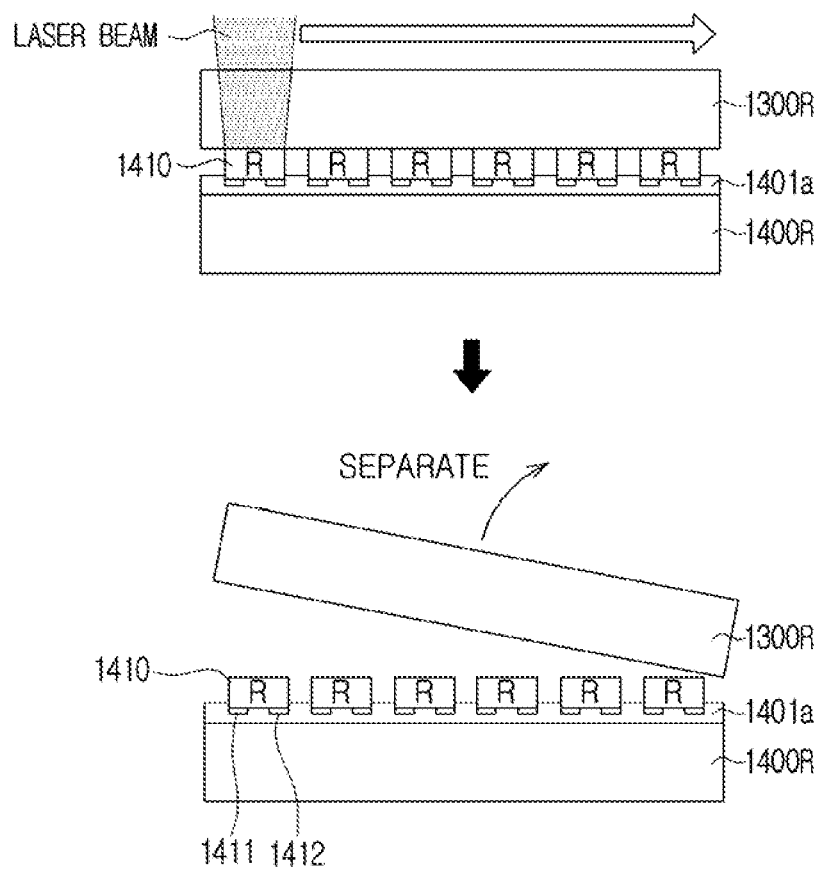
FIGS. 15A to 15F are diagrams illustrating consecutively a process of transferring LEDs of respective colors of the first relay substrates shown in FIG. 14 to a target substrate through stretch arraying in a column direction after stretch arraying in a row direction.

Referring to FIG. 15A, a red epi substrate 1300R may be manufactured through the photolithography process and the isolation process so as to maintain gaps (row direction gaps and column direction gaps) between red LEDs 1410 to a processable minimum gap.

The first red relay substrate 1400R may be transferred with the multiple red LEDs 1410 from the red epi substrate 1300R by the laser transfer method. In this case, the first red relay substrate 1400R may be formed with a photosensitive layer 1401a of a predetermined thickness at a surface on which multiple red LEDs 1410 are positioned. The multiple red LEDs positioned on the first red relay substrate 1400R may be configured such that a pair of electrodes 1411 and 1412 is inserted inside the photosensitive layer 1401a or contacted to a surface of the photosensitive layer 1401a. The multiple red LEDs transported to the first red relay substrate 1400R may be attached to the photosensitive layer 1401a and not be separated from the first red relay substrate 1400R even if the first red relay substrate 1400R is turned over and multiple red LEDs face the bottom direction.

The red epi substrate 1300R may separate from the multiple red LEDs through the laser lift-off (LLO) method.

Through the process described above, the multiple green LEDs may be transported from the green epi substrate to the first green relay substrate 1400G, and the multiple blue LEDs may be transported from the blue epi substrate to the first blue relay substrate 1400B.

Figure 15B:
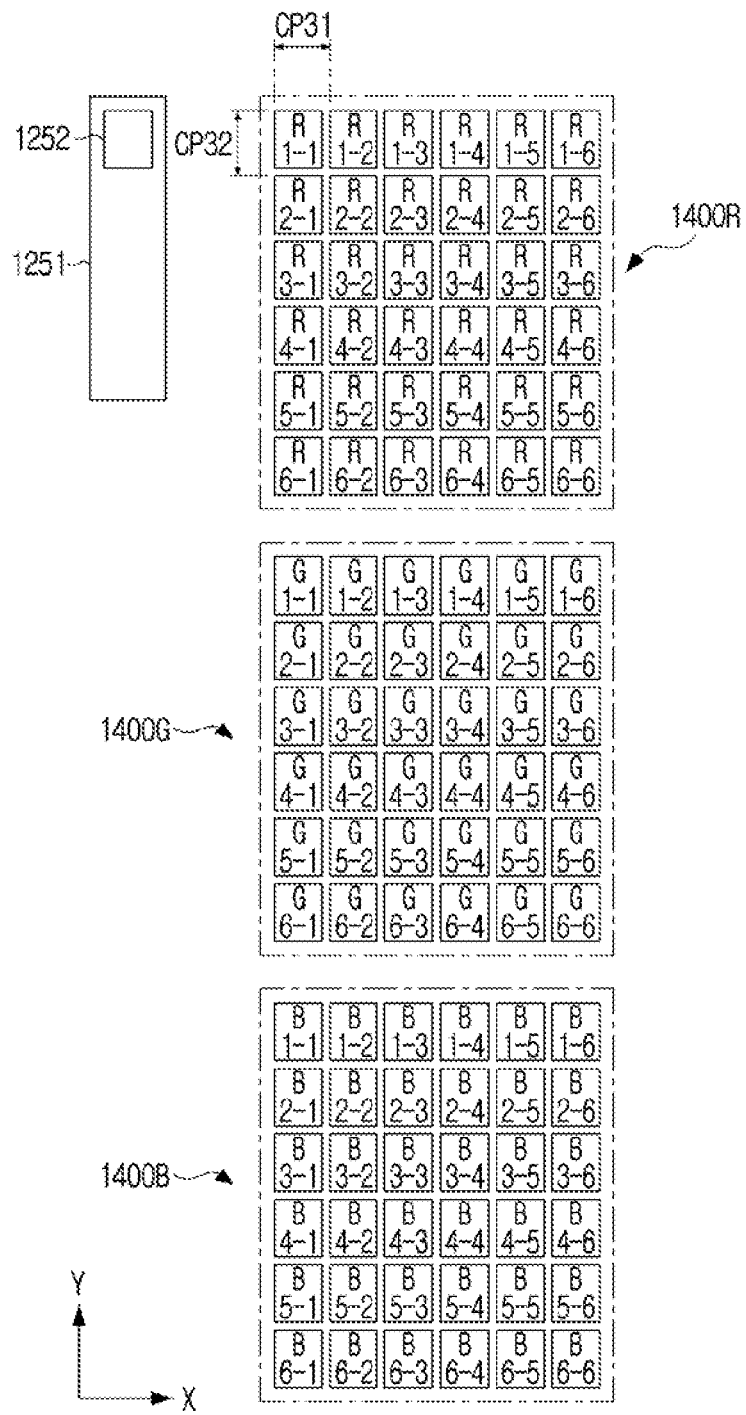

Referring to FIG. 15B, the multiple red LEDs arrayed on the first red relay substrate 1400R may have a same chip pitch (hereinafter, referred to as 'first chip pitch') CP31 in the row direction, and have the same chip pitch (hereinafter, referred to as 'second chip pitch') CP32 in also the column direction. The first and second chip pitches CP31 and CP32 may be the same as the row direction pitch and the column direction pitch between the red LEDs arrayed on the red epi substrate.

The first and second chip pitches CP31 and CP32 of the multiple green LEDs arrayed on the first green relay substrate 1400G may be the same as the row direction pitch and the column direction pitch between the green LEDs arrayed on the green epi substrate. In addition, the first and second chip pitches CP31 and CP32 of the multiple blue LEDs arrayed on the first blue relay substrate 1400B may be the same as the row direction pitch and the column direction pitch between the blue LEDs arrayed on the blue epi substrate.

Figure 15C:
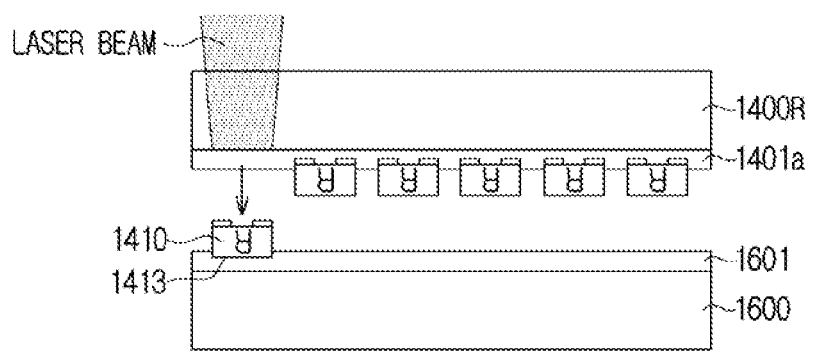

Referring to FIG. 15C, the multiple red LEDs may be transported from the first red relay substrate 1400R to one piece of a second relay substrate 1600. In this case, the first red relay substrate 1400R may be disposed at an upper side of the second relay substrate 1600, and the multiple red LEDs 1410 may be configured such that a light-emitting surface 1413 faces a photosensitive layer 1601 of the second relay substrate 1600.

The second relay substrate 1600 may be configured such that the multiple red LEDs 1410 are transported from the first red relay substrate 1400R by the laser transfer method. The multiple red LEDs 1410 positioned on the second relay substrate 1600 may be configured such that the light-emitting surface 1413 is inserted inside the photosensitive layer 1601 or contacted to a surface of the photosensitive layer 1601. In this case, the multiple red LEDs transported to the second relay substrate 1600 may be attached to the photosensitive layer 1601 and not be separated from the second relay substrate 1600 even if the second relay substrate 1600 is turned over and the multiple red LEDs face the bottom direction.

Through the process described above, the multiple green LEDs may be transported from the first green relay substrate 1400G and the multiple blue LEDs may be transported from the first blue relay substrate 1400B to the second relay substrate 1600.

Figure 15D:
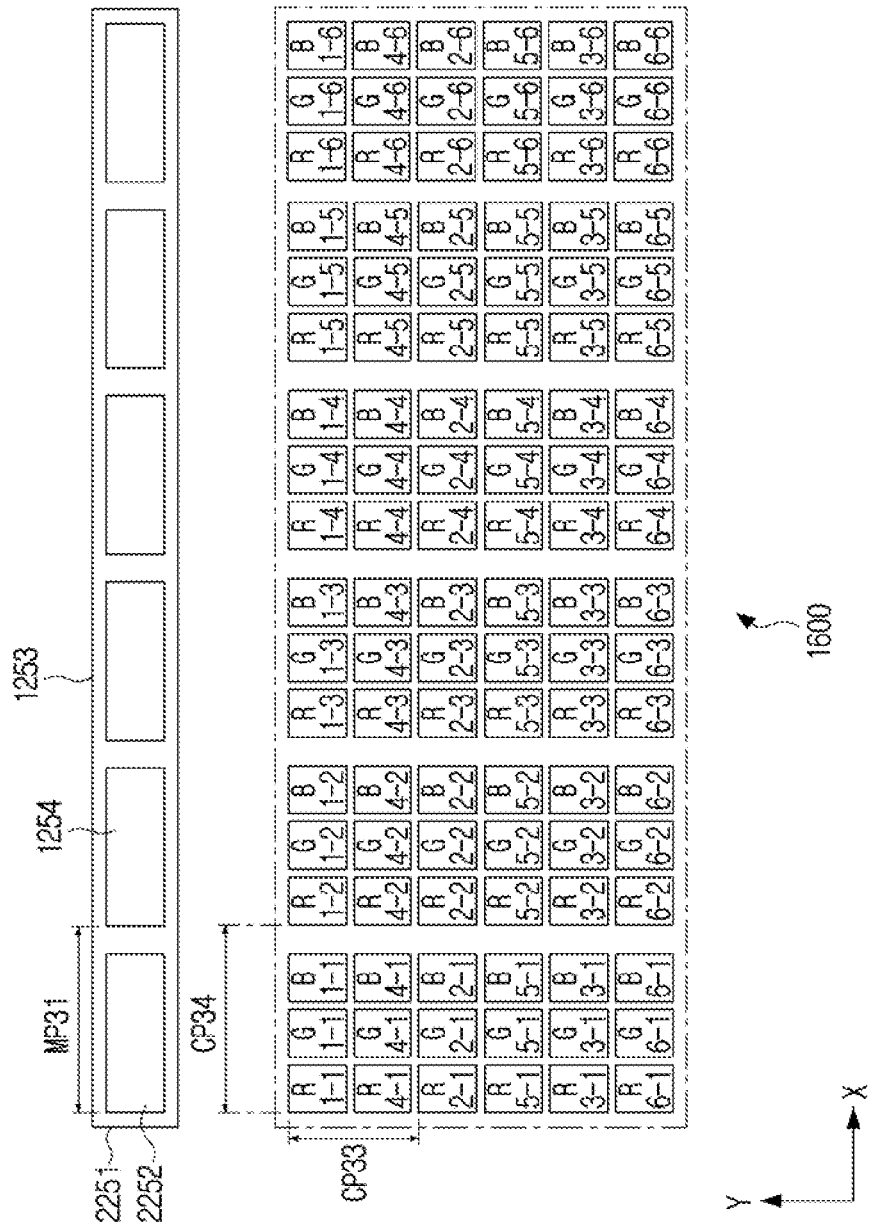

Referring to FIG. 15D, the LEDs of respective colors from the first relay substrates 1400R, 1400G, and 1400B may be transported to one piece of the second relay substrate 1600 through the laser transfer method in the row direction stretch array (primary stretch array).

For example, the multiple red LEDs of the first red relay substrate 1400R may be transported to the second relay substrate 1600 by one each by the laser beam irradiated to the first red relay substrate 1400R through one slit 1252 of a first mask 1251 (referring to FIG. 15A). The slit 1252 of the first mask 1251 may be formed to a size corresponding to a single LED.

A first red LED R 1-1 of a first column of the first red relay substrate 1400R may be transported to the second relay substrate 1600 by the laser transfer method.

Then, a second red LED R 2-1 of the first column of the first red relay substrate 1400R may be transported to a lower side of the first red LED R 1-1 of the second relay substrate 1600 to be spaced apart at a third chip pitch CP33. A third red LED R 3-1 of the first column of the first red relay substrate 1400R may be transported to the lower side of the second red LED R 2-1 of the second relay substrate 1600 to be spaced apart at third chip pitch CP33.

Then, a fourth red LED R 4-1 of the first column of the first red relay substrate 1400R may be transported to the lower side of the first red LED R 1-1 of the second relay substrate 1600 to be spaced apart at a second chip pitch CP32. A fifth red LED R 5-1 of the first column of the first red relay substrate 1400R may be transported to the lower side of the second red LED R 2-1 of the second relay substrate 1600 to be spaced apart at the second chip pitch CP32. A sixth red LED R 6-1 of the first column of the first red relay substrate 1400R may be transported to the lower side of the third red LED R 3-1 of the second relay substrate 1600 to be spaced apart at the second chip pitch CP32.

In the same process as described above, red LEDs R 1-2 to R 6-6 of a second column to a sixth column of the first red relay substrate 1400R may be transported consecutively to the second relay substrate 1600.

In the same process as described above, the multiple green LEDs of the first green relay substrate 1400G and the multiple blue LEDs of the first blue relay substrate 1400B may be transported to the second relay substrate 1600.

The LEDs of respective colors arrayed on the second relay substrate 1600 may be configured such that six pixels of red, green, and blue LEDs arrayed with three each in the row direction are disposed spaced apart by a fourth chip pitch CP34 in the respective rows to correspond to a unit pixel of a target substrate 1700 which will be described below. In this case, the respective gaps of the red, green, and blue LEDs within the unit pixel may be disposed spaced apart at a first chip pitch CP31. In addition, the respective rows of the second relay substrate 1600 may be disposed spaced apart by the second chip pitch CP32 in the column direction.

Figure 15E:
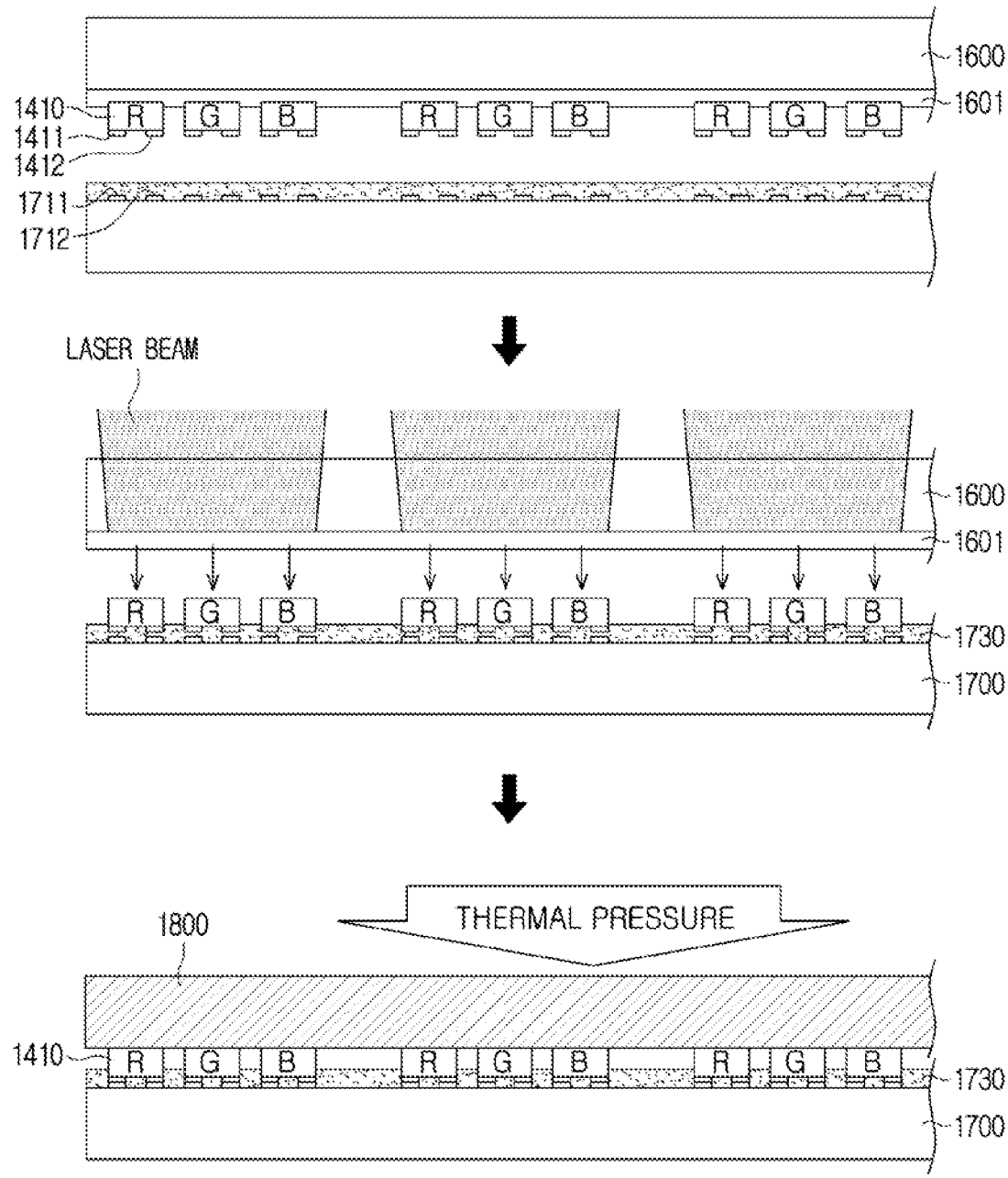

Referring to FIG. 15E, the red, green, and blue LEDs (hereinafter, referred to as multi-colored LEDs) of the second relay substrate 1600 may be transported to the target substrate 1700 by the laser transfer method in a certain array.

The second relay substrate 1600 may be disposed at an upper side of the target substrate 1700, and the multi-colored LEDs may be configured such that a pair of electrodes 1411 and 1412 faces a conductive adhesion layer 1730 of the target substrate 1700. The conductive adhesion layer 1730 may be a flux layer included with fine metal grains in the adhesive.

The multi-colored LEDs of the second relay substrate 1600 may be transported to the target substrate 1700 by the laser transfer method in pixel units. The multi-colored LEDs positioned on the target substrate 1700 may be configured such that the pair of electrodes 1411 and 1412 is inserted inside the conductive adhesion layer 1730 or contacted to a surface of the conductive adhesion layer 1730, respectively.

The multi-colored LEDs transported to the target substrate 1700 are respectively in a state prior to being electrically connected with TFT electrodes 1711 and 1712 because the pair of electrodes 1411 and 1412 is spaced apart from the TFT electrodes 1711 and 1712 of the target substrate 1700 by a predetermined gap.

Based on all of the multi-colored LEDs of the second relay substrate 1600 being transported to the target substrate 1700 by the laser transfer method, the upper part (e.g., light-emitting surface) of the multi-colored LEDs may be pressed using a predetermined pressing member 1800. In this case, the target substrate 1700 may be fixed and disposed over a predetermined die.

The pressing member 1800 may include the heater inside, or the heater may also be provided inside of the die on which the target substrate 1700 is fixed and disposed. The respective heaters may heat the target substrate 1700 in the pressing process. In this case, it is preferable for a heating temperature to be within a temperature range of an extent to which the target substrate 1700 is not deteriorated.

Through the thermally pressing process as described above, the multi-colored LEDs of the target substrate 1700 may be electrically connected with the TFT electrodes 1711 and 1712 corresponding to the pair of electrodes 1411 and 1412, respectively. In addition, the multi-colored LEDs may be firmly fixed physically to the conductive adhesion layer 1730.

Figure 15F:
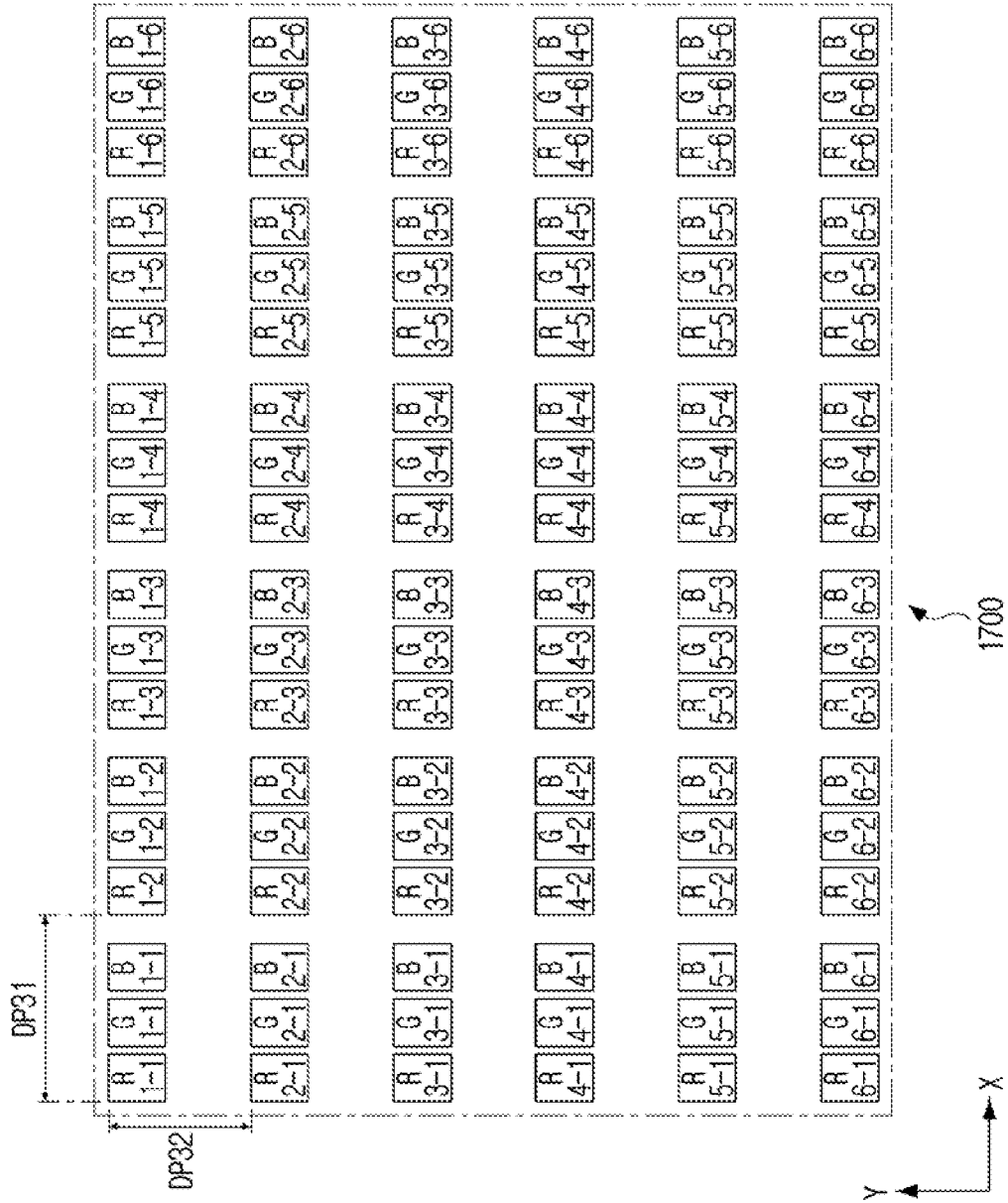

Referring to FIG. 15F, the multi-colored LEDs arrayed on the second relay substrate 1600 may be transported to the target substrate 1700 by the laser transfer method in the column direction stretch array (secondary stretch array).

For example, the multi-colored LEDs of the second relay substrate 1600 may be configured such that the multi-colored LEDs R 1-1 to B 1-6 of the first row are transported concurrently or close to concurrently to the target substrate 1700 in pixel units to be spaced apart at the fourth chip pitch CP34 by the laser beam irradiated to the second relay substrate 1600 through multiple slits 1254 of a mask 1253 (referring to FIG. 15B). The fourth chip pitch CP34 may correspond to a first display pitch DP41. In this case, each slit 1254 of the mask 1253 may be respectively formed to a size corresponding to a single pixel (three LEDs), a pitch MP31 between the slits 1254 may correspond to the fourth chip pitch CP34 and the first display pitch DP41 respectively.

Then, the multi-colored LEDs R 2-1 to B 2-6 of a third row of the second relay substrate 1600 may be transported to a lower side of the multi-colored LEDs R 1-1 to B 1-6 of a first row of the target substrate 1700 to be spaced apart at the fourth chip pitch CP34.

The multi-colored LEDs R 3-1 to B 3-6 of a fifth row of the second relay substrate 1600 may be transported to the lower side of the multi-colored LEDs R 2-1 to B 2-6 of a second row of the target substrate 1700 to be spaced apart at the fourth chip pitch CP34.

The multi-colored LEDs R 4-1 to B 4-6 of a second row of the second relay substrate 1600 may be transported to the lower side of the multi-colored LEDs R 3-1 to B 3-6 of a third row of the target substrate 1700 to be spaced apart at the fourth chip pitch CP34.

The multi-colored LEDs R 5-1 to B 5-6 of a fourth row of the second relay substrate 1600 may be transported to the lower side of the multi-colored LEDs R 4-1 to B 4-6 of a fourth row of the target substrate 1700 to be spaced apart at the fourth chip pitch CP34.

The multi-colored LEDs R 6-1 to B 6-6 of a sixth row of the second relay substrate 1600 may be transported to the lower side of the multi-colored LEDs R 5-1 to B 5-6 of a fifth row of the target substrate 1700 to be spaced apart at the fourth chip pitch CP34.

As described above, in the disclosure, the multi-colored LEDs may be ultimately transferred to the target substrate 1700 consecutively passing the row direction stretch array and the column direction stretch array from the first relay substrates 1400R, 1400G, and 1400B. In this case, the process shown in FIG. 14 may further reduce the number of processes than the process of transporting the LEDs between the relay substrates shown in FIG. 11.

Figure 15G:
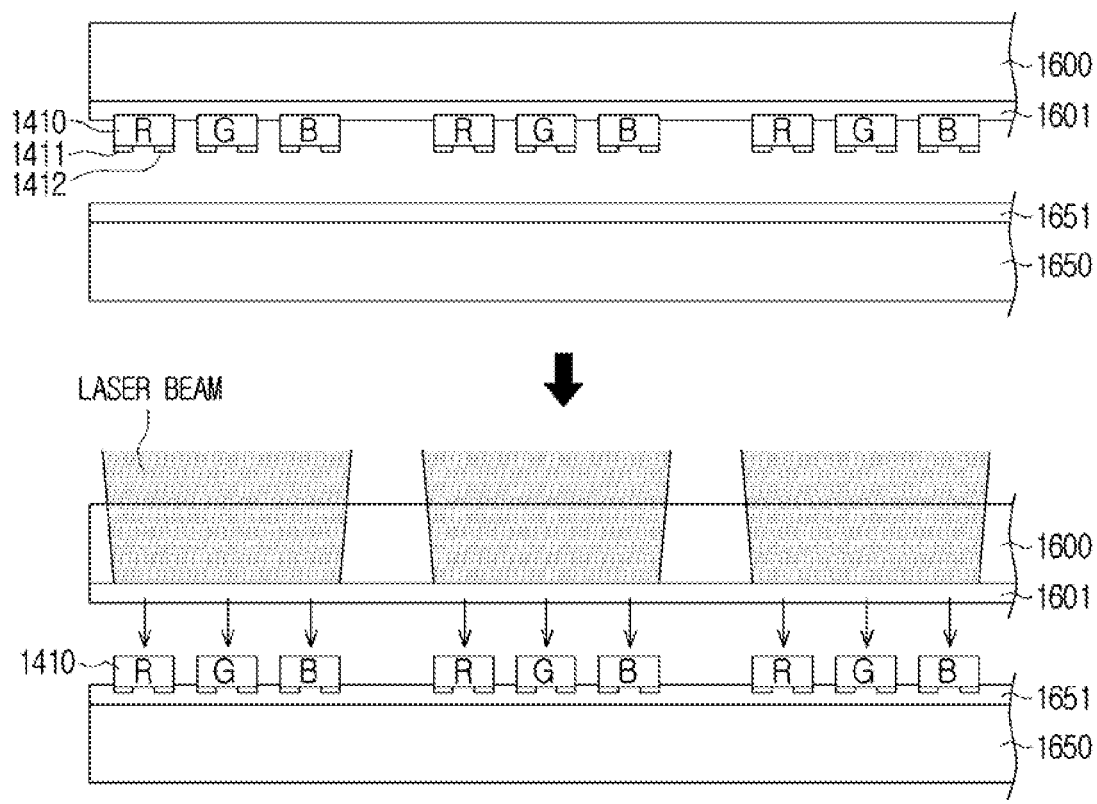
FIGS. 15G to 15I are diagrams illustrating consecutively a process of transferring LEDs by using a target substrate on which an anisotropic conductive film (ACF) is formed.
Figure 15H:
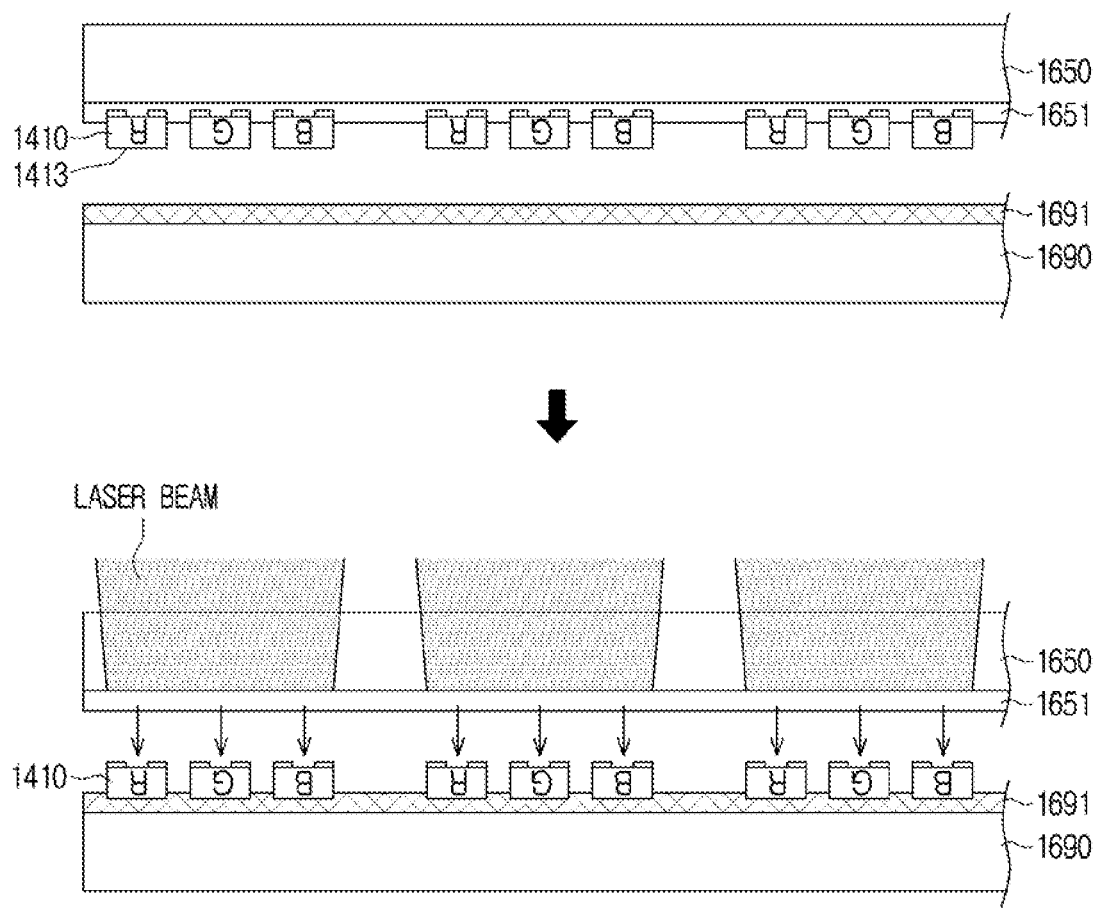
Figure 15I:
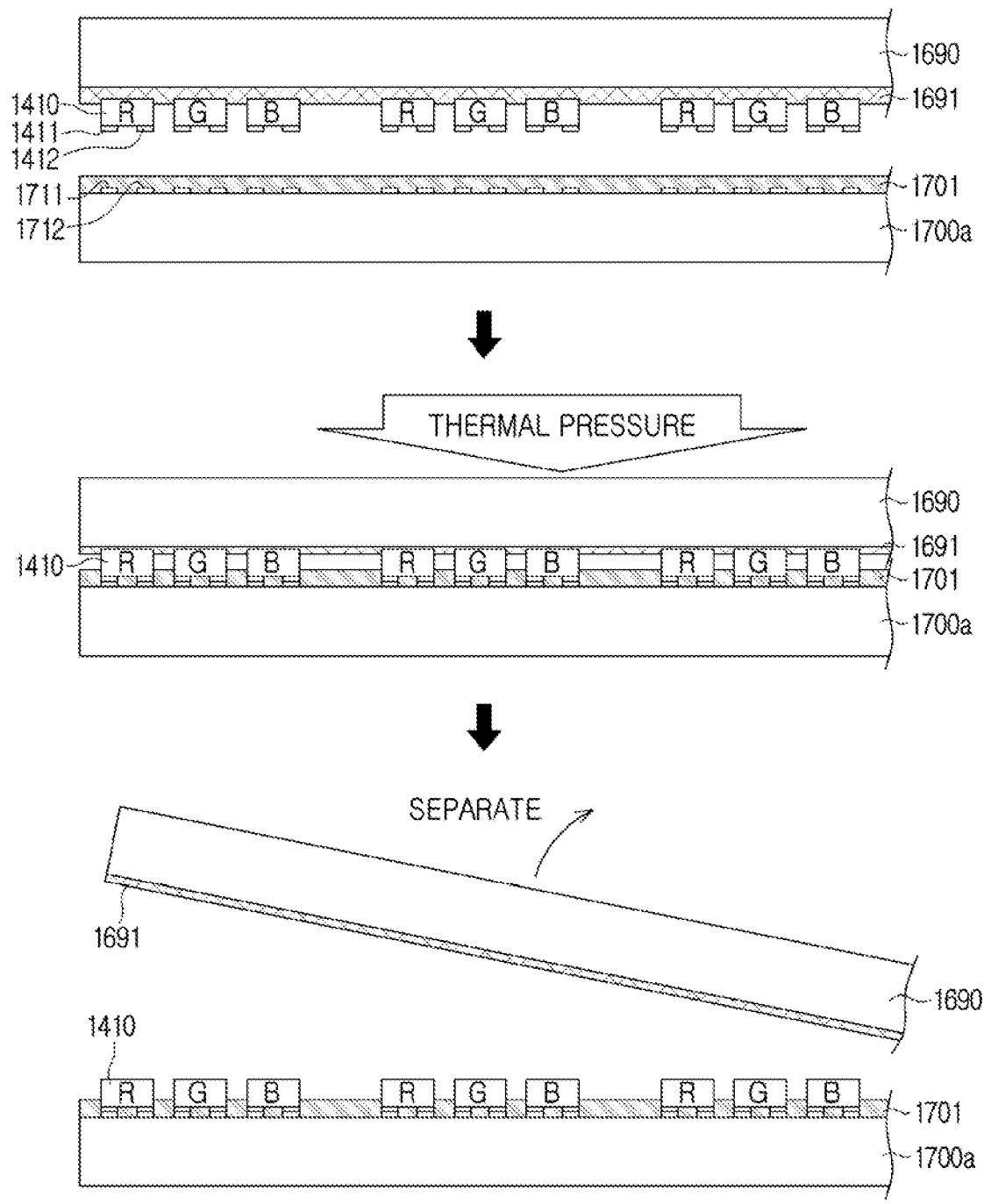

FIGS. 15G to 15I are diagrams illustrating consecutively a process of transferring LEDs by using a target substrate on which an anisotropic conductive film (ACF) is formed.

The above-described target substrate 1700 may use the conductive adhesion layer 1730 as a member for electrically and physically connecting the multi-colored LEDs, but is not limited thereto. For example, a target substrate 1700*a* may include an anisotropic conductive film (ACF) layer 1701 for electrically and physically connecting the multi-colored LEDs as in FIG. 15I.

In the disclosure, when using the target substrate 1700*a* formed with the anisotropic conductive film (ACF) layer 1701, the multi-colored LEDs may be transported in a process somewhat different from the above-described transfer process.

For example, as in FIG. 15G, the multi-colored LEDs of the second relay substrate 1600 may not be directly transported to the target substrate 1700*a*, and may be transported to a third relay substrate 1650. In this case, the second relay substrate 1600 may be disposed at an upper side of the third relay substrate 1650, and the pair of electrodes 1411 and 1412 of the multi-colored LEDs may face a photosensitive layer 1651 of the third relay substrate 1650.

The multi-colored LEDs of the second relay substrate 1600 may be transported to the third relay substrate 1650 by the laser beam irradiated to the second relay substrate 1600. The multi-colored LEDs positioned on the third relay substrate 1650 may be configured such that the pair of electrodes 1411 and 1412 is inserted inside the photosensitive layer 1651 or contacted to a surface of the photosensitive layer 1651, respectively. In this case, the multi-colored LEDs transported to the third relay substrate 1650 may be attached to the photosensitive layer 1651 and not be separated from the third relay substrate 1650 even if the third relay substrate 1650 is turned over and the multi-colored LEDs face the bottom direction.

Referring to FIG. 15H, the multi-colored LEDs of the third relay substrate 1650 may be transported to a fourth relay substrate 1690 by the laser transfer method. In this case, the third relay substrate 1650 may be disposed at a upper side of the fourth relay substrate 1690, and the light-emitting surface 1413 of the multi-colored LEDs may face an adhesive silicon (e.g., Polydimethylsiloxane (PDMS)) layer 1691 of the fourth relay substrate 1690.

The multi-colored LEDs of the third relay substrate 1650 may be transported to the fourth relay substrate 1690 by the laser beam irradiated to the third relay substrate 1650. The multi-colored LEDs positioned on the fourth relay substrate 1690 may be configured such that the light-emitting surface 1413 is inserted inside the adhesive silicon layer 1691 or contacted to a surface of the adhesive silicon layer 1691, respectively. In this case, the multi-colored LEDs transported to the fourth relay substrate 1690 may be attached to the adhesive silicon layer 1691 and not be separated from the fourth relay substrate 1690 even if the fourth relay substrate 1690 is turned over and the multi-colored LEDs face the bottom direction.

The array of the multi-colored LEDs of the fourth relay substrate 1690 may be the same as with the array of the multi-colored LEDs of the second relay substrate 1600 (referring to FIG. 15D).

Referring to FIG. 15I, the multi-colored LEDs of the fourth relay substrate 1690 may be transported to the target substrate 1700a by the thermally pressing method. In this case, the fourth relay substrate 1690 may be disposed at an upper side of the target substrate 1700a, and the pair of electrodes 1411 and 1412 of the respective LEDs may face the anisotropic conductive film (ACF) layer 1701 of the target substrate 1700a.

In this case, the fourth relay substrate 1690 may be descended toward the target substrate 1700a pressing by a predetermined pressure. At this time, the target substrate 1700a may be heated by operating the heaters respectively disposed inside the die to which the target substrate 1700a is fixed and disposed.

Accordingly, the multi-colored LEDs of the fourth relay substrate 1690 may be physically fixed to the anisotropic conductive film layer 1701, and may be electrically connected with the TFT electrodes 1711 and 1712 corresponding to the electrodes 411 and 412 of the respective LEDs.

Then, the fourth relay substrate 1690 may be separated from the target substrate 1700a.

As described above, when using the target substrate 1700a formed with the anisotropic conductive film layer 1701, a final target substrate (e.g., fourth relay substrate 1690) for transporting the multi-colored LEDs to the target substrate 1700a may transfer the multi-colored LEDs of the final target substrate to the target substrate through the thermally pressing method as the adhesive silicon layer 1691 is formed.

Figure 16A:
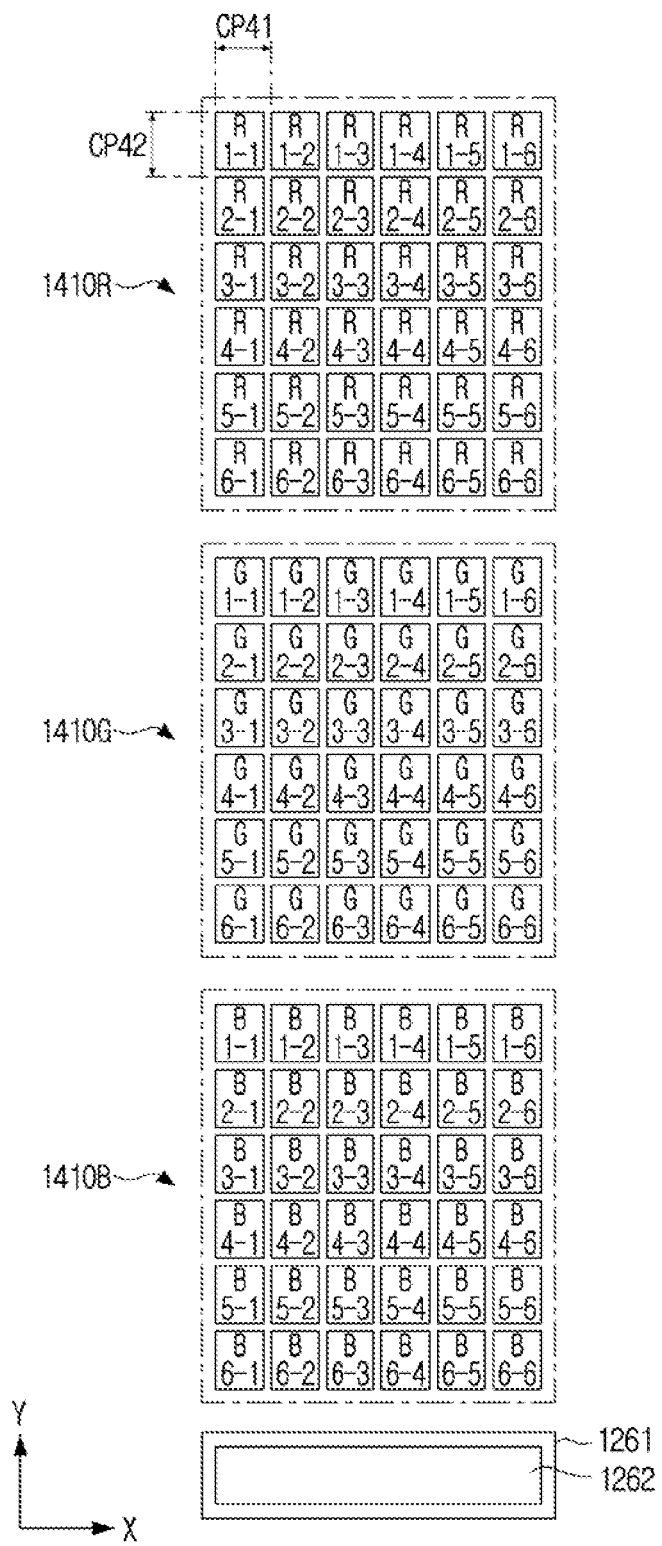
FIGS. 16A to 16C are diagrams illustrating consecutively a process of transferring LEDs of respective colors of first relay substrates to a target substrate through stretch arraying in a row direction after stretch arraying in a column direction.
Figure 16B:
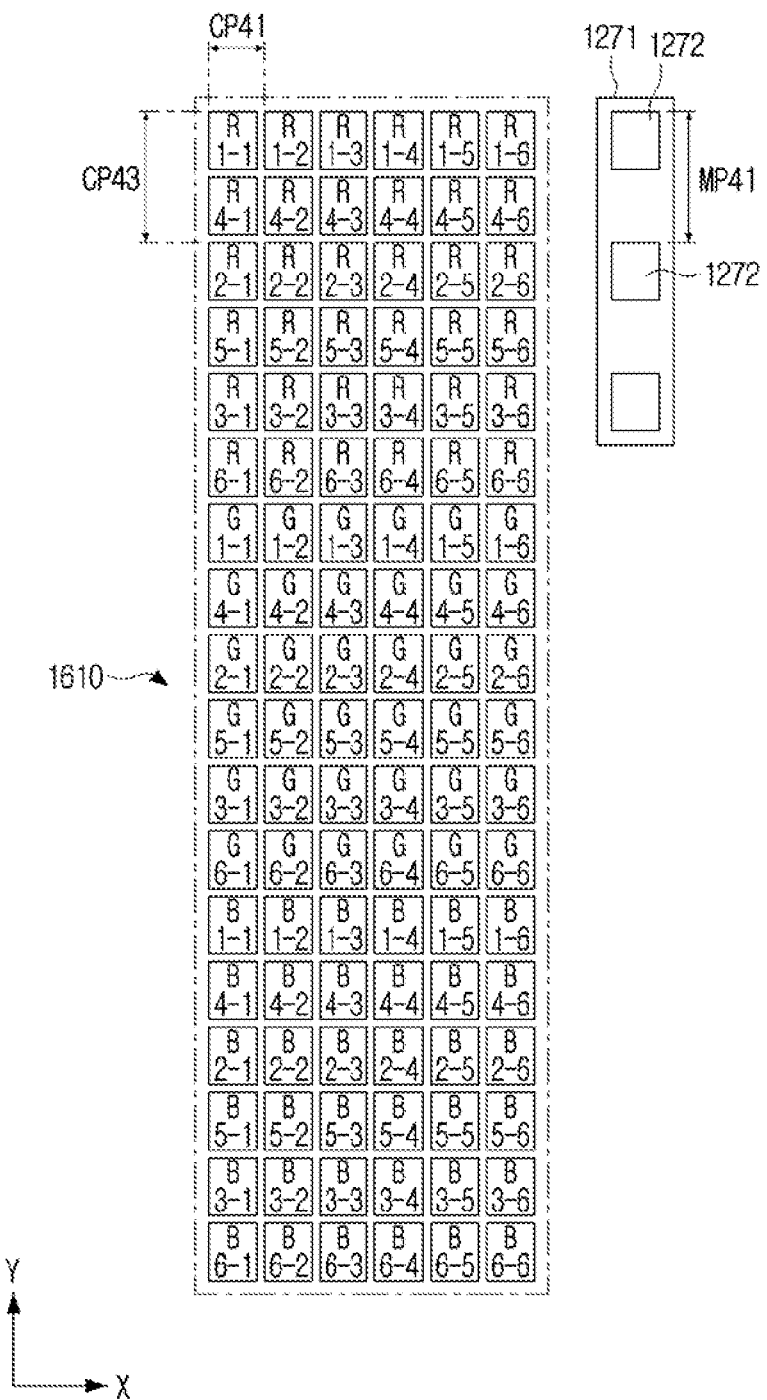
Figure 16C:
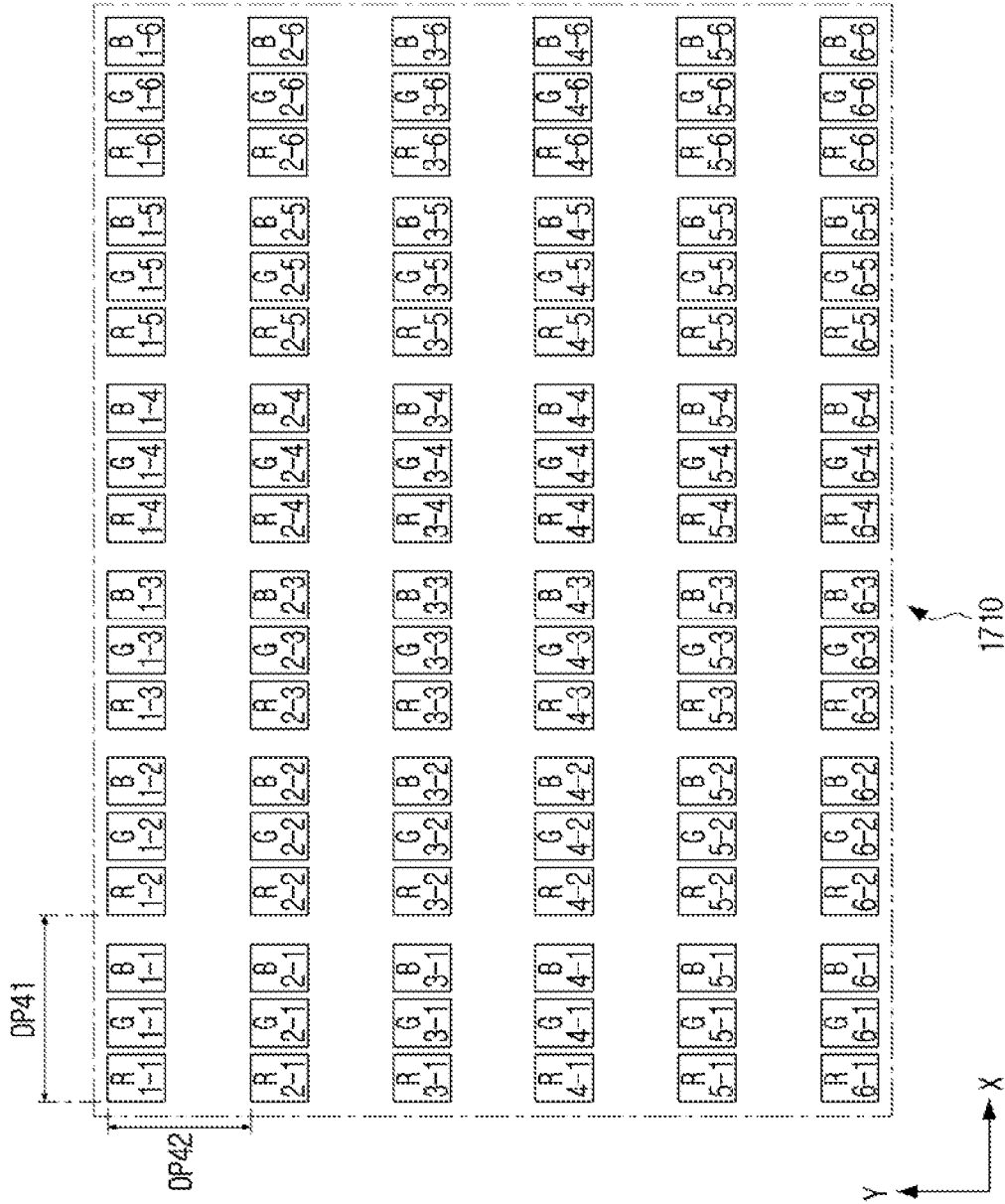

FIGS. 16A to 16C are diagrams illustrating consecutively a process of transferring LEDs of respective colors of first relay substrates to a target substrate through stretch arraying in the row direction after stretch arraying in the column direction.

A transfer process of FIGS. 16A to 16C may include transferring LEDs of respective colors to the target substrate by using multiple first relay substrates and one second relay substrate like the transfer process according to FIGS. 15A to 15F. However, the transfer process of FIGS. 16A to 16C includes stretch arraying in the column direction the LEDs of the first relay substrates to the second relay substrate, and stretch arraying in the row direction the LEDs of the second relay substrate to the target substrate.

Although the LEDs of respective colors arrayed on a first red relay substrate 1410R, a first green relay substrate 1410G, and a first blue relay substrate 1410B (hereinafter, referred to as 'first relay substrates') in FIGS. 16A to 16C are a rectangular type disposed such that the long side is parallel to the Y-axis direction as in FIG. 14, the LEDs of respective colors have been represented as roughly a square type for convenience of description. In addition, for convenience of description, only parts (6×6) of the LEDs of respective colors arrayed on the first relay substrates 1410R, 1410G, and 1410B will be shown and described. In addition, the mask used when laser transferring may also be reduced in its size or length and shown taking into consideration the number of LEDs of respective colors.

Referring to FIG. 16A, the first red relay substrate 1410R, the first green relay substrate 1410G, and the first blue relay substrate 1410B may have the same array as with the first relay substrates 1400R, 1400G, and 1400B of FIG. 15A described above, respectively. In addition, a first chip pitch CP41 which is in the row direction and a second chip pitch CP42 which is in the column direction between the respective LEDs arrayed on the first relay substrates 1410R, 1410G, and 1410B, the first green relay substrate 1410G, and the first blue relay substrate 1410B may be the same as with the first chip pitch CP31 and the second chip pitch CP32 between the respective LEDs of the above-described first relay substrates 1400R, 1400G, and 1400B.

In this case, a first mask 1261 may be formed with a slit 1262 having a length corresponding to a row of the LEDs so as to transport the LEDs of the first relay substrates 1410R, 1410G, and 1410B to the second relay substrate 1600 (referring to FIG. 16A) by one row each.

Referring to FIG. 16B, the LEDs of respective colors from the first relay substrates 1410R, 1410G, and 1410B may be transported to one piece of the second relay substrate 1600 through the laser transfer method in the column direction stretch array (primary stretch array).

For example, the red LEDs R 1-1 to R 1-6 of a first row of the first red relay substrate 1410R may be transported to a first row of a second relay substrate 1610.

The red LEDs R 2-1 to R 2-6 of a second row of the first red relay substrate 1410R may be transported to the lower side of the red LEDs R 1-1 to R 1-6 of a first row of the second relay substrate 1610 to be spaced apart at a third chip pitch CP43. Here, the third chip pitch CP43 may correspond to a second display pitch DP42 (referring to FIG. 16C) of the second relay substrate 1610.

The red LEDs R 3-1 to R 3-6 of a third row of the first red relay substrate 1410R may be transported to the lower side of the red LEDs R 2-1 to R 2-6 of a third row of the second relay substrate 1610 to be spaced apart at the third chip pitch CP43.

The red LEDs R 4-1 to R 4-6 of a fourth row of the first red relay substrate 1410R may be transported to the lower side of the red LEDs R 1-1 to R 1-6 of a first row of the second relay substrate 1610 to be spaced apart at the second chip pitch CP42.

The red LEDs R 5-1 to R 5-6 of a fifth row of the first red relay substrate 1410R may be transported to the lower side of the red LEDs R 3-1 to R 3-6 of a third row of the second relay substrate 1610 to be spaced apart at the second chip pitch CP42.

The red LEDs R 6-1 to R 6-6 of a sixth row of the first red relay substrate 1410R may be transported to the lower side of the red LEDs R 3-1 to R 3-6 of a fifth row of the second relay substrate 1610 to be spaced apart at the second chip pitch CP42.

Through the same method as described above, the multiple green LEDs of the first green relay substrate 1410G and the multiple blue LEDs of the first blue relay substrate 1410B may be transported to the second relay substrate 1610.

In this case, a second mask 1271 used when transferring the LEDs of the second relay substrate 1610 to a target substrate 1710 may have three slits 1272. Each slit 1272 may be respectively formed to a size corresponding to a single LED, and a pitch MP41 between the slits 1272 adjacent to one another may correspond to the second display pitch DP42.

Referring to FIG. 16C, the LEDs of respective colors arrayed on the second relay substrate 1610 may be stretch arrayed by a certain pitch (e.g., chip pitch corresponding to the first display pitch DP41) in the row direction with three each per one column through the second mask 1271.

For example, the three red LEDs R 1-1, R 2-1, and R 3-1 of a first column of the second relay substrate 1610 may be transported to a first column of a target substrate 1710. In this case, the respective red LEDs R 1-1, R 2-1, and R 3-1 may be disposed so as to be spaced apart at the second display pitch DP42.

The three red LEDs R 1-2, R 2-2, and R 3-2 of a second column of the second relay substrate 1610 may be transported to the right side of the red LEDs R 1-1, R 2-1, and R 3-1 of a first column of the target substrate 1710 so as to be spaced apart at the first display pitch DP41.

Likewise, the red LEDs R 1-3, R 2-3, and R 3-3 to R 1-6, R 2-6, and R 3-6 of a third column to sixth column of the second relay substrate 1610 may be transported to the target substrate consecutively to be spaced apart at the first display pitch DP41 in the column direction.

Then, the remaining three red LEDs R 4-1, R 5-1, and R 6-1 of the first column of the second relay substrate 1610 may be transported to the first column of the target substrate 1710. In this case, the red LED R 4-1 of the target substrate 1710 may be disposed at the lower side of the previously transported red LED R 3-1 of the target substrate 1710 by the second display pitch DP42.

Likewise, the remaining red LEDs R 4-2, R 5-2, and R 6-2 to R 4-6, R 5-6, and R 6-6 of the second relay substrate may be transported consecutively in the column direction at the second display pitch DP42.

In the same method described above, the multiple green LEDs and the multiple blue LEDs of the second relay substrate 1610 may be transported to the target substrate 1710. As described above, the red, green, and blue LEDs of the second relay substrate 1610 may be arrayed in pixel units when transported to the target substrate 1710.

Figure 17:
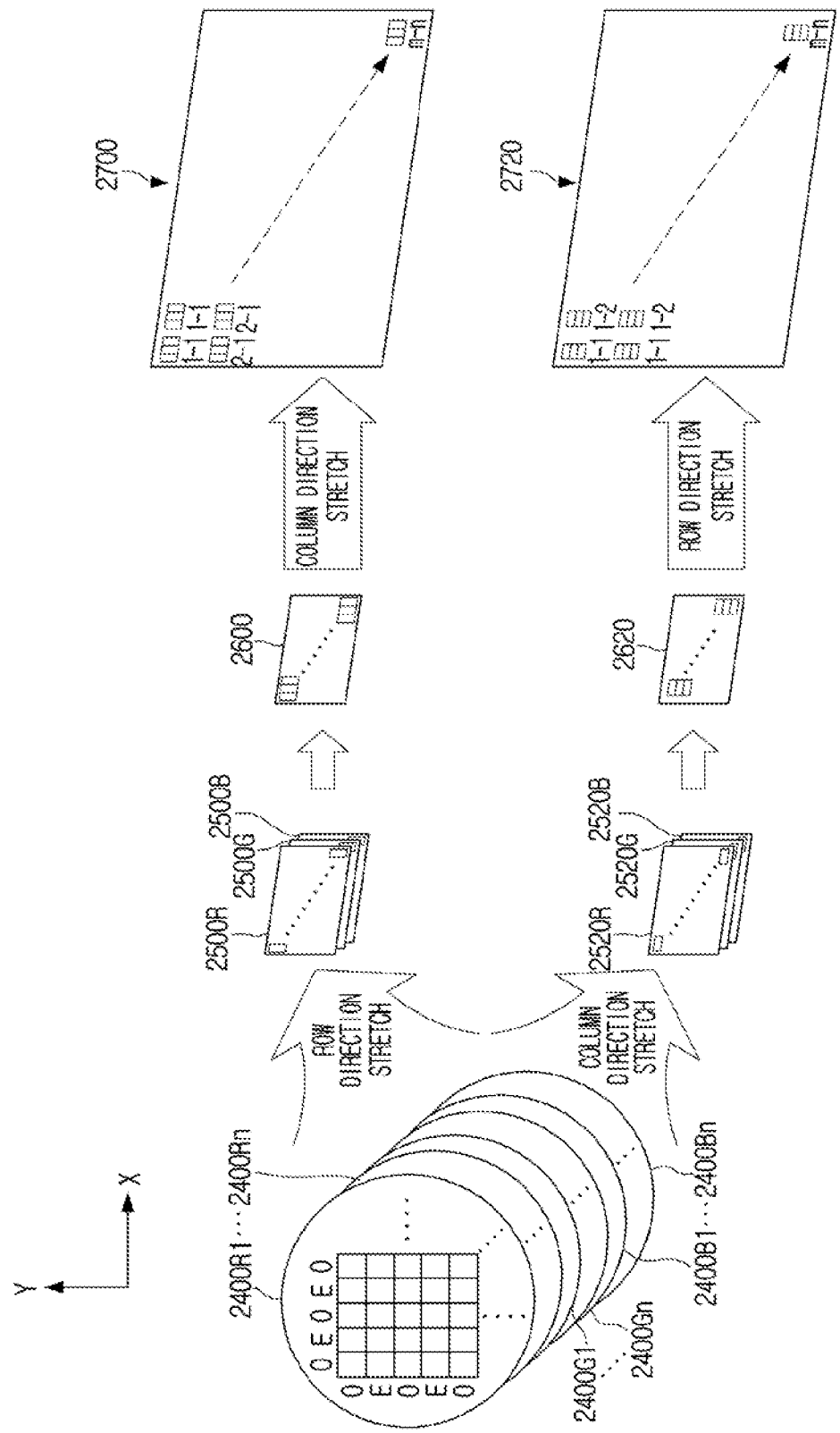
FIG. 17 is a diagram illustrating an example of having prepared first relay substrates of respective colors in multiples respectively as a process diagram illustrating schematically a method for manufacturing a display module according to an embodiment.

FIG. 17 is a process diagram illustrating schematically a method for manufacturing a display module according to another embodiment, and FIGS. 18A to 18D are diagrams illustrating consecutively a process of transferring the multi-colored LEDs shown in FIG. 17 to the target substrate through stretch arraying in the column direction after stretch arraying in the row direction.

Referring to FIG. 17, second red relay substrates 2400R1 to 2400Rn, second green relay substrates 2400G1 to 2400Gn, and second blue relay substrates 2400B1 to 2400Bn (hereinafter, referred to as 'second relay substrates') on which multiple LEDs are respectively formed in a grating array are provided in multiples per color. In FIG. 17, the alphabet 'O' shown in the second red relay substrate 2400R1 may mean odd and the alphabet 'E' may mean even.

Figure 18A:
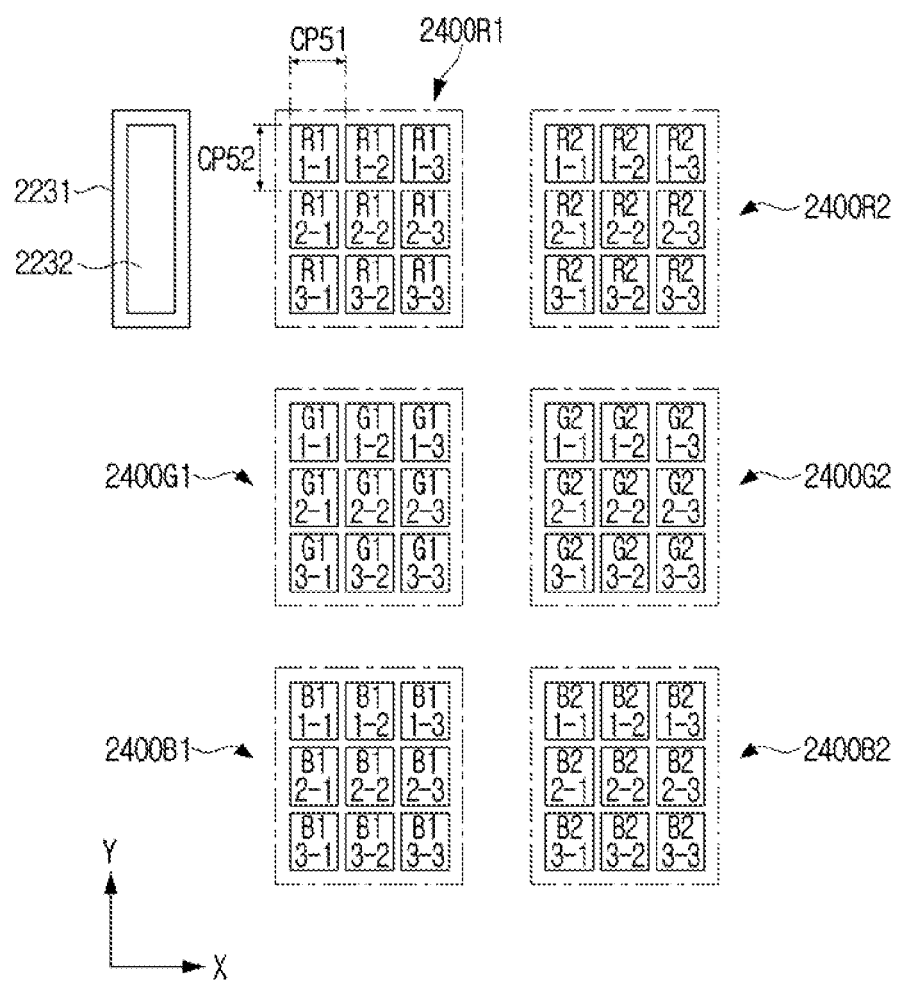
FIGS. 18A to 18D are diagrams illustrating consecutively a process of transferring LEDs of respective colors of first relay substrates shown in FIG. 17 to a target substrate through stretch arraying in a column direction after stretch arraying in a row direction.

For convenience of description, the second red relay substrates 2400R1 to 2400Rn, the second green relay substrates 2400G1 to 2400Gn, and the second blue relay substrates 2400B1 to 2400Bn may respectively use two each per color (2400R1, 2400R2, 2400G1, 2400G2, 2400B1, and 2400B2) as in FIG. 18A, and only parts (3×3) of the LEDs of respective colors will be shown and described. Although the LEDs of respective colors arrayed on a third red relay substrate 2500R, a third green relay substrate 2500G, and a third blue relay substrate 2500B (hereinafter, referred to as 'third relay substrates') are a rectangular type disposed such that the long side is parallel to the column direction (Y-axis direction) as in FIG. 17, the LEDs of respective colors have been represented as roughly a square type in FIGS. 18A to 18D for convenience of description. In addition, the mask used when laser transferring has also been shown reduced in its size or length taking into consideration the number of LEDs of respective colors.

The red epi substrates may be manufactured through the photolithography process and the isolation process so as to maintain gaps (row direction gaps and column direction gaps) between the red LEDs to a processable minimum gap, respectively. The green epi substrates and the blue epi substrates may also be manufactured through the same process as the red epi substrates (referring to the process shown in FIG. 12A).

The first red relay substrates may be configured such that multiple red LEDs are transported from the red epi substrates by the laser transfer method. The first green relay substrates and the first blue relay substrates may also be configured such that the multiple green LEDs and the multiple blue LEDs are respectively transported through the same process as the first red relay substrates (referring to the process shown in FIG. 12B).

Referring to FIG. 18A, the second red relay substrates 2400R1 and 2400R2 may be arrayed with the multiple red LEDs transported from the first red relay substrates by the laser transfer method, respectively.

The multiple red LEDs arrayed on the second red relay substrates 2400R1 and 2400R2 may have the same chip pitch (hereinafter, referred to as 'first chip pitch') CP51 in the row direction, and may have the same chip pitch (hereinafter, referred to as 'second chip pitch') CP52 in also the column direction. The first and second chip pitches CP51 and CP52 may be the same as the row direction pitch and the column direction pitch between the red LEDs arrayed on the red epi substrate.

The multiple green LEDs arrayed on the second green relay substrates 2400G1 and 2400G2 and the multiple blue LEDs arrayed on the second blue relay substrates 2400B1 and 2400B2 may have a first chip pitch CP51 in the row direction and a second chip pitch CP52 in the column direction.

Figure 18B:
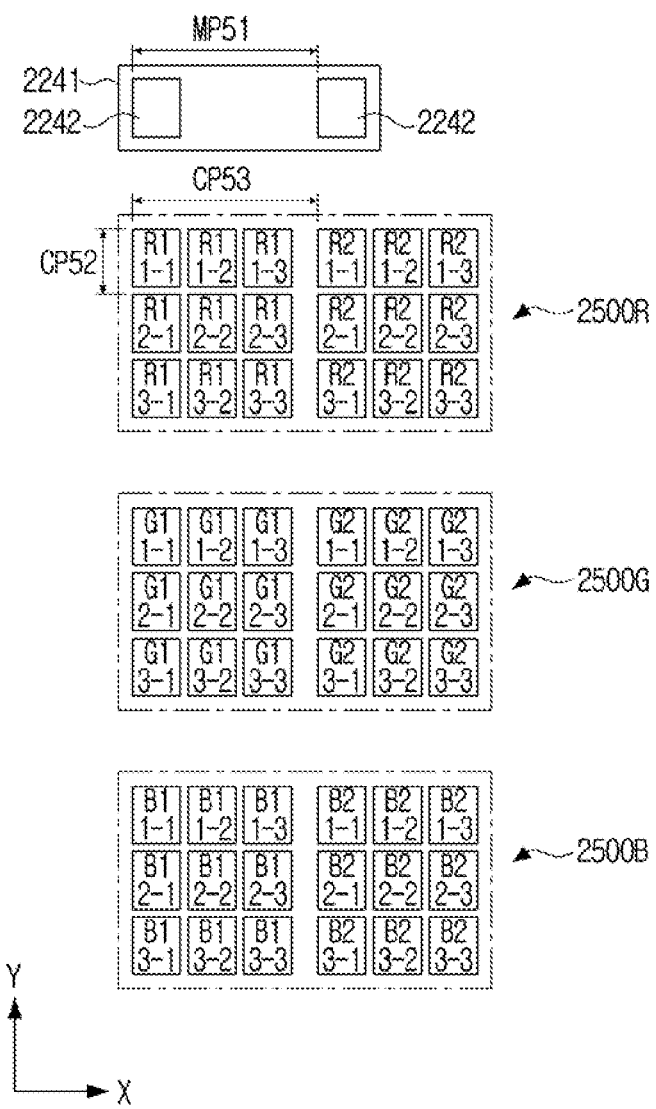

Referring to FIGS. 17 and 18B, the red LEDs of the second red relay substrates 2400R1 and 2400R2 may be transported to one piece of the third red relay substrate 2500R by the laser transfer method in the row direction stretch array (primary stretch array).

For example, the multiple red LEDs of the second red relay substrates 2400R1 and 2400R2 may be transported to the third red relay substrate 2500R by one column each by the laser beam irradiated to the second red relay substrate 2400R1 through a slit 2232 of a first mask 2231 (referring to FIG. 18A). The slit 2232 of the first mask 2231 may have a length and width corresponding to one column of the multiple red LEDs of the second red relay substrates 2400R1 and 2400R2.

After the red LEDs R1 1-1 to R1 3-1 of a first column of the second red relay substrate 2400R1 are transported to the third red relay substrate 2500R, the red LEDs R1 1-2 to R1 3-2 of a second column of the second red relay substrate 2400R1 may be transported to the third red relay substrate 2500R to be spaced apart at a first chip pitch CP51 to the right side of the red LEDs R1 1-1 to R1 3-1 of a first column of the third red relay substrate 2500R.

The red LEDs R1 1-3 to R1 3-3 of a third column of the second red relay substrate 2400R1 may be transported to the third red relay substrate 2500R to be spaced apart at the first chip pitch CP51 to the right side of the red LEDs R1 1-2 to R1 3-2 of a second column of the third red relay substrate 2500R.

Based on all red LEDs R1 1-1 to R1 3-3 of the second red relay substrate 2400R1 being transported to the third red relay substrate 2500R, the red LEDs R2 1-1 to R2 3-1 of a first column of the next second red relay substrate 2400R2 may be transported to the third red relay substrate 2500R to be spaced apart at a third chip pitch CP53 to the right side of the red LEDs R1 1-1 to R1 3-1 of the first column of the third red relay substrate 2500R.

The red LEDs R2 1-2 to R2 3-2 of a second column of the second red relay substrate 2400R2 may be transported to the third red relay substrate 2500R to be spaced apart at the first chip pitch CP51 to the right side of the red LEDs R2 1-1 to R2 3-1 of a fourth column of the third red relay substrate 2500R.

The red LEDs R2 1-3 to R2 3-3 of a third column of the second red relay substrate 2400R2 may be transported to the third red relay substrate 2500R to be spaced apart at the first chip pitch CP51 to the right side of the red LEDs R2 1-2 to R2 3-2 of a fifth column of the third red relay substrate 2500R.

As described above, the multiple green LEDs of the second green relay substrates 2400G1 and 2400G2 and the multiple blue LEDs of the second blue relay substrates 2400B1 and 2400B2 may be respectively transported to one piece of the third green relay substrate 2500G and one piece of the third blue relay substrate 2500B through the same process as the process of transporting the multiple red LEDs of the second red relay substrates 2400R1 and 2400R2 to the third red relay substrate 2500R.

Accordingly, the LEDs of respective colors of the second relay substrates 2400R1, 2400R2, 2400G1, 2400G2, 2400B1, and 2400B2 may be transported to the third relay substrates 2500R, 2500G, and 2500B respectively in the row direction stretch array (primary stretch array).

Figure 18C:
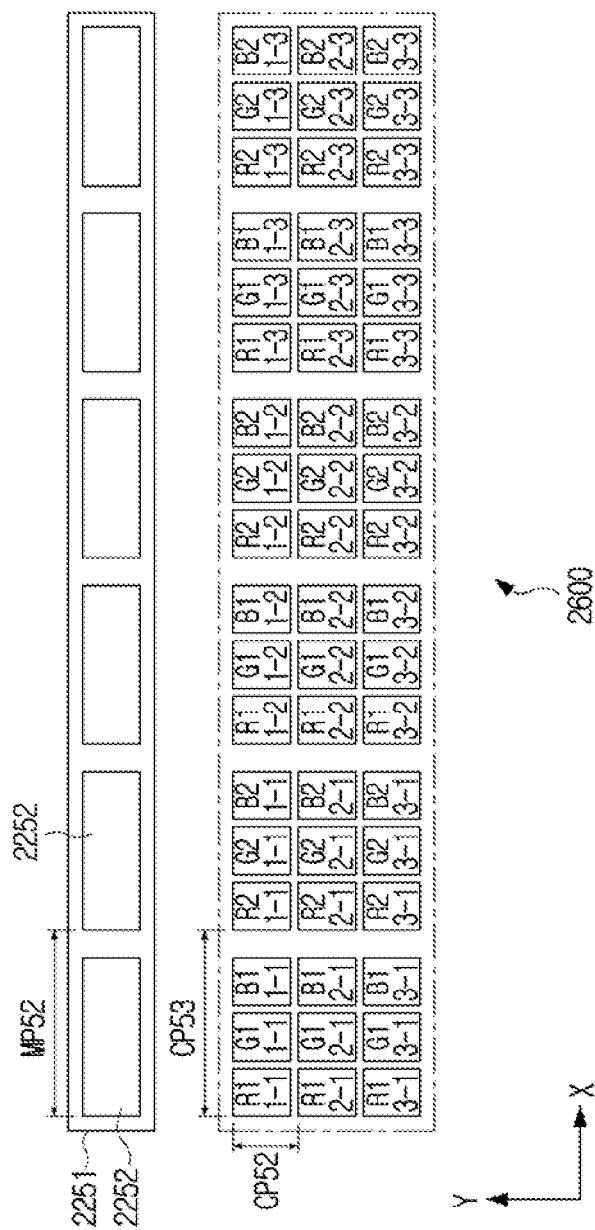

Referring to FIGS. 17 and 18C, the red, green, and blue LEDs of the third relay substrates 2500R, 2500G, and 2500B may be transported to one piece of a fourth relay substrate 2600 by the laser transfer method.

For example, the multiple red LEDs of the third red relay substrate 2500R may be transported to the fourth relay substrate 2600 by two each by the laser beam irradiated to the third red relay substrate 2500R through a slit 2242 of a second mask 2241 (referring to FIG. 18B).

A pair of slits 2242 of the second mask 2241 may be respectively formed to a size corresponding to a single LED, and a pitch MP51 between the slits 2242 may correspond to the third chip pitch CP53.

The first and second red LEDs R1 1-1 and R2 1-1 of a first row of the third red relay substrate 2500R may be transported to the fourth relay substrate 2600 to be spaced apart at the third chip pitch CP53 by the laser transfer method.

Then, the third and fourth red LEDs R1 1-2 and R2 1-2 of the first row of the third red relay substrate 2500R may be transported to a first row of the fourth relay substrate 2600. In this case, the third red LED R1 1-2 may be disposed to the fourth relay substrate 2600 to be spaced apart at the third chip pitch CP53 to the right side of the second red LED R2 1-1 of the fourth relay substrate 2600. The fourth red LED R2 1-2 may be disposed to the fourth relay substrate 2600 in a state spaced apart at the third chip pitch CP53 to the right side of the third red LED R1 1-2 of the fourth relay substrate 2600.

Then, the fifth and sixth red LEDs R1 1-3 and R2 1-3 of the first row of the third red relay substrate 2500R may be transported to the first row of the fourth relay substrate 2600. In this case, the fifth red LED R1 1-3 may be disposed to the fourth relay substrate 2600 to be spaced apart at the third chip pitch CP53 to the right side of the third red LED R2 1-2 of the fourth relay substrate 2600. The sixth red LED R2 1-3 may be disposed to the fourth relay substrate 2600 to be spaced apart at the third chip pitch CP53 to the right side of the fifth red LED R1 1-3 of the fourth relay substrate 2600.

After transporting the red LEDs R1 1-1 to R1 1-3 and R2 1-1 to R2 1-3 of the first row of the third red relay substrate 2500R to the fourth relay substrate 2600, the remaining red LEDs R1 2-1 to R1 3-3 and R2 2-1 to R2 3-3 of a third red relay substrate 2500R may be transported to the fourth relay substrate 2600 consecutively by row in the same method as above. In this case, the remaining red LEDs R1 2-1 to R1 3-3 and R2 2-1 to R2 3-3 transported to the fourth relay substrate 2600 may be disposed to be spaced apart at the second chip pitch CP52 between the columns.

In the same process as described above, based on respectively transporting the multiple green LEDs of the third green relay substrate 2500G and the multiple blue LEDs of the third blue relay substrate 2500B to the fourth relay substrate 2600, the fourth relay substrate 2600 may be arrayed with the red, green, and blue LEDs may be arrayed to form a unit pixel, respectively, as in FIG. 17C.

Figure 18D:
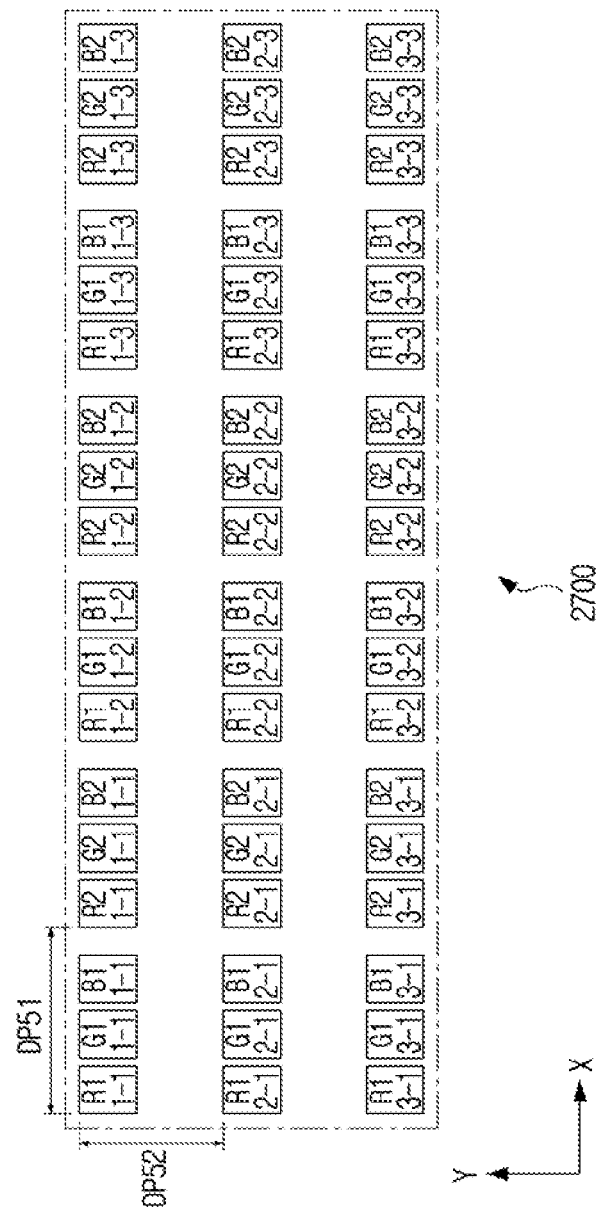

Referring to FIGS. 17 and 18D, the multi-colored LEDs arrayed on the fourth relay substrate 2600 may be transported to a target substrate 2700 by the laser transfer method in the column direction stretch array (secondary stretch array).

For example, the multi-colored LEDs of the fourth relay substrate 2600 may be transported to the target substrate 2700 by one row each by the laser beam irradiated to the fourth relay substrate 2600 through multiple slits 2252 of a third mask 2251 (referring to FIG. 18C). A pitch MP52 of the multiple slits 2252 of the third mask 2251 may be spaced apart to correspond to the third chip pitch CP53 in the row direction, and each slit 2252 may have a length and width corresponding to three LEDs of red, green, and blue corresponding to a unit pixel.

The multi-colored LEDs of the first row of the fourth relay substrate 2600 may be transported concurrently or close to concurrently to the target substrate 2700 to be spaced apart at a first display pitch DP51 by the laser transfer method.

Then, the multi-colored LEDs of a second row of the fourth relay substrate 2600 may be transported to the target substrate 2700 to be spaced apart by a second display pitch DP52 in the column direction from the multi-colored LEDs of a first row of the target substrate 2700.

In the same process as described above, the multi-colored LEDs of the remaining second and third rows of the fourth relay substrate 2600 may be transported to the target substrate 2700 at the second display pitch DP52, respectively.

As described above, in the disclosure, the multi-colored LEDs may be ultimately transferred to the target substrate 2700 consecutively passing the column direction stretch array and the row direction stretch array from the first relay substrates.

FIGS. 19A to 19D are diagrams illustrating consecutively a process of transferring LEDs of respective colors of first relay substrates to a target substrate through stretch arraying in the column direction after stretch arraying in the row direction.

The red epi substrates may be manufactured through the photolithography process and the isolation process so as to maintain gaps (row direction gaps and column direction gaps) between the red LEDs to a processable minimum gap, respectively. The green epi substrates and the blue epi substrates may also be manufactured through the same process as the red epi substrates (referring to the process shown in FIG. 12A).

The first red relay substrates may be configured such that multiple red LEDs are transported from the red epi substrates by the laser transfer method. The first green relay substrates and the first blue relay substrates may also be configured such that the multiple green LEDs and the multiple blue LEDs are respectively transported through the same process as the first red relay substrates (referring to the process shown in FIG. 12B).

Figure 19A:
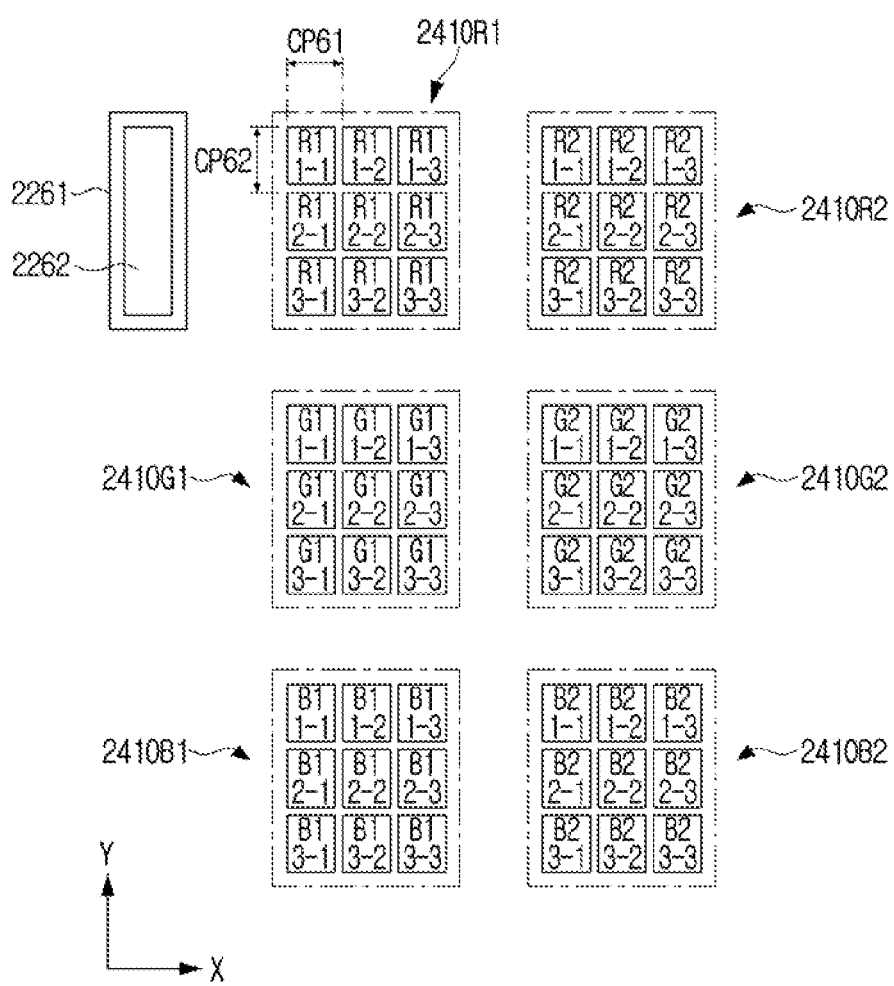
FIGS. 19A to 19D are diagrams illustrating consecutively a process of transferring LEDs of respective colors of first relay substrates to a target substrate through stretch arraying in a column direction after stretch arraying in a row direction.

Referring to FIG. 19A, the second red relay substrates 2410R1 and 2410R2 may be respectively arrayed with multiple red LEDs transported by the laser transfer method from the respective first red relay substrates on which multiple red LEDs are formed.

The multiple red LEDs arrayed on the second red relay substrates 2410R1 and 2410R2 may have the same chip pitch (hereinafter, referred to as 'first chip pitch') CP61 in the row direction, and have the same chip pitch (hereinafter, referred to as 'second chip pitch') CP62 in also the column direction. The first and second chip pitches CP61 and CP62 may be the same as the row direction pitch and the column direction pitch between the red LEDs arrayed on the red epi substrate.

The second green relay substrates 2410G1 and 2410G2 and the second blue relay substrates 2410B1 and 2410B2 may also be arrayed with multiple green LEDs and multiple blue LEDs respectively from the first green relay substrates and the first blue relay substrates in the same process as the second red relay substrates 2410R1 and 2410R2. In this case, the multiple green LEDs arrayed on the second green relay substrates 2410G1 and 2410G2 and the multiple blue LEDs arrayed on the second blue relay substrates 2410B1 and 2410B2 may have a first chip pitch CP61 in the row direction and a second chip pitch CP62 in the column direction.

Figure 19B:
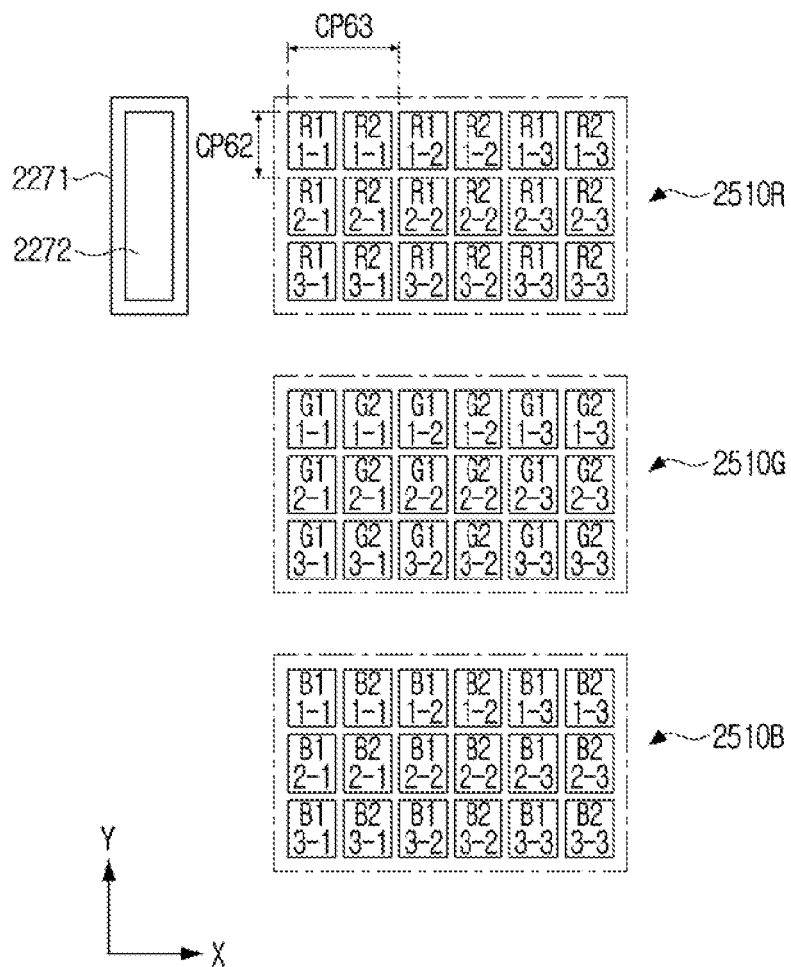

Referring to FIG. 19B, the red LEDs of the second red relay substrates 2410R1 and 2410R2 may be transported to one piece of a third red relay substrate 2510R by the laser transfer method in the row direction stretch array (primary stretch array).

For example, the multiple red LEDs of the second red relay substrates 2410R1 and 2410R2 may be transported to the third red relay substrate 2510R by one column each by the laser beam irradiated consecutively to the second red relay substrates 2410R1 and 2410R2 through a slit 2262 of a first mask 2261 (referring to FIG. 19A). The slit 2262 of the first mask 2261 may have a length and width corresponding to one column of the multiple red LEDs of the second red relay substrates 2410R1 and 2410R2.

After the red LEDs R1 1-1 to R1 3-1 of a first column of a second red relay substrate 2410R1 are transported to a first column of the third red relay substrate 2510R, the red LEDs R1 1-2 to R1 3-2 of a second column of the second red relay substrate 2410R1 may be transported to the third red relay substrate 2510R to be spaced apart at a third chip pitch CP63 to the right side of the red LEDs R1 1-1 to R1 3-1 of the first column of the third red relay substrate 2510R.

In this case, the third chip pitch CP63 may be greater than the first chip pitch CP61. For example, the third chip pitch CP63 may be two folds of the first chip pitch CP61. Accordingly, the red LEDs R1 1-2 to R1 3-2 transported to the third red relay substrate 2510R may be disposed at a third column of the third red relay substrate 2510R.

Then, the red LEDs R1 1-3 to R1 3-3 of a third column of the second red relay substrate 2410R1 may be transported to the third red relay substrate 2510R to be spaced apart at the third chip pitch CP63 to the right side of the red LEDs R1 1-2 to R1 3-2 of the third column of the third red relay substrate 2510R.

In the same method described above, the multiple LEDs of the other second red relay substrate 2410R2 may be transported to the third red relay substrate 2510R.

For example, the red LEDs R2 1-1 to R2 3-1 of a first column of the other second red relay substrate 2410R2 may be transported to the third red relay substrate 2510R to be spaced apart at the first chip pitch CP61 to the right side of the red LEDs R1 1-1 to R1 3-1 of the first column of the third red relay substrate 2510R. In this case, the red LEDs R2 1-1 to R2 3-1 transported to the third red relay substrate 2510R may be disposed at a second column of the third red relay substrate 2510R.

Then, the red LEDs R2 1-2 to R2 3-2 of a second column of the other second red relay substrate 2410R2 may be transported to the third red relay substrate 2510R to be spaced apart at the first chip pitch CP61 to the right side of the red LEDs R1 1-2 to R1 3-2 of the third column of the third red relay substrate 2510R. In this case, the red LEDs R2 1-2 to R2 3-2 disposed at a fourth column of the third red relay substrate 2510R may be disposed to be spaced apart at the third chip pitch CP63 with the red LEDs R2 1-2 to R2 3-2 of the previously transported second column.

Then, the red LEDs R2 1-3 to R2 3-3 of a third column of the other second red relay substrate 2410R2 may be transported to the third red relay substrate 2510R to be spaced apart at the first chip pitch CP61 to the right side of the red LEDs R1 1-3 to R1 3-3 of a fifth column of the third red relay substrate 2510R.

Through the same process as the process of transporting multiple red LEDs of the second red relay substrates 2410R1 and 2410R2 to one piece of the third red relay substrate 2510R as described above, the multiple green LEDs of the second green relay substrates 2410G1 and 2410G2 and the multiple blue LEDs of the second blue relay substrates 2410B1 and 2410B2 may be transported to one piece of a third green relay substrate 2510G and one piece of a third blue relay substrate 2510B, respectively.

Accordingly, the LEDs of respective colors of the second relay substrates 2410R1, 2410R2, 2410G1, 2410G2, 2410B1, and 2410B2 may be transported to the respectively corresponding third relay substrates 2510R, 2510G, and 2510B in the row direction stretch array (primary stretch array).

Figure 19C:
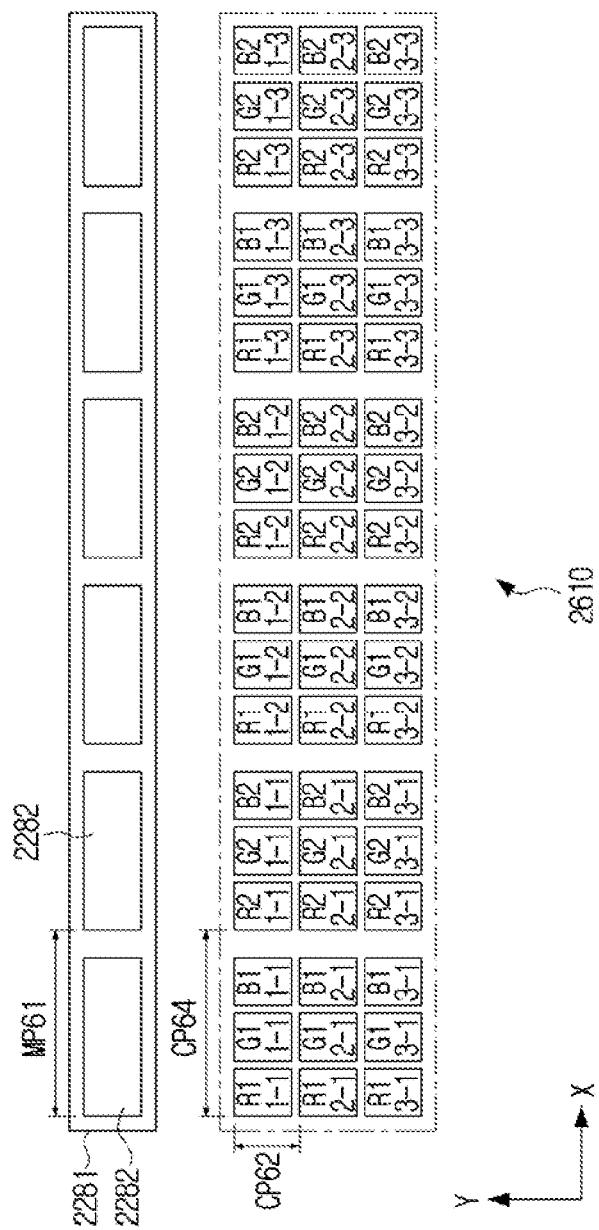

Referring to FIG. 19C, the red, green, and blue LEDs of the third relay substrates 2510R, 2510G, and 2510B may be transported to one piece of the fourth relay substrate 2610 by the laser transfer method in a certain array.

For example, the multiple red LEDs of the third red relay substrate 2510R may be transported to a fourth relay substrate 2610 by one column each by the laser beam irradiated to the third red relay substrate 2510R through a slit 2272 of a second mask 2271 (referring to FIG. 19B). In this case, the second mask 2271 may be formed with the slit 2272 having a length and width corresponding to an LED column for the LEDs of the third red relay substrate 2510R to be transported to the fourth relay substrate 2610 by one column each.

Then, the red LEDs R1 1-1 to R1 3-1 of the first column of the third red relay substrate 2510R may be transported to the fourth relay substrate 2610 to be spaced apart at a fourth chip pitch CP64.

Then, the red LEDs R2 1-1, R2 3-1 of the second column of the third red relay substrate 2510R may be disposed to the fourth relay substrate 2610 to be spaced apart at the fourth chip pitch CP64 to the right side of the red LEDs R1 1-1 to R1 3-1 of a first row of the fourth relay substrate 2610.

In the same method described above, the remaining red LEDs R1 1-2 to R2 3-3 of the third red relay substrate 2510R may be transported consecutively by one column each to one piece of the fourth relay substrate 2610 along the row direction.

In the same method described above, the multiple green LEDs of the third green relay substrate 2510G and the multiple blue LEDs of the third blue relay substrate 2510B may all be transported to one piece of the fourth relay substrate 2610 consecutively. In this case, the red, green, and blue LEDs may be arrayed on one piece of the fourth relay substrate 2610 in a pixel unit as in FIG. 19C.

In addition, when transporting LEDs from the third relay substrates 2510R, 2510G, and 2510B to the fourth relay substrate 2610 as described above, the LEDs may be stretch arrayed in the row direction as with the stretch array of the LEDs from the second relay substrates 2410R1, 2410R2, 2410G1, 2410G2, 2410B1, and 2410B2 to the third relay substrates 2510R, 2510G, and 2510B.

Figure 19D:
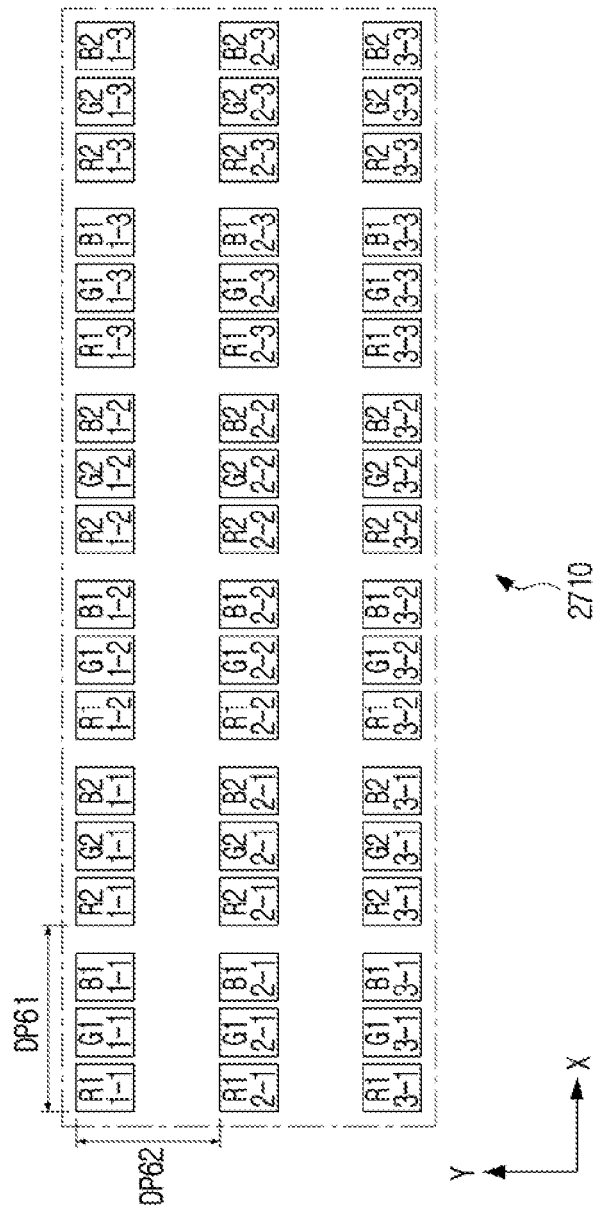

Referring to FIG. 19D, the red, green, and blue LEDs arrayed on the fourth relay substrate 2610 may be transported to a target substrate 2710 by the laser transfer method, and arrayed at a first display pitch DP61 and a second display pitch DP62 in pixel units. The multi-colored LEDs arrayed on the fourth relay substrate 2610 may be transported to the target substrate 2710 by the laser transfer method in the column direction stretch array (secondary stretch array).

For example, the multi-colored LEDs of the fourth relay substrate 2610 may be transported to the target substrate 2710 by one row each by the laser beam irradiated to the fourth relay substrate 2610 through multiple slits 2282 of a third mask 2281 (referring to FIG. 19C). A pitch MP61 of the multiple slits 2282 of the third mask 2281 may be spaced apart to correspond to the fourth chip pitch CP64 in the row direction, and each slit 2282 may have a length and width corresponding to three LEDs of red, green, and blue corresponding to a unit pixel.

The multi-colored LEDs of the first row of the fourth relay substrate 2610 may be transported concurrently or close to concurrently to the target substrate 2710 to be spaced apart by the first display pitch DP61 in pixel units by the laser transfer method.

Then, the multi-colored LEDs of a second row of the fourth relay substrate 2610 may be transported to the target substrate 2710 to be spaced apart by the second display pitch DP62 in the column direction from multi-colored LEDs of a first row of the target substrate 2710.

In the same process as described above, the multi-colored LEDs of the remaining third row of the fourth relay substrate 2610 may be transported to the target substrate 2710 to be spaced apart by the second display pitch DP62 in the column direction from the multi-colored LEDs of a second row of the target substrate 2710.

As described above, in the disclosure, the multi-colored LEDs may be ultimately transferred to the target substrate 2710 consecutively passing the row direction stretch array and the column direction stretch array from the first relay substrates.

FIGS. 20A to 20D are diagrams illustrating consecutively a process of transferring the LEDs of respective colors of the first relay substrates shown in FIG. 17 to the target substrate through stretch arraying in the row direction after stretch arraying in the column direction.

For convenience of description, the second red relay substrates 2400R1 to 2400Rn, the second green relay substrates 2400G1 to 2400Gn, and the second blue relay substrates 2400B1 to 2400Bn (hereinafter, referred to as 'second relay substrates') may respectively use two each 2420R1, 2420R2, 2420 G1, 2420G2, 2420B1, and 2420B2 as in FIG. 20A, and only a part (3×3) of the LEDs of respective colors will be shown and described. Although the LEDs of respective colors arrayed on a third red relay substrate 2520R, a third green relay substrate 2520G, and a third blue relay substrate 2520B (hereinafter, referred to as 'third relay substrates') may be a rectangular type disposed such that the long side is parallel to the row direction (X-axis direction) as in FIG. 17, the LEDs of respective colors have been represented as roughly a square type in FIGS. 20A to 20D for convenience of description. In addition, the mask used when laser transferring has also been shown reduced in its size or length taking into consideration the number of LEDs of respective colors.

The red epi substrates may be manufactured through the photolithography process and the isolation process so as to maintain gaps (row direction gaps and column direction gaps) between the red LEDs to a processable minimum gap, respectively. The green epi substrates and the blue epi substrates may also be manufactured through the same process as the red epi substrates (referring to the process shown in FIG. 12A).

The first red relay substrates may be configured such that multiple red LEDs are transported from the red epi substrates by the laser transfer method. The first green relay substrates and the first blue relay substrates may also be configured such that the multiple green LEDs and the multiple blue LEDs are respectively transported through the same process as the first red relay substrates (referring to the process shown in FIG. 12B).

Figure 20A:
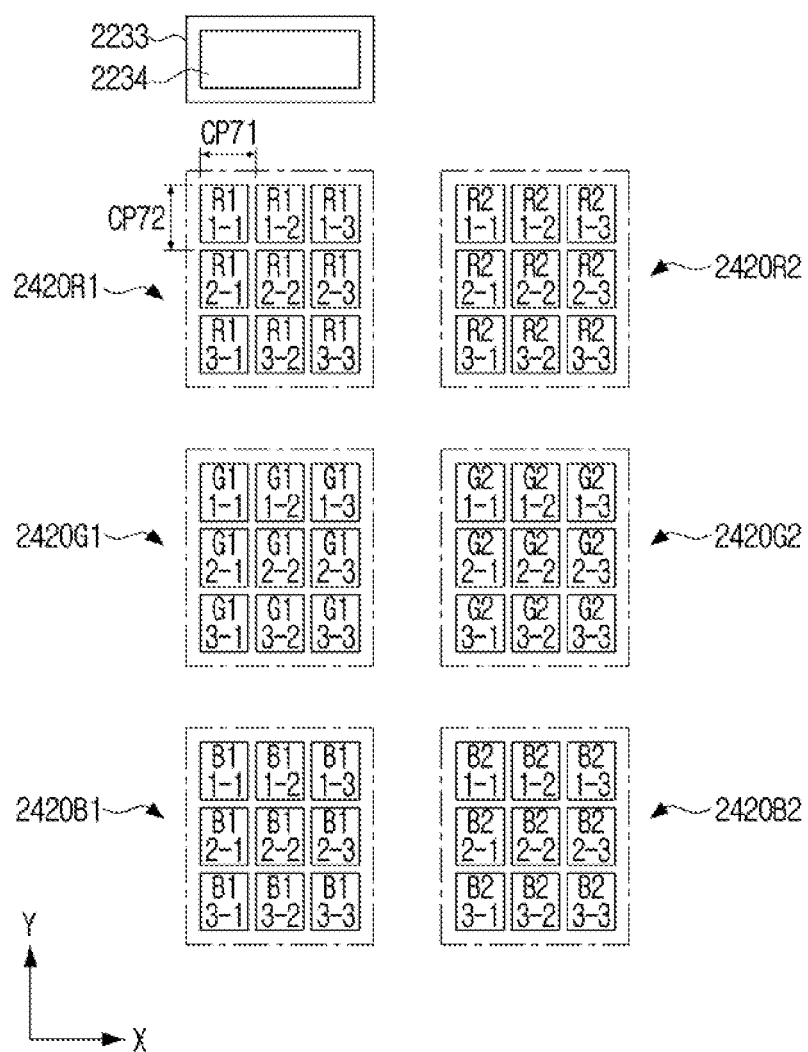
FIGS. 20A to 20D are diagrams illustrating consecutively a process of transferring LEDs of respective colors of first relay substrates shown in FIG. 17 to a target substrate through stretch arraying in a row direction after stretch arraying in a column direction.

Referring to FIG. 20A, the second red relay substrates 2410R1 and 2410R2 may be arrayed with multiple red LEDs transported by the laser transfer method from the respective first red relay substrates, respectively.

The multiple red LEDs arrayed on second red relay substrates 2420R1 and 2420R2 may have a first chip pitch CP71 in the row direction and have a second chip pitch CP72 in the column direction. The first and second chip pitches CP71 and CP72 may be the same as the row direction pitch and the column direction pitch between the red LEDs arrayed on the red epi substrate.

The second green relay substrates 2420G1 and 2420G2 and the second blue relay substrates 2420B1 and 2420B2 may also be arrayed with multiple green LEDs and multiple blue LEDs respectively in the same process as the second red relay substrates 2420R1 and 2420R2. In this case, the multiple green LEDs arrayed on the second green relay substrates 2420G1 and 2420G2 and the multiple blue LEDs arrayed on the second blue relay substrates 2420B1 and 2420B2 may have the first chip pitch CP71 in the row direction and the second chip pitch CP72 in the column direction.

Figure 20B:
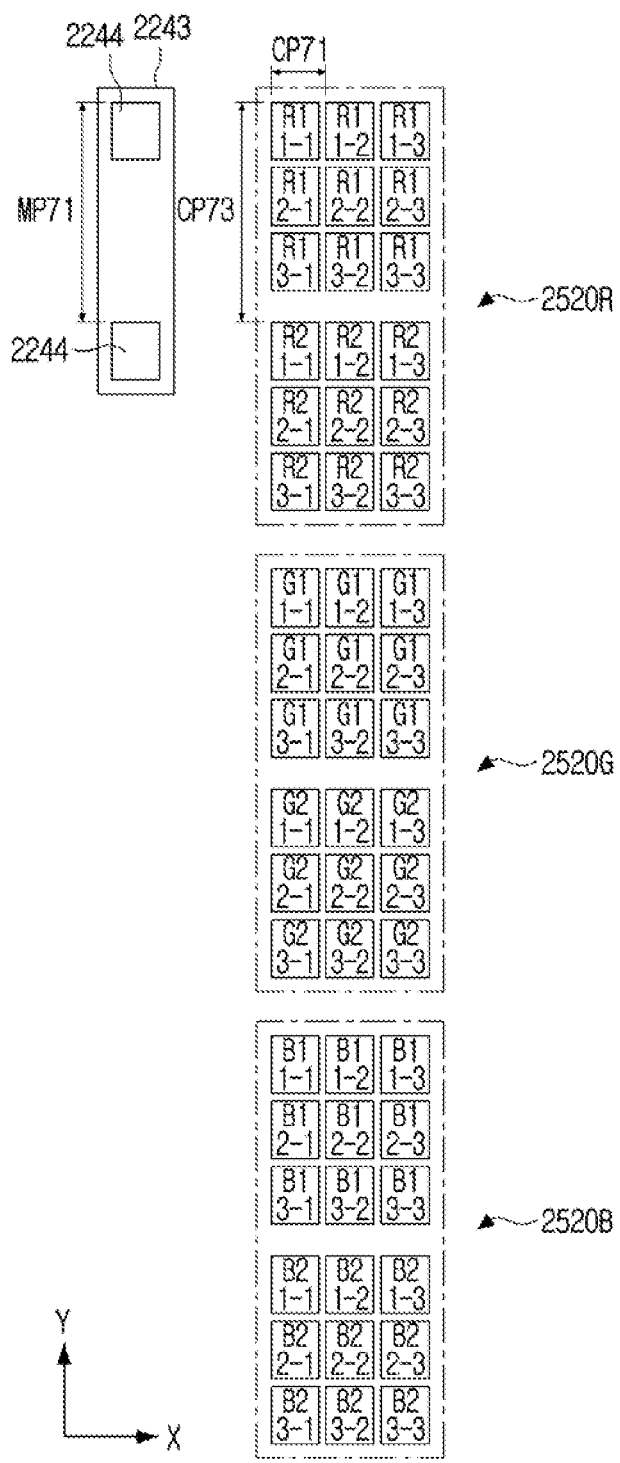

Referring to FIG. 20B, the red LEDs of the second red relay substrates 2420R1 and 2420R2 may be transported to one piece of the third red relay substrate 2520R by the laser transfer method in the column direction stretch array (primary stretch array).

For example, the multiple red LEDs of the second red relay substrates 2420R1 and 2420R2 may be transported to the third red relay substrate 2520R by one row each by the laser beam irradiated to the second red relay substrate 2420R1 through a slit 2234 of a first mask 2233 (referring to FIG. 20A). The slit 2234 of the first mask 2233 may have a length and width corresponding to one row of the multiple red LEDs of the second red relay substrates 2420R1 and 2420R2.

After the red LEDs R1 1-1 to R1 1-3 of a first row of the second red relay substrate 2420R1 are transported to the third red relay substrate 2520R, the red LEDs R1 2-1 to R1 2-3 of a second row of the second red relay substrate 2420R1 may be transported to the third red relay substrate 2520R to be spaced apart at the second chip pitch CP72 to the lower side of the red LEDs R1 1-1 to R1 1-3 of a first row of the third red relay substrate 2520R.

Then, the red LEDs R1 3-1 to R1 3-3 of a third row of the second red relay substrate 2420R1 may be transported to the third red relay substrate 2520R to be spaced apart at the second chip pitch CP72 to the lower side of the red LEDs R1 2-1 to R1 2-3 of a second row of the third red relay substrate 2520R.

Based on all red LEDs R1 1-1 to R1 3-3 of the second red relay substrate 2420R1 being transported to the third red relay substrate 2520R, the red LEDs R2 1-1 to R2 1-3 of a first row of the other second red relay substrate 2420R2 may be transported to the third red relay substrate 2520R to be spaced apart at a third chip pitch CP73 to the lower side of the red LEDs R1 1-1 to R1 1-3 of the first row of the third red relay substrate 2520R.

Then, the red LEDs R2 2-1 to R2 2-3 of a second row of the second red relay substrate 2420R2 may be transported to the third red relay substrate 2520R to be spaced apart at the second chip pitch CP52 to the lower side of the red LEDs R2 1-1 to R2 1-3 of a fourth row of the third red relay substrate 2520R.

Then, the red LEDs R2 3-1 to R2 3-3 of a third row of the second red relay substrate 2420R2 may be transported to the third red relay substrate 2520R to be spaced apart at the second chip pitch CP72 to the lower side of the red LEDs R2 2-1 to R2 2-3 of a fifth column of the third red relay substrate 2520R.

Through the same method as the method of transporting the multiple red LEDs of the second red relay substrates 2420R1 and 2420R2 to the third red relay substrate 2520R as described above, the multiple green LEDs of the second green relay substrates 2420G1 and 2420G2 and the multiple blue LEDs of the second blue relay substrates 2420B1 and 2420B2 may be transported to one piece of the third green relay substrate 2520G and one piece of the third blue relay substrate 2520B, respectively.

Accordingly, the LEDs of respective colors of the second relay substrates 2420R1, 2420R2, 2420G1, 2420G2, 2420B1, and 2420B2 may be transported to the respectively corresponding third relay substrates 2520R, 2520G, and 2520B in the column direction stretch array (primary stretch array).

Figure 20C:
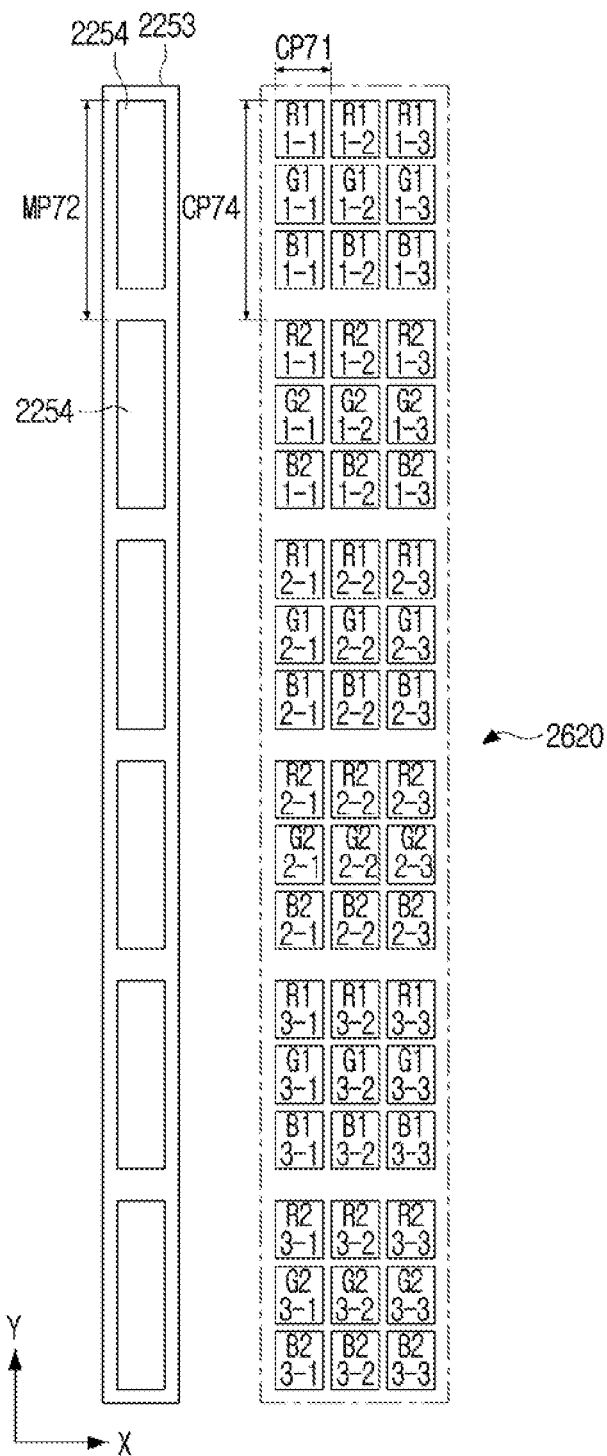

Referring to FIGS. 17 and 20C, the red, green, and blue LEDs of the third relay substrates 2520R, 2520G, and 2520B may be transported to one piece of a fourth relay substrate 2620 by the laser transfer method in a certain array.

For example, the multiple red LEDs of the third red relay substrate 2520R may be transported to the fourth relay substrate 2620 by two each by the laser beam irradiated to the third red relay substrate 2520R through a slit 2244 of a second mask 2243 (referring to FIG. 20B).

The pair of slits 2244 of the second mask 2243 may be formed to a size corresponding to a single LED respectively, and a pitch MP71 between the slits 2244 may correspond to the third chip pitch CP73.

The first and second red LEDs R1 1-1 and R2 1-1 of a first column of the third red relay substrate 2520R may be transported to the fourth relay substrate 2620 to be spaced apart at the third chip pitch CP73 by the laser transfer method.

Then, the third and fourth red LEDs R1 2-1 and R2 2-1 of the first column of the third red relay substrate 2520R may be transported to a first column of the fourth relay substrate 2620. In this case, the third red LED R1 2-1 may be disposed to the fourth relay substrate 2620 to be spaced apart at the third chip pitch CP73 to the lower side of the second red LED R2 1-1 of the fourth relay substrate 2620. The fourth red LED R2 2-1 may be disposed to the fourth relay substrate 2620 in a state spaced apart at the third chip pitch CP73 to the lower side of the third red LED R1 2-1 of the fourth relay substrate 2620.

Then, the fifth and sixth red LEDs R1 3-1 and R2 3-1 of the first column of the third red relay substrate 2520R may be transported to the first column of the fourth relay substrate 2620. In this case, the fifth red LED R1 3-1 may be disposed to the fourth relay substrate 2620 to be spaced apart at the third chip pitch CP73 to the lower side of the fourth red LED R2 2-1 of the fourth relay substrate 2620. In this case, the sixth red LED R2 3-1 may be disposed to the fourth relay substrate 2620 in a state spaced apart at the third chip pitch CP73 to the lower side of the fifth red LED R1 3-1 of the fourth relay substrate 2620.

After transporting the red LEDs R1 1-1 to R1 3-1 and R2 1-1 to R2 3-1 of the first column of the third red relay substrate 2520R to the fourth relay substrate 2620 as described above, the remaining red LEDs R1 1-2 to R1 3-3 and R2 1-2 to R2 3-3 of the third red relay substrate 2520R may be transported to the fourth relay substrate 2620 consecutively by column in the same method as described above. In this case, the remaining red LEDs R1 1-2 to R1 3-3 and R2 1-2 to R2 3-3 being transported to the fourth relay substrate 2620 may be disposed to be spaced apart at the first chip pitch CP71 between the rows.

In the same process as described above, when the multiple green LEDs of the third green relay substrate 2520G and the multiple blue LEDs of the third blue relay substrate 2520B are respectively transported to the fourth relay substrate 2620, the fourth relay substrate 2620 may be arrayed with the red, green, and blue LEDs to form a unit pixel, respectively, as in FIG. 18C.

Figure 20D:
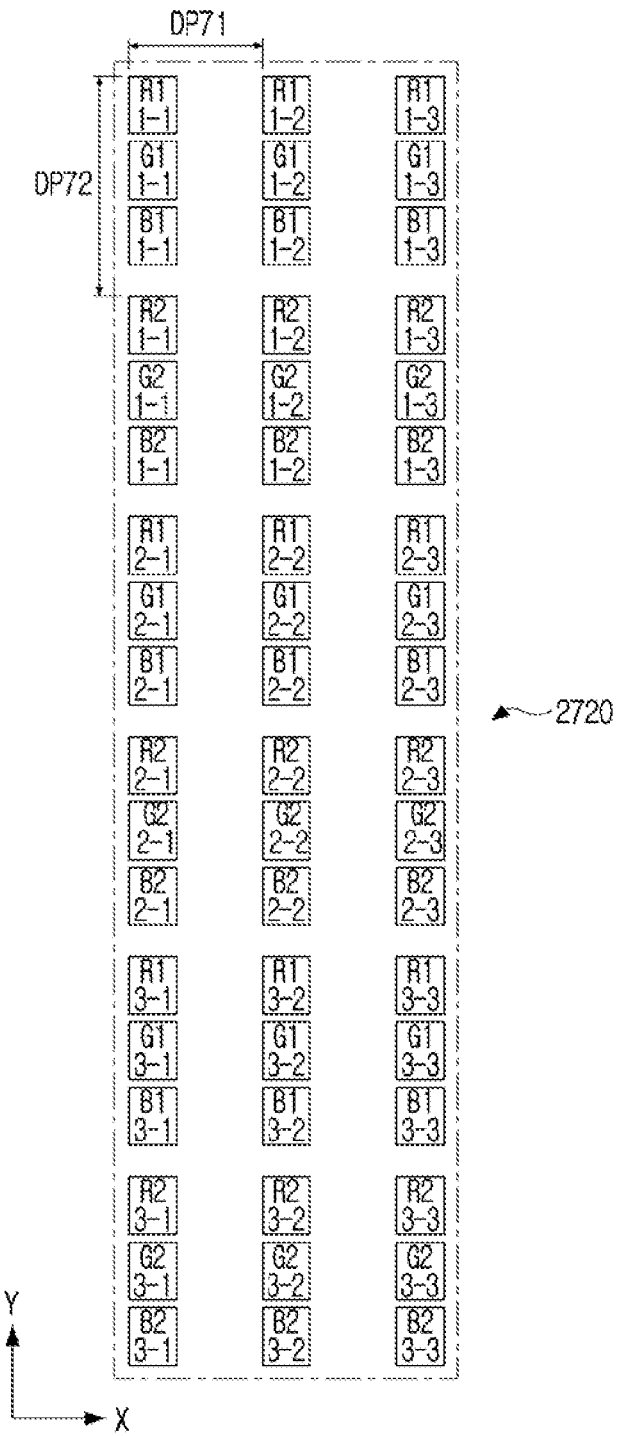

Referring to FIGS. 17 and 20D, the multi-colored LEDs arrayed on the fourth relay substrate 2620 may be transported to a target substrate 2720 by the laser transfer method in the row direction stretch array (secondary stretch array).

For example, the multi-colored LEDs of the fourth relay substrate 2620 may be transported to the target substrate 2720 by one row each by the laser beam irradiated to the fourth relay substrate 2620 through multiple slits 2254 of a third mask 2253 (referring to FIG. 20C). A pitch MP72 of the multiple slits 2254 of the third mask 2253 may be spaced apart to correspond to the third chip pitch CP73 in the column direction, and each slit 2254 may have a length and width corresponding to three LEDs of red, green, and blue corresponding to a unit pixel.

The multi-colored LEDs of the first column of the fourth relay substrate 2620 may be transported concurrently or close to concurrently to the target substrate 2720 to be spaced apart at a second display pitch DP72 by the laser transfer method.

Then, the multi-colored LEDs of a second column of the fourth relay substrate 2620 may be transported to the target substrate 2720 to be spaced apart by a first display pitch DP71 in the row direction from the multi-colored LEDs of a first column of the target substrate 2720.

Then, the multi-colored LEDs of a third column of the fourth relay substrate 2620 may be transported to the target substrate 2720 to be spaced apart by the first display pitch DP71 in the row direction from the multi-colored LEDs of a second column of the target substrate 2720.

As described above, the multi-colored LEDs may be ultimately transferred to the target substrate 2720 consecutively passing the row direction stretch array and the column direction stretch array from the first relay substrates.

FIGS. 21A to 21D are diagrams illustrating consecutively a process of transferring the LEDs of respective colors of the first relay substrates to the target substrate through stretch arraying in the row direction after stretch arraying in the column direction.

The red epi substrates may be manufactured through the photolithography process and the isolation process so as to maintain gaps (row direction gaps and column direction gaps) between the red LEDs to a processable minimum gap, respectively. The green epi substrates and the blue epi substrates may also be manufactured through the same process as the red epi substrates (referring to the process shown in FIG. 12A).

The first red relay substrates may be configured such that multiple red LEDs are transported from the red epi substrates by the laser transfer method. The first green relay substrates and the first blue relay substrates may also be configured such that the multiple green LEDs and the multiple blue LEDs are respectively transported through the same process as the first red relay substrates (referring to the process shown in FIG. 12B).

Figure 21A:
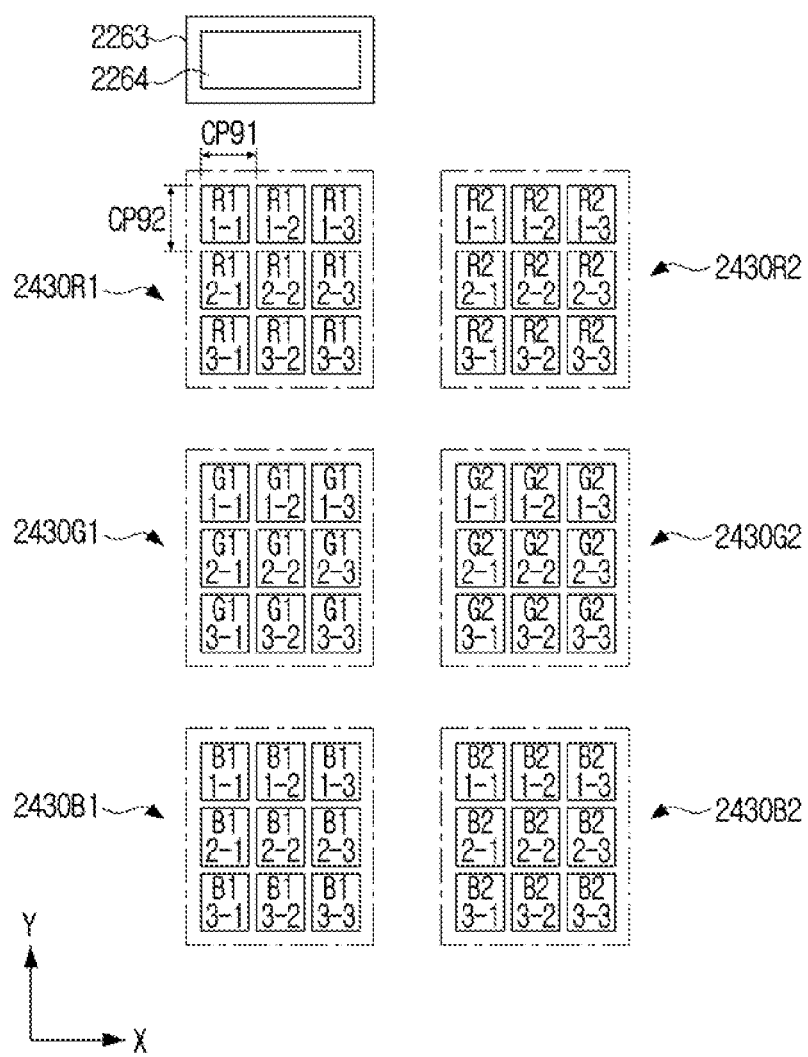
FIGS. 21A to 21D are diagrams illustrating consecutively a process of transferring LEDs of respective colors of first relay substrates to a target substrate through stretch arraying in a row direction after stretch arraying in a column direction.

Referring to FIG. 21A, the second red relay substrates 2430R1 and 2430R2 may be respectively arrayed with multiple red LEDs transported by the laser transfer method from the respective first red relay substrates.

The multiple red LEDs arrayed on the second red relay substrates 2430R1 and 2430R2 may have the same chip pitch (hereinafter, referred to as 'first chip pitch') CP91 in the row direction, and have the same chip pitch (hereinafter, referred to as 'second chip pitch') CP92 in also the column direction. The first and second chip pitches CP91 and CP92 may be the same as the row direction pitch and the column direction pitch between the red LEDs arrayed on the red epi substrate.

The second green relay substrates 2430G1 and 2430G2 and the second blue relay substrates 2430B1 and 2430B2 may also be arrayed with multiple green LEDs and multiple blue LEDs respectively from the first green relay substrates and the first blue relay substrates like the second red relay substrates 2430R1 and 2430R2. In this case, the multiple green LEDs arrayed on the second green relay substrates 2430G1 and 2430G2 and the multiple blue LEDs arrayed on the second blue relay substrates 2430B1 and 2430B2 may have a first chip pitch CP91 in the row direction and a second chip pitch CP92 in the column direction.

Figure 21B:
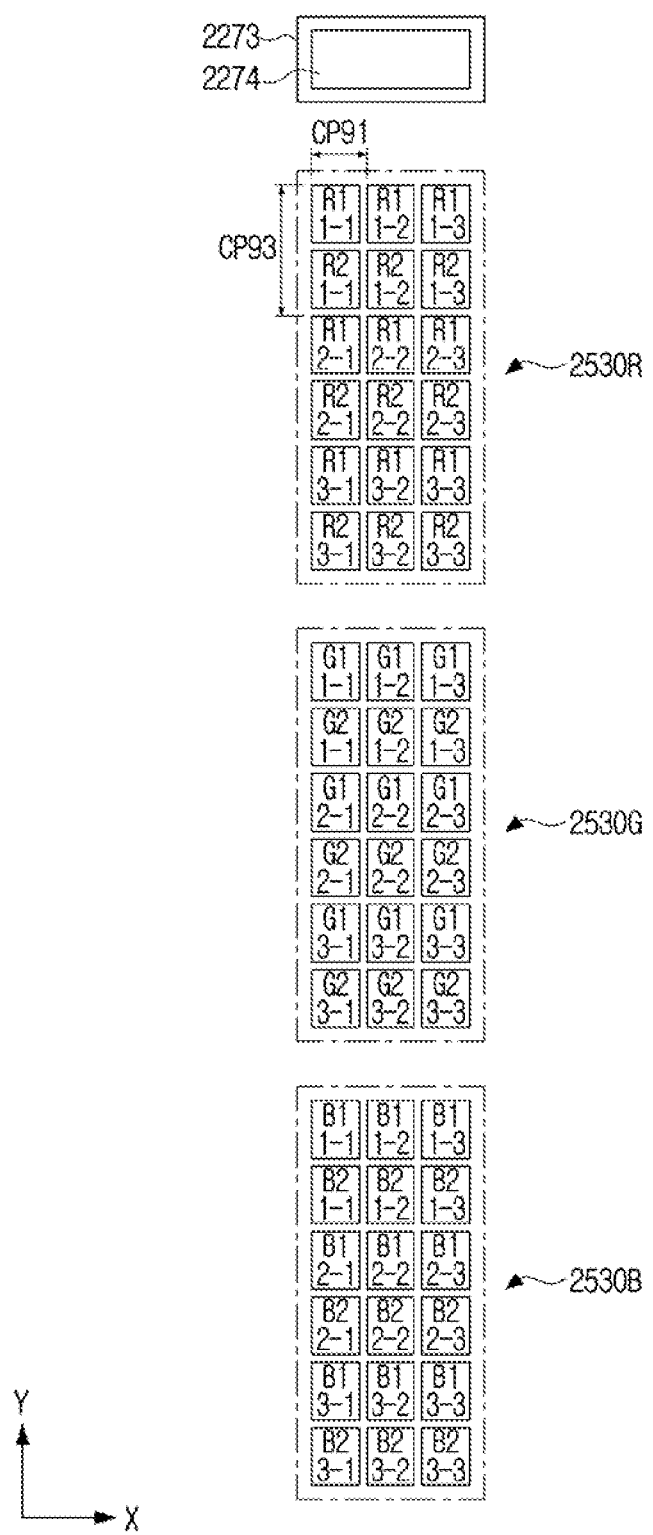

Referring to FIG. 21B, the red LEDs of the second red relay substrates 2430R1 and 2430R2 may be transported to one piece of a third red relay substrate 2530R by the laser transfer method in the column direction stretch array (primary stretch array).

The multiple red LEDs of the second red relay substrates 2430R1 and 2430R2 may be transported to the third red relay substrate 2530R by one column each by the laser beam irradiated to the second red relay substrate 2430R1 through a slit 2264 of a first mask 2263 (referring to FIG. 21A). The slit 2264 of the first mask 2263 may have a length and width corresponding to one column of the multiple red LEDs of the second red relay substrates 2430R1 and 2430R2.

For example, after transporting the red LEDs R1 1-1 to R1 1-3 of a first row of the second red relay substrate 2430R1 to a first row of the third red relay substrate 2530R, the red LEDs R1 2-1 to R1 2-3 of a second row of the second red relay substrate 2430R1 may be transported to the third red relay substrate 2530R to be spaced apart at a third chip pitch CP93 to the lower side of the red LEDs R1 1-1 to R1 1-3 of the first row of the third red relay substrate 2530R.

In this case, the third chip pitch CP93 may be greater than the second chip pitch CP92. For example, the third chip pitch CP93 may be two folds of the second chip pitch CP92. Accordingly, the red LEDs R1 2-1 to R1 2-3 transported to the third red relay substrate 2530R may be disposed at a third row of the third red relay substrate 2510R.

Then, the red LEDs R1 3-1 to R1 3-3 of a third column of the second red relay substrate 2430R1 may be transported to the third red relay substrate 2530R to be spaced apart at the third chip pitch CP93 to the lower side of the red LEDs R1 2-1 to R1 2-3 of a third column of the third red relay substrate 2530R.

In the same method described above, the multiple LEDs of the other second red relay substrate 2430R2 may be transported to the third red relay substrate 2530R.

For example, the red LEDs R2 1-1 to R2 1-3 of a first row of the other second red relay substrate 2430R2 may be transported to the third red relay substrate 2530R to be spaced apart at the second chip pitch CP92 to the lower side of the red LEDs R1 1-1 to R1 1-3 of the first row of the third red relay substrate 2530R. In this case, the red LEDs R2 1-1 to R2 1-3 transported to the third red relay substrate 2530R may be disposed at a second row of the third red relay substrate 2530R.

Then, the red LEDs R2 2-1 to R2 2-3 of a second row of the other second red relay substrate 2430R2 may be transported to the third red relay substrate 2530R to be spaced apart at the second chip pitch CP92 to the lower side of the red LEDs R1 2-1 to R1 2-3 of the third column of the third red relay substrate 2530R. In this case, the red LEDs R2 2-1 to R2 2-3 disposed at a fourth row of the third red relay substrate 2530R may be disposed to be spaced apart at the third chip pitch CP93 with the red LEDs R2 1-1 to R2 1-3 of the previously transported second row.

Then, the red LEDs R2 3-1 to R2 3-3 of a third row of the other second red relay substrate 2430R2 may be transported to the third red relay substrate 2530R to be spaced apart at the second chip pitch CP92 to the lower side of the red LEDs R1 3-1 to R1 3-3 of a fifth row of the third red relay substrate 2530R.

Through the same method as the method of transporting the multiple red LEDs of the second red relay substrates 2430R1 and 2430R2 to one piece of the third red relay substrate 2530R as described above, the multiple green LEDs of the second green relay substrates 2430G1 and 2430G2 and the multiple blue LEDs of the second blue relay substrates 2430B1 and 2430B2 may be transported to one piece of a third green relay substrate 2530G and one piece of a third blue relay substrate 2530B, respectively.

Accordingly, the LEDs of respective colors of the second relay substrates 2430R1, 2430R2, 2430G1, 2430G2, 2430B1, and 2430B2 may be transported to the respectively corresponding third relay substrates 2530R, 2530G, and 2530B in the column direction stretch array (primary stretch array).

Figure 21C:
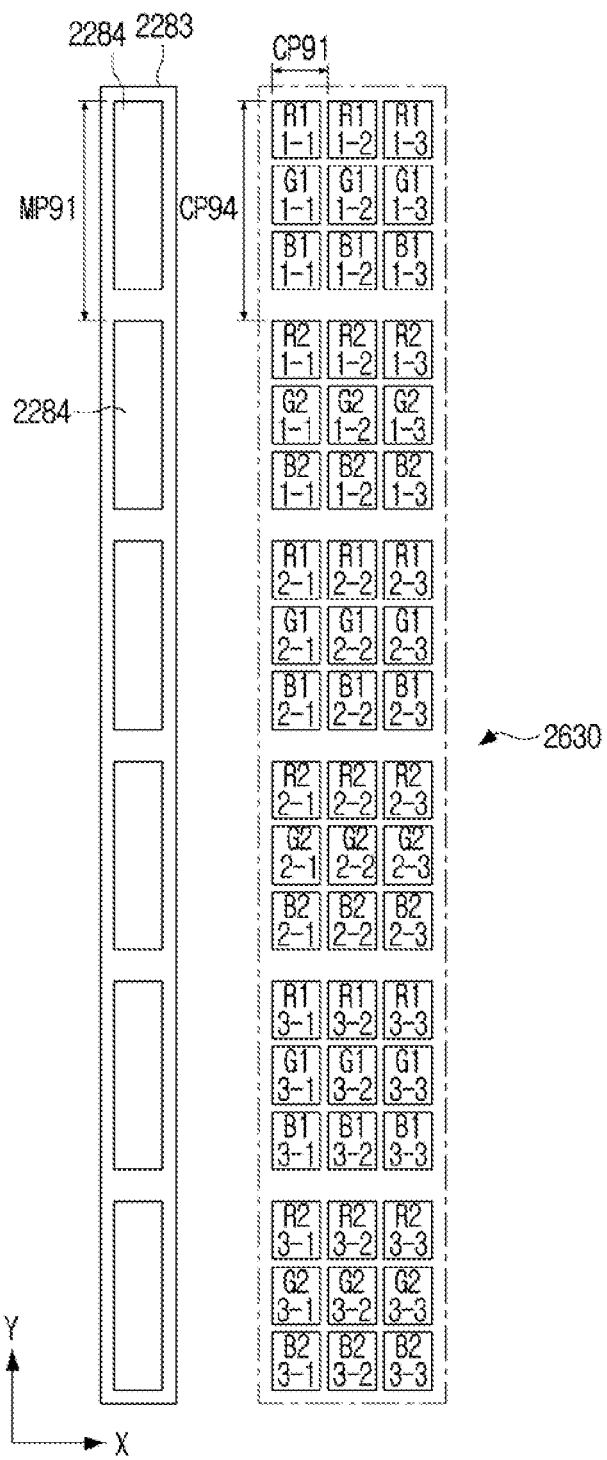

Referring to FIG. 21C, the red, green, and blue LEDs of the third relay substrates 2530R, 2530G, and 2530B may be transported to one piece of a fourth relay substrate 2630 by the laser transfer method in a certain array.

For example, the multiple red LEDs of the third red relay substrate 2530R may be transported to the fourth relay substrate 2630 by one row each by the laser beam irradiated to the third red relay substrate 2530R through a slit 2274 of a second mask 2273 (referring to FIG. 21B). In this case, the second mask 2273 may be formed with the slit 2274 having a length and width corresponding to an LED column for the LEDs of the third red relay substrate 2530R to be transported to the fourth relay substrate 2630 by one column each.

Then, the red LEDs R1 1-1 to R1 1-3 of the first row of the third red relay substrate 2530R may be transported to the fourth relay substrate 2630 to be spaced apart at a fourth chip pitch CP94.

Then, the red LEDs R2 1-1 and R2 1-3 of the second row of the third red relay substrate 2530R may be disposed at the fourth relay substrate 2630 to be spaced apart at the fourth chip pitch CP94 to the lower side of the red LEDs R1 1-1 to R1 1-3 of a first row of the fourth relay substrate 2630.

In the same method described above, the remaining red LEDs R1 2-1 to R2 3-3 of the third red relay substrate 2530R may be transported consecutively by one row each to one piece of the fourth relay substrate 2630 along the column direction.

In the same method described above, the multiple green LEDs of the third green relay substrate 2530G and the multiple blue LEDs of the third blue relay substrate 2530B may all be consecutively transported to one piece of the fourth relay substrate 2630. In this case, the red, green, and blue LEDs may be arrayed on one piece of the fourth relay substrate 2630 in pixel units as in FIG. 21C.

In addition, when transporting the LEDs from the third relay substrates 2530R, 2530G, and 2530B to the fourth relay substrate 2630 as described above, the LEDs may be stretch arrayed in the column direction as with the stretch array of LEDs from the second relay substrates 2430R1, 2430R2, 2430G1, 2430G2, 2430B1, and 2430B2 to the third relay substrates 2530R, 2530G, and 2530B.

Figure 21D:
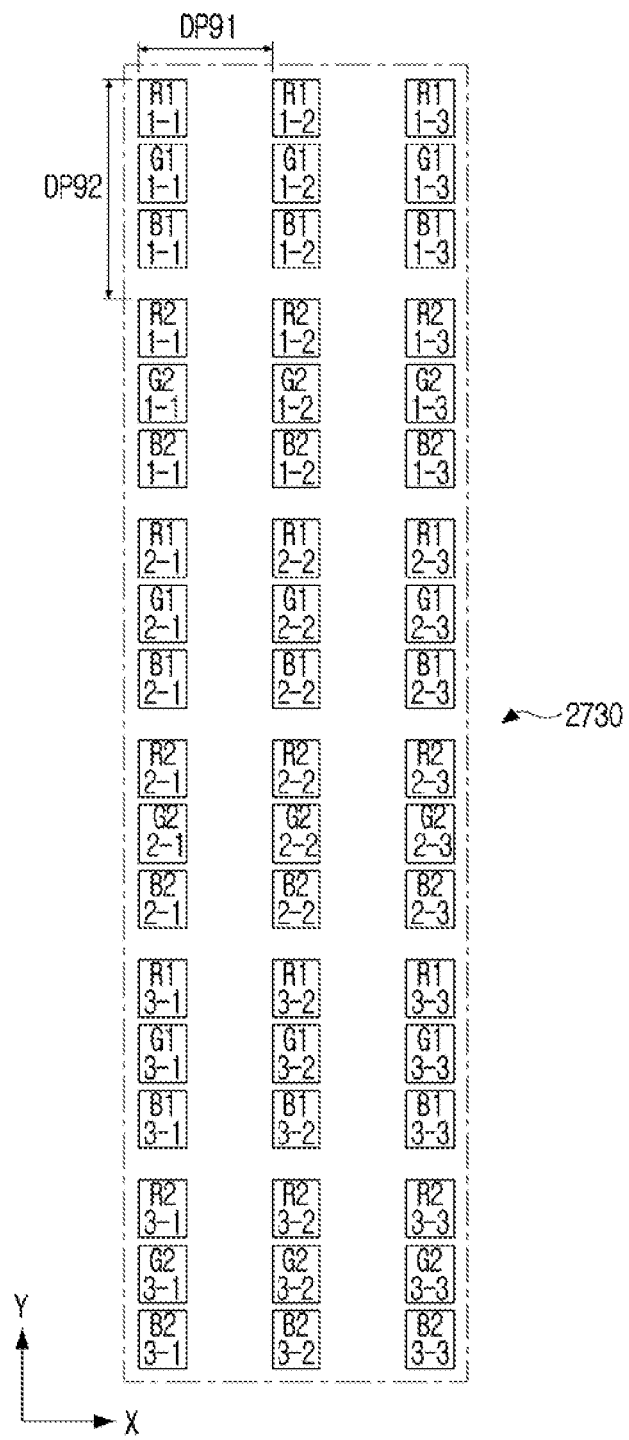

Referring to FIG. 21D, the red, green, and blue LEDs arrayed on the fourth relay substrate 2630 may be transported to a target substrate 2730 by the laser transfer method, and arrayed at first and second display pitches DP91 and DP 92 in pixel units. The multi-colored LEDs arrayed on the fourth relay substrate 2630 may be transported to the target substrate 2730 by the laser transfer method in the row direction stretch array (secondary stretch array).

For example, the multi-colored LEDs of the fourth relay substrate 2630 may be transported to the target substrate 2730 by one column each by the laser beam irradiated to the fourth relay substrate 2630 through multiple slits 2284 of a third mask 2283 (referring to FIG. 21C). A pitch MP91 of the multiple slits 2284 of the third mask 2283 may be spaced apart to correspond to the fourth chip pitch CP94 in the column direction, and each slit 2284 may have a length and width corresponding to three LEDs of red, green, and blue corresponding to a unit pixel.

The multi-colored LEDs of a first column of the fourth relay substrate 2630 may be transported concurrently or close to concurrently to the target substrate 2710 by the laser transfer method.

Then, the multi-colored LEDs of a second column of the fourth relay substrate 2630 may be transported to the target substrate 2730 to be spaced apart by a first display pitch DP91 in the row direction from the multi-colored LEDs of a first column of the target substrate 2730.

In the same process as described above, the multi-colored LEDs of the remaining third column of the fourth relay substrate 2630 may be transported to the target substrate 2730 to be spaced apart by the first display pitch DP91 in the row direction from the multi-colored LEDs of a second column of the target substrate 2730.

As described above, in the disclosure, the multi-colored LEDs may be ultimately transferred to the target substrate 2730 consecutively passing the column direction stretch array in the row direction stretch array from the first relay substrates.

Figure 22:
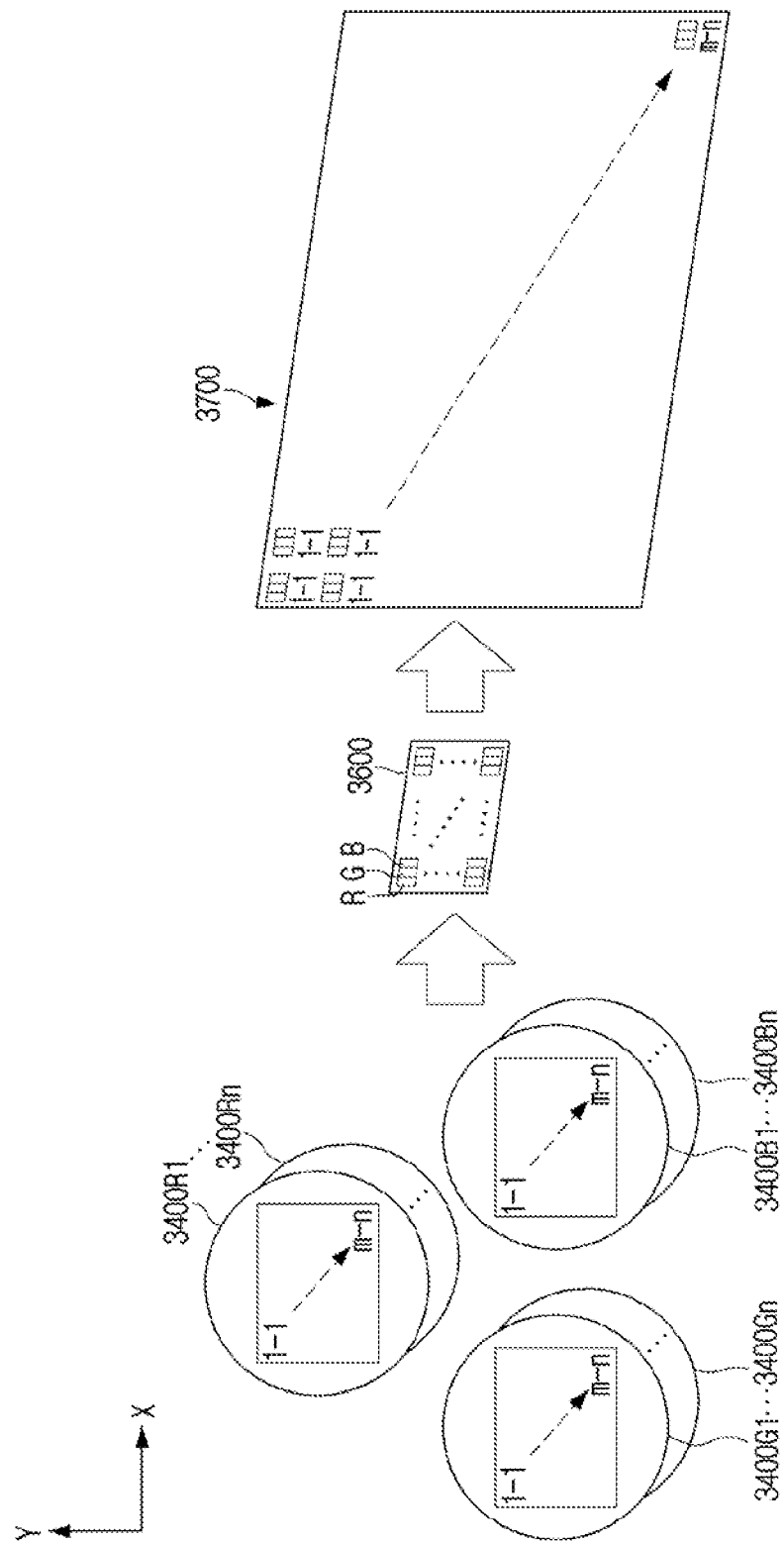
FIG. 22 is a diagram illustrating an example of having prepared first relay substrates of respective colors in multiples respectively as a process diagram illustrating schematically a method for manufacturing a display module according to an embodiment.
Figure 23A:
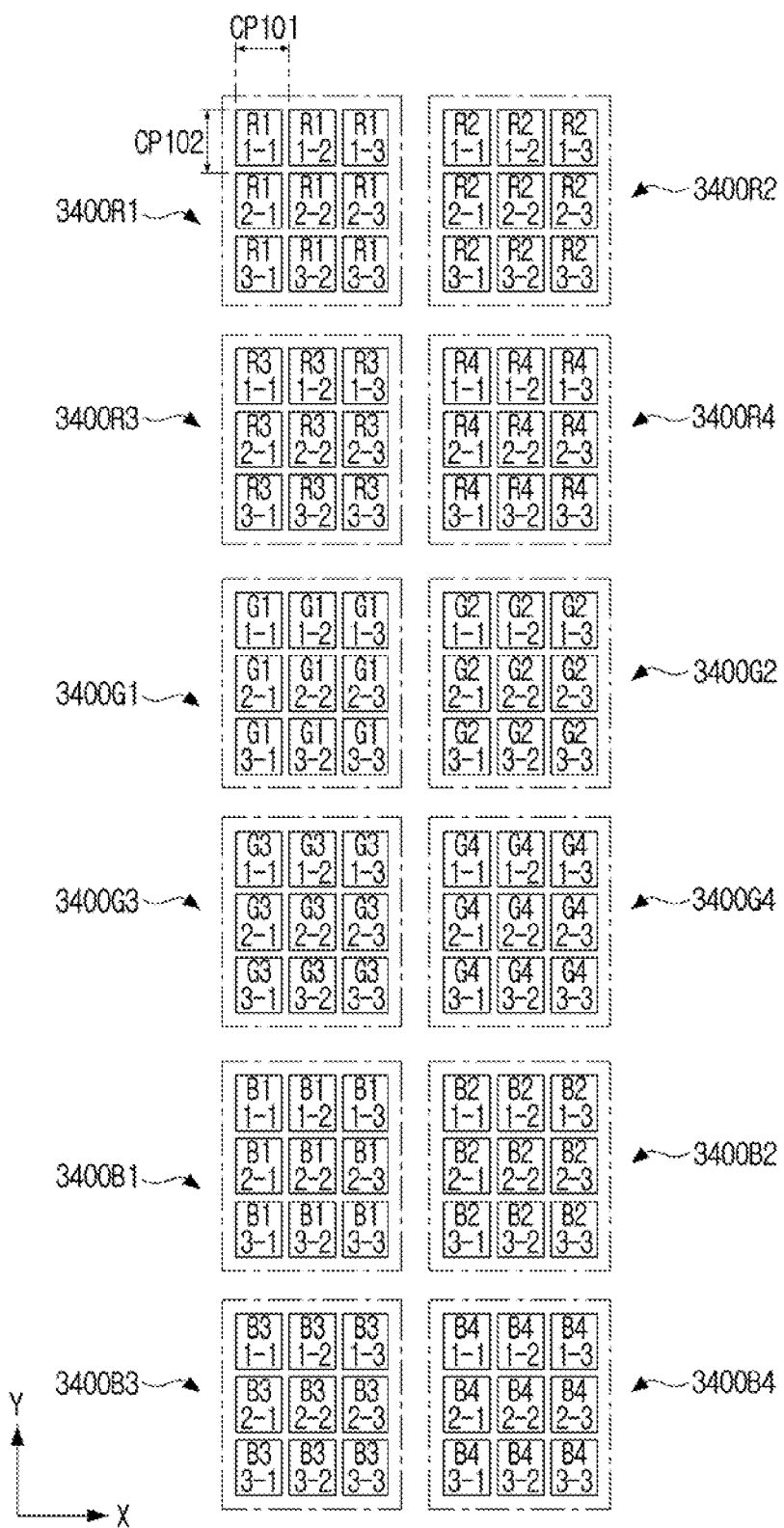
FIGS. 23A to 23C are diagrams illustrating consecutively a process of transferring LEDs of respective colors of first relay substrates shown in FIG. 19 to a target substrate through stretch arraying in a column direction after stretch arraying in a row direction.
Figure 23B:
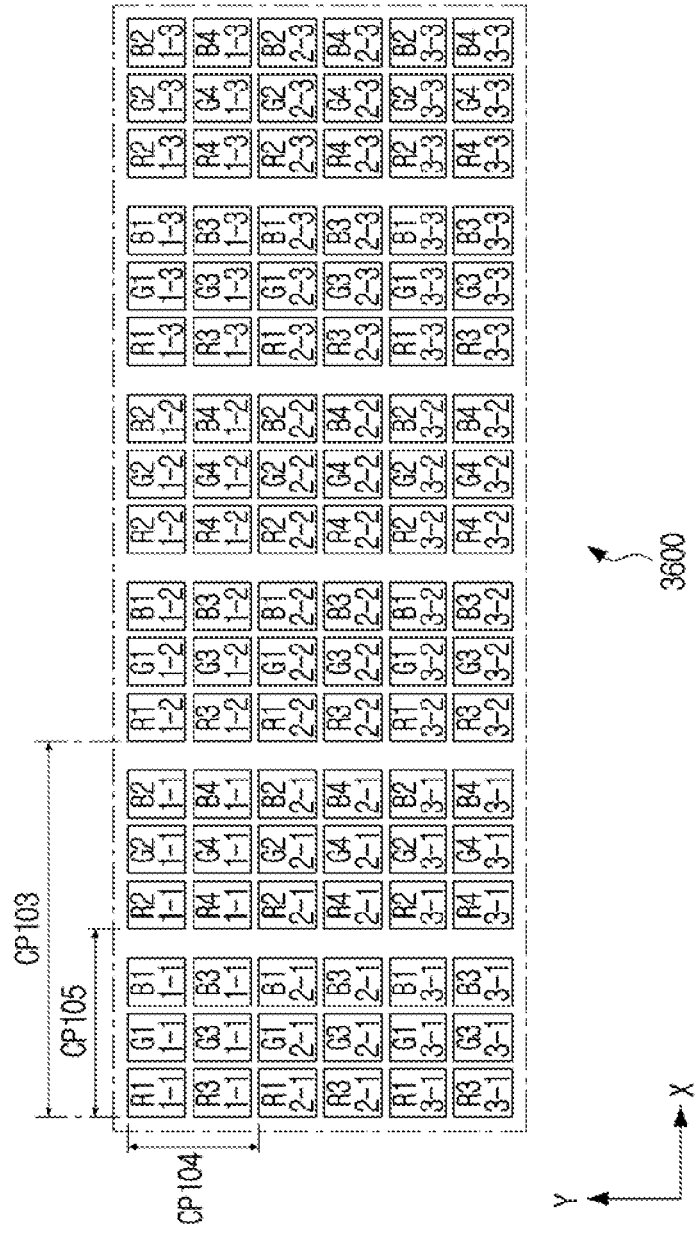
Figure 23C:
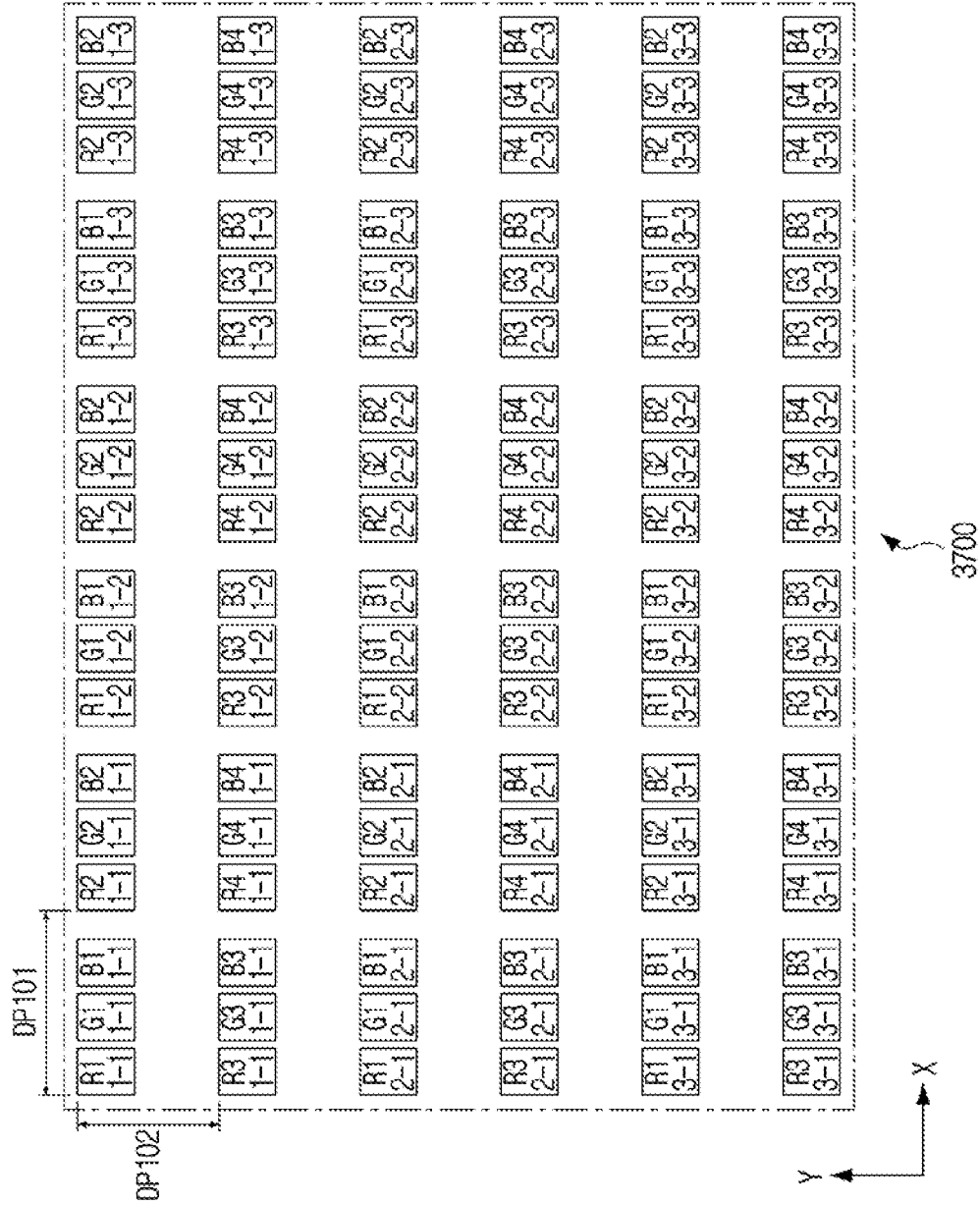

FIG. 22 is a process diagram illustrating a method for manufacturing a display module according to still another embodiment, and FIGS. 23A to 23C are diagrams illustrating consecutively a process of transferring the LEDs of respective colors of the first relay substrates shown in FIG. 19 to the target substrate through stretch arraying in the column direction after stretch arraying in the row direction.

For convenience of description, first red relay substrates 3400R1 to 3400Rn, first green relay substrates 3400G1 to 3400Gn, and first blue relay substrates 3400B1 to 3400Bn (hereinafter, referred to as 'first relay substrates') may respectively use two each 3400R1, 3400R2, 3400 G1, 3400G2, 3400B1, and 3400B2 as in FIG. 23A, and only apart (3×3) of the LEDs of respective colors will be shown and described. Although the LEDs of respective colors arrayed on a second relay substrate 3600 are a rectangular type disposed such that the long side is parallel to the column direction (Y-axis direction) as in FIG. 22, the LEDs of respective colors have been represented as roughly a square type in FIGS. 23A to 23C for convenience of description. In addition, the mask used when laser transferring has also been shown reduced in its size or length taking into consideration the number of LEDs of respective colors.

Referring to FIGS. 22 and 23A, first red relay substrates 3400R1 to 3400R4 may be respectively arrayed with multiple red LEDs transported by the laser transfer method from the respective epi substrates on which multiple red LEDs are formed. In this case, the respective epi substrates may be manufactured through the photolithography process and the isolation process so as to maintain gaps (row direction gaps and column direction gaps) between the red LEDs to a processable minimum gap.

The multiple red LEDs arrayed on the first red relay substrates 3400R1 to 3400R4 may have the same chip pitch (hereinafter, referred to as 'first chip pitch') CP101 in the row direction, and have the same chip pitch (hereinafter, referred to as 'second chip pitch') CP102 in also the column direction. The first and second chip pitches CP101 and CP102 may be the same as the row direction pitch and the column direction pitch between the red LEDs arrayed on the red epi substrate.

The first green relay substrates 3400G1 to 3400G4 and the first blue relay substrates 3400B1 to 3400B4 may also be arrayed with the multiple green LEDs and the multiple blue LEDs respectively in the same process as the first red relay substrates 3400R1 to 3400R4. In this case, the multiple green LEDs arrayed on the first green relay substrates 3400G1 to 3400G4 and the multiple blue LEDs arrayed on the first blue relay substrates 3400B1 to 3400B4 may have a first chip pitch CP101 in the row direction, and a second chip pitch CP102 in the column direction.

Referring to FIG. 23B, the LEDs of respective colors from the first relay substrates 3400R1 to 3400R4, 3400G1 to 3400G4, and 3400B1 to 3400B4 may be transported to one piece of the second relay substrate 3600 through the laser transfer method in the row direction stretch array (primary stretch array).

For example, the red LEDs R1 1-1 to R1 1-3 of one row of a first red relay substrate 3400R1 of one from among the first red relay substrates may be transported to the second relay substrate 3600 to be spaced apart by a third chip pitch CP103 in the row direction.

Then, the red LEDs R1 2-1 to R1 2-3 of a second row of the first red relay substrate 3400R1 may be transported to the second relay substrate 3600 to be spaced apart by a fourth chip pitch CP104 along the column direction to the lower side from the red LEDs R1 1-1 to R1 1-3 of a first row of the second relay substrate 3600. In this case, the red LEDs R1 2-1 to R1 2-3 arrayed at a third row of the second relay substrate 3600 may be disposed to be spaced apart by the third chip pitch CP103 in the row direction.

Then, the red LEDs R1 3-1 to R1 3-3 of a third row of the first red relay substrate 3400R1 may be transported to the second relay substrate 3600 to be spaced apart by the fourth chip pitch CP104 along the column direction to the lower side from the red LEDs R1 2-1 to R1 2-3 of a third row of the second relay substrate 3600. In this case, the red LEDs R1 3-1 to R1 3-3 arrayed at a fifth row of the second relay substrate 3600 may be disposed to be spaced apart by the third chip pitch CP103 in the row direction.

Then, the red LEDs R2 1-1 to R2 1-3 of one row of the other first red relay substrate 3400R2 from among the first red substrates may be transported to a first row of the second relay substrate 3600 to be spaced apart by the third chip pitch CP103 in the row direction. In this case, the red LEDs R2 1-1 to R2 1-3 may be disposed to be spaced apart by a fifth chip pitch CP105 to the right side respectively with respect to the red LEDs R1 1-1 to R1 1-3 previously disposed at the second relay substrate 3600.

In the same process described above, the remaining red LEDs R2 2-1 to R2 3-3 of the first red relay substrate 3400R2 may be transported to be disposed respectively at the third and fifth rows of the second relay substrate 3600.

In the same process described above, the red LEDs of the remaining first red relay substrates 3400R3 and 3400R4 from among the first red relay substrates may be transported to a second row, a fourth row, and a sixth row of the second relay substrate 3600.

Like the process of transporting the red LEDs of the first red relay substrates 3400R1 to 3400R4 to the second relay substrate 3600, the multiple green LEDs of the first green relay substrates 3400G1 to 3400G4 and the multiple blue LEDs of the first blue relay substrates 3400B1 to 3400B4 may be transported to the second relay substrate 3600.

As in FIG. 23B, the LEDs of respective colors arrayed on the second relay substrate 3600 may be configured such that a pixel which includes the red, green, and blue LEDs is disposed, in the respective rows, spaced apart at a fifth chip pitch CP105 by three each in the row direction to correspond to a unit pixel of a target substrate 3700 which will be described below. In this case, the respective gaps of the red, green, and blue LEDs corresponding to the unit pixel may be disposed spaced apart at the first chip pitch CP101. In addition, the respective rows of the LEDs of the second relay substrate 3600 may be disposed spaced apart by the second chip pitch CP102 in the column direction.

Referring to FIG. 23C, the multi-colored LEDs arrayed on the second relay substrate 3600 may be transported to the target substrate 3700 by the laser transfer method in the column direction stretch array (secondary stretch array).

For example, the multi-colored LEDs of the second relay substrate 3600 may be transported to the target substrate 3700 by one row each by the laser beam irradiated to the second relay substrate 3600. In this case, the mask used may be manufactured to be the same as with the above-described third mask 2281 (referring to FIG. 19C).

The multi-colored LEDs of the first row of the second relay substrate 3600 may be transported concurrently or close to concurrently to the target substrate 3700 to be spaced apart at a first display pitch DP101 by the laser transfer method.

Then, the multi-colored LEDs of a second row of the second relay substrate 3600 may be transported consecutively to the target substrate 3700 to be spaced apart by a second display pitch DP102 in the column direction from the multi-colored LEDs of a first row to the multi-colored LEDs of the remaining rows of the target substrate 3700.

As described above, the multi-colored LEDs may be ultimately transferred to the target substrate 3700 consecutively passing the row direction stretch array and the column direction stretch array from the first relay substrates 3400R1 to 3400R4, 3400G1 to 3400G4, and 3400B1 to 3400B4. In this case, the process shown in FIG. 22 may omit one step further than the process of transporting the LEDs between the relay substrates shown in FIG. 17.

FIGS. 24A to 24D are diagrams illustrating consecutively a process of transferring the LEDs of respective colors of the first relay substrates to the target substrate through stretch arraying in the row direction after stretch arraying in the column direction.

Figure 24A:
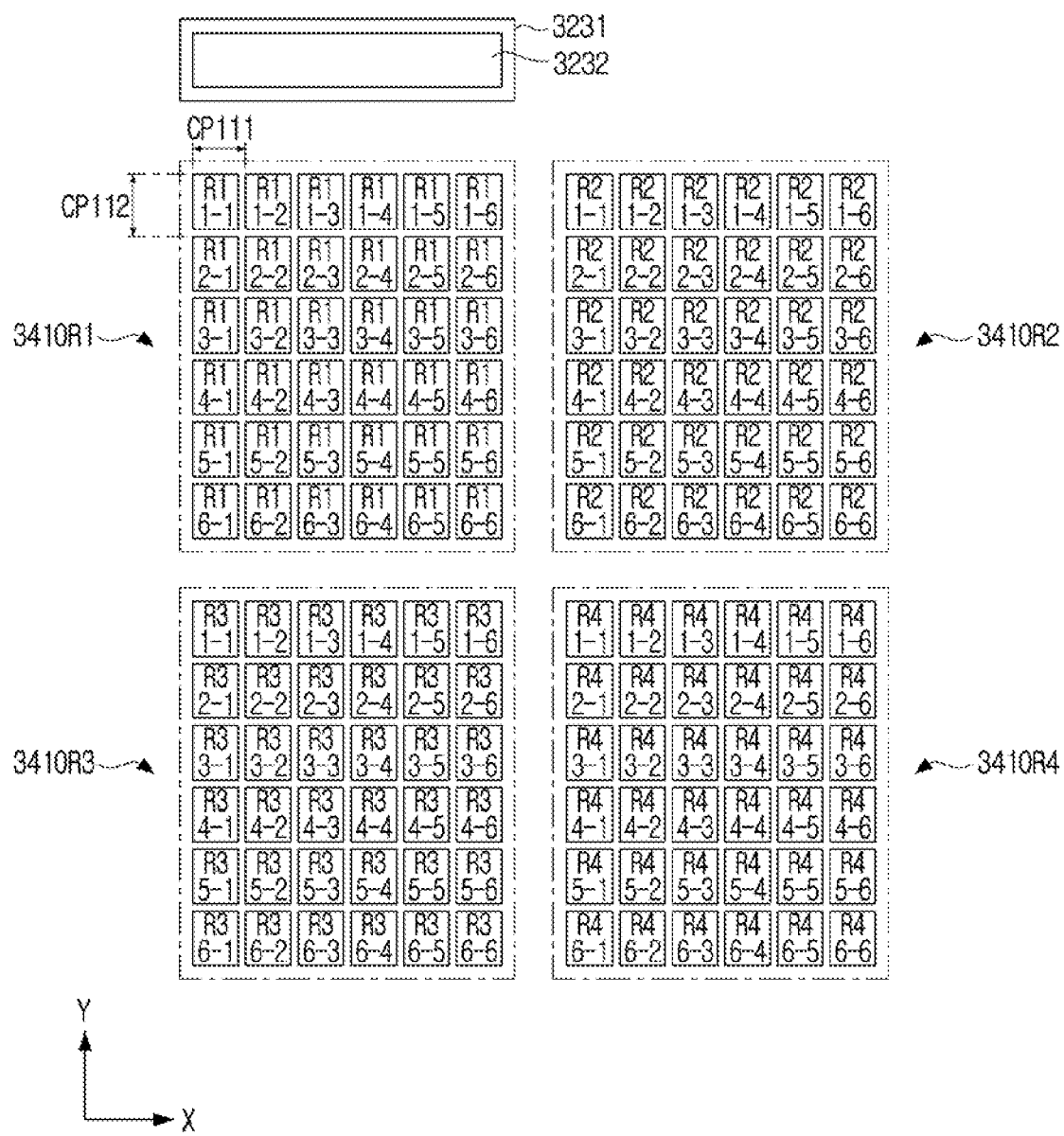
FIGS. 24A to 24D are diagrams illustrating consecutively a process of transferring LEDs of respective colors of first relay substrates to a target substrate through stretch arraying in a row direction after stretch arraying in a column direction.

For convenience of description, the first red relay substrates may respectively use four pieces each 3410R1 to 3410R4 as in FIG. 24A, and only a part (6×6) of the LEDs of respective colors will be shown and described. Likewise, the first green relay substrates and the first blue relay substrates may also use four pieces each as with above-described first red relay substrates 3410R1 to 3410R4.

Figure 24B:
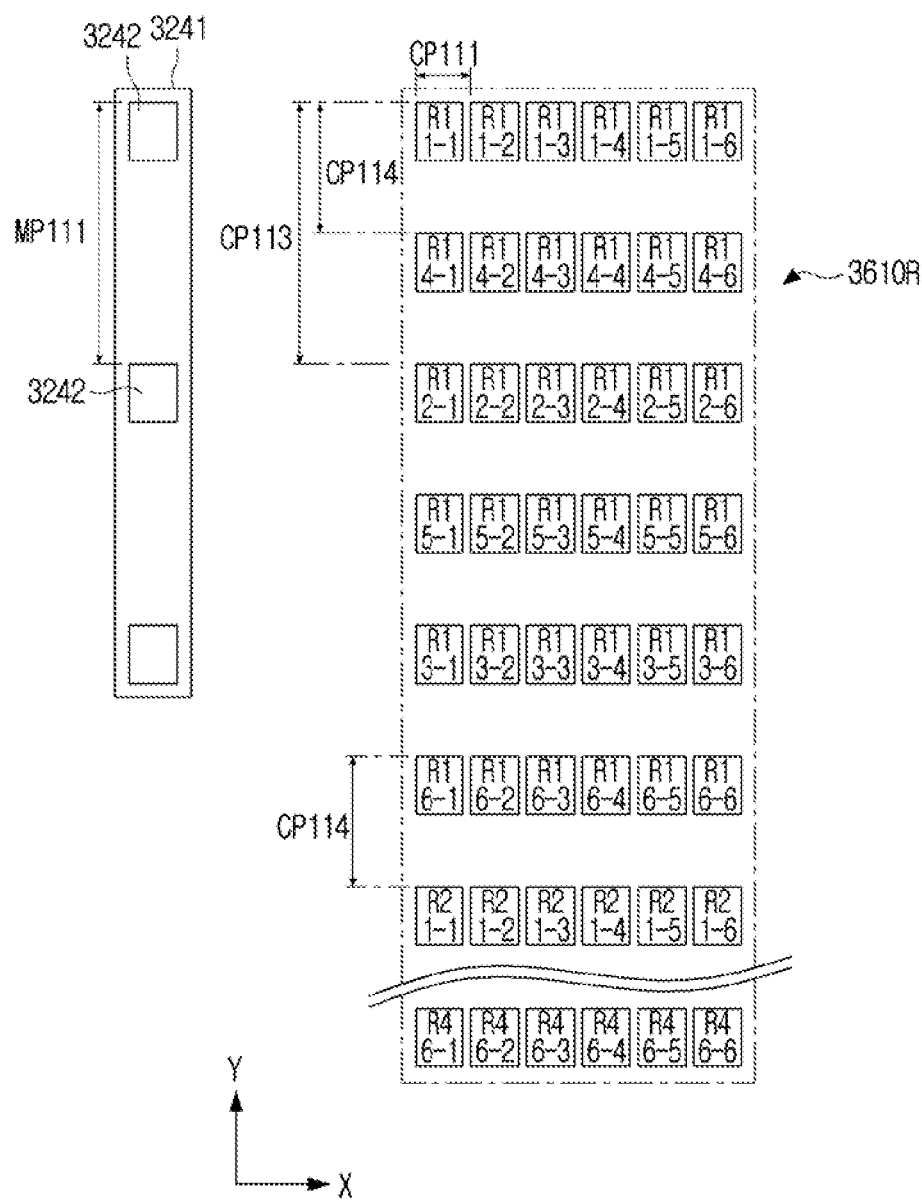
Figure 24C:
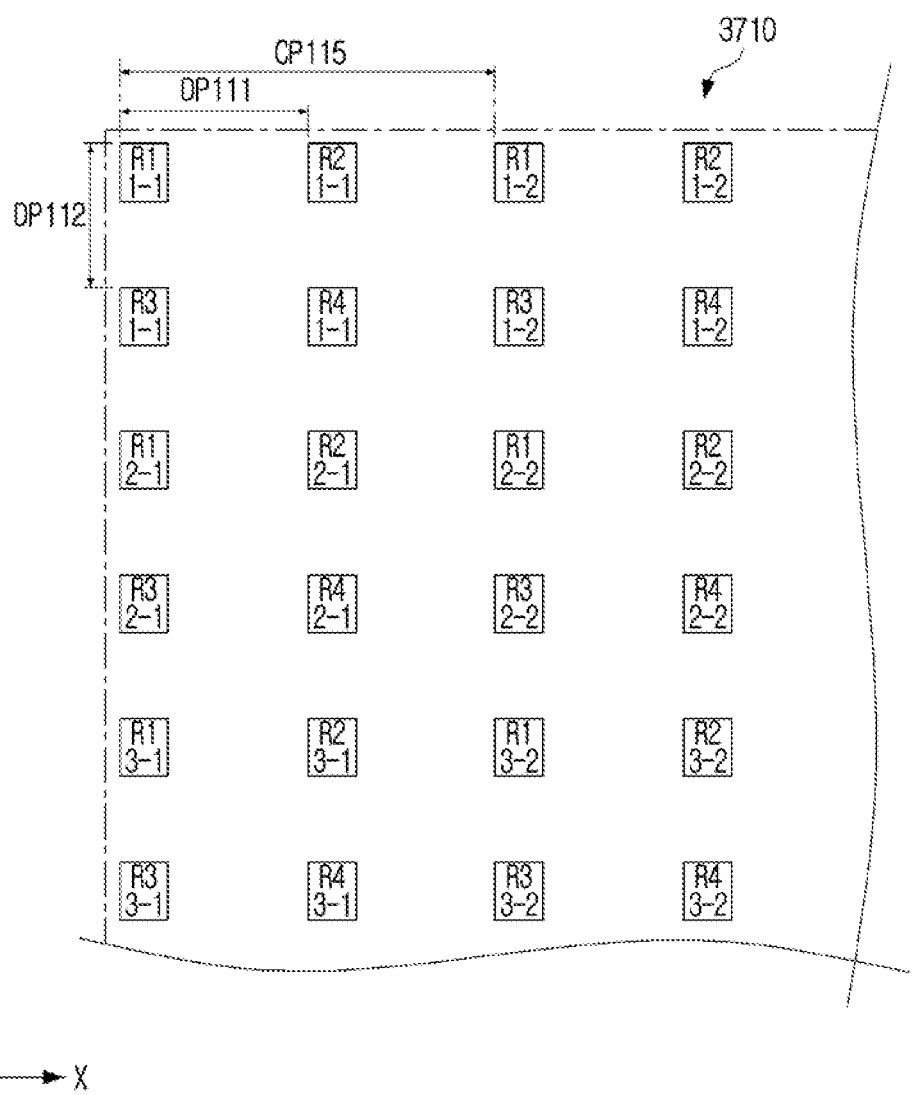

Although the LEDs of respective colors arrayed on a second red relay substrate 3610R are a rectangular type disposed such that the long side is parallel to the column direction (Y-axis direction) as in FIG. 22, the LEDs of respective colors have been represented as roughly a square type in FIGS. 24A to 24C for convenience of description. In addition, the mask used when laser transferring has also been shown reduced in its size or length taking into consideration the number of LEDs of respective colors.

Referring to FIG. 24A, the first red relay substrates 3410R1 to 3410R4 may be respectively arrayed with multiple red LEDs transported by the laser transfer method from the respective epi substrates on which multiple red LEDs are formed. In this case, the respective epi substrates may be manufactured through the photolithography process and the isolation process so as to maintain gaps (row direction gaps and column direction gaps) between the red LEDs to a processable minimum gap.

The multiple red LEDs arrayed on the first red relay substrates 3410R1 to 3410R4 may have the same chip pitch (hereinafter, referred to as 'first chip pitch') CP111 in the row direction, and have the same chip pitch (hereinafter, referred to as 'second chip pitch') CP112 in also the column direction. The first and second chip pitches CPTTT and CP112 may be the same as the row direction pitch and the column direction pitch between the red LEDs arrayed on the red epi substrate.

The first green relay substrates and the first blue relay substrates may also be arrayed with multiple green LEDs and multiple blue LEDs respectively in the same process as the first red relay substrates 3410R1 to 3410R4. In this case, the multiple green LEDs arrayed on the first green relay substrates and the multiple blue LEDs arrayed on the first blue relay substrates may have a first chip pitch CP111 in the row direction, and a second chip pitch CP112 in the column direction.

Referring to FIG. 24B, the red LEDs from the first red relay substrates 3410R1 to 3410R4 may be transported consecutively to one piece of the second red relay substrate 3610R through the laser transfer method in the column direction stretch array (primary stretch array). In this case, a first mask 3231 which is to be used may have a slit 3232 corresponding to a length and width corresponding to the respective rows of the first red relay substrates 3410R1 to 3410R4.

The red LEDs of one first red relay substrate 3410R1 from among the first red relay substrates may be transported to the second red relay substrate 3610R to be spaced apart by a third chip pitch CP113 in the column direction by one row each.

For example, the red LEDs R1 1-1 to R1 1-6 of a first row of the first red relay substrate 3410R1 may be transported to a first row of the second red relay substrate 3610R.

Then, the red LEDs R1 2-1 to R1 2-6 of a second row of the first red relay substrate 3410R1 may be transported to be spaced apart at the third chip pitch CP113 to the lower side of the red LEDs R1 1-1 to R1 1-6 of the first row of the second red relay substrate 3610R.

Then, the red LEDs R1 3-1 to R1 3-6 of a third row of the first red relay substrate 3410R1 may be transported to be spaced apart at the third chip pitch CP113 to the lower side of the red LEDs R1 2-1 to R1 2-6 of the second red relay substrate 3610R.

Then, the red LEDs R1 4-1 to R1 4-6 of a fourth row of the first red relay substrate 3410R1 may be transported to be spaced apart at a fourth chip pitch CP114 to the lower side of the red LEDs R1 1-1 to R1 1-6 of the first row of the second red relay substrate 3610R. In this case, the fourth chip pitch CP114 may be smaller than the third chip pitch CP113, and may correspond to a second display pitch DPi12.

Then, the red LEDs R1 5-1 to R1 5-6 of a fifth row of the first red relay substrate 3410R1 may be transported to be spaced apart at the fourth chip pitch CPI14 to the lower side of the red LEDs R1 2-1 to R1 2-6 of a third row of the second red relay substrate 3610R.

Then, the red LEDs R1 6-1 to R1 6-6 of a sixth row of the first red relay substrate 3410R1 may be transported to be spaced apart at the fourth chip pitch CPI14 to the lower side of the red LEDs R1 3-1 to R1 3-6 of a fifth row of the second red relay substrate 3610R.

Then, the red LEDs of the remaining first red relay substrates 3410R2 to 3410R4 may be transported to the second red relay substrate 3610R to be spaced apart by the third chip pitch CP113 along the column direction consecutively by one row each like the process of transporting the red LEDs of the above-described first red relay substrate 3410R1.

In the same method described above, the multiple green LEDs of four pieces of first green relay substrates may be transported to one piece of second green relay substrate, and the multiple blue LEDs of four pieces of first blue relay substrates may be transported to one piece of second blue relay substrate.

Referring to FIG. 24C, the red LEDs arrayed on a second red relay substrate 3610R may be transported to a target substrate 3710 by the laser transfer method in the row direction stretch array (secondary stretch array).

For example, the red LEDs of the second red relay substrate 3610R may be configured such that three red LEDs per one column are transported to the target substrate 3710 by the laser beam irradiated to the second red relay substrate 3610R.

In this case, a second mask 3241 which is used when transferring the red LEDs of the second red relay substrate 3610R to the target substrate 3710 may have a pair of slits 3242. The pair of slits 3242 may be respectively formed to a size corresponding to a single LED, and a pitch MP111 between the pair of slits 3242 may correspond to the third chip pitch CP113.

Referring to FIG. 24C, the LEDs of respective colors arrayed on the second red relay substrate 3610R may be stretch arrayed at a certain pitch (e.g., a chip pitch corresponding to a first display pitch DP111) in the row direction by three each per one column through the second mask 3241.

For example, the red LEDs of the second red relay substrate 3610R may be transported to the target substrate 3710 through a process as described below.

The three red LEDs R1 1-1, R1 2-1, and R1 3-1 of a first column of the second red relay substrate 3610R may be transported to a first column of the target substrate 3710. In this case, the respective red LEDs R1 1-1, R1 2-1, and R1 3-1 may be disposed to be spaced apart by the third chip pitch CP113 in the column direction.

Then, the three red LEDs R1 1-2, R1 2-2, and R1 3-2 of a second column of the second red relay substrate 3610R may be transported to be spaced apart at a fifth chip pitch CP115 to the right side of the red LEDs R1 1-1, R1 2-1, and R1 3-1 of the first column of the target substrate 3710.

Then, the remaining red LEDs R1 1-2 to R1 3-6 of the second red relay substrate 3610R may be transported consecutively by three each to the target substrate 3710 to be spaced apart at the fifth chip pitch CP115 to the right side of the red LEDs R1 1-2, R1 2-2, and R1 3-2 of the target substrate 3710.

In the same process described above, the remaining red LEDs R1 4-1 to R4 6-6 of the second red relay substrate 3610R may be consecutively transported by one column each to the lower side of the red LEDs R1 3-1 to R1 3-6 of the target substrate 3710 to form an array as in FIG. 24C.

Figure 24D:
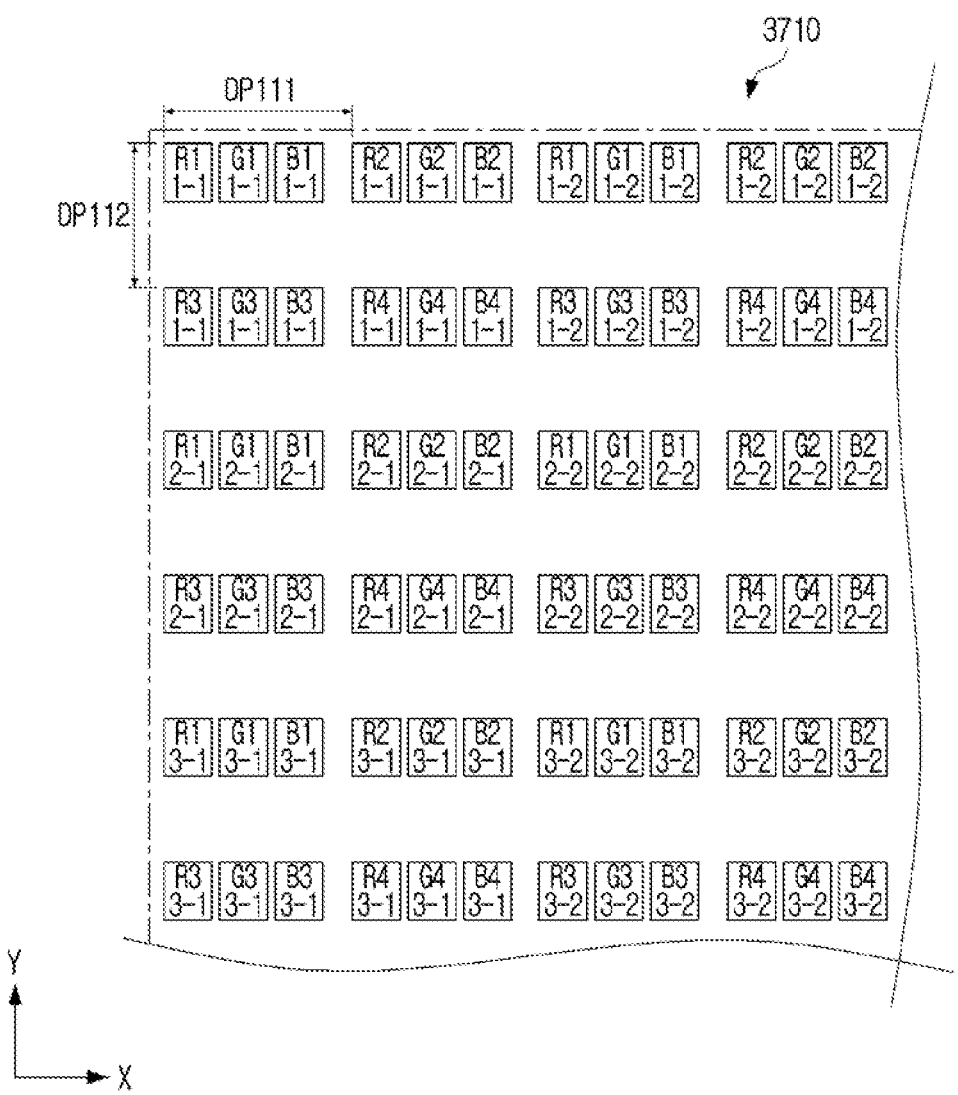

In the same process described above, the green LEDs of the second green relay substrate and the blue LEDs of the second blue relay substrate may be consecutively transported to the target substrate as in FIG. 24D.

In the above, various embodiments of the disclosure have been respectively described individually, but the respective embodiments may not necessarily be implemented on its own, and the configuration and operation of the respective embodiments may be implemented in combination with at least one other embodiment.

While the disclosure has been illustrated and described with reference to various example embodiments thereof, it will be understood that the various example embodiments are intended to be illustrative, not limiting. It will be understood by those skilled in the art that various changes in form and details may be made therein without departing from the true spirit and full scope of the disclosure, including the appended claims and their equivalents.

The disclosure relates to a display module provided with multiple LEDs and a method for manufacturing a display module.

What is claimed is:

1. A method for manufacturing a display module, the method comprising:
    transporting a plurality of light emitting diodes (LEDs) of a substrate to a first relay substrate such that a first gap is between two immediately adjacent LEDs of the plurality of LEDs on the first relay substrate in one direction from among a row direction and a column direction;
    transporting the plurality of LEDs of the first relay substrate to a second relay substrate in a primary stretch array such that a second gap is between two immediately adjacent LEDs of the plurality of LEDs on the second relay substrate in the one direction from among the row direction and the column direction and a third gap is between two immediately adjacent LEDs of the plurality of LEDs on the second relay substrate in the other direction from among the row direction and the column direction, the second gap is greater than the first gap; and
    transporting the plurality of LEDs of the second relay substrate to a target substrate in a secondary stretch array such that a fourth gap is between two immediately adjacent LEDs of the plurality of LEDs on the target substrate in the other direction from among the row direction and the column direction, the fourth gap is greater than the third gap.

2. The method of claim 1, wherein the method further comprises: transporting the plurality of LEDs of the substrate to the first relay substrate in a same array as an array on the substrate.

3. The method of claim 1, wherein the LEDs have a same color.

4. The method of claim 1, wherein the method further comprises: transferring the plurality of LEDs of the second relay substrate to the target substrate in a laser transfer method.

5. The method of claim 4, wherein the method further comprises: electrically and physically connecting the plurality of LEDs transferred to the target substrate through a conductive adhesive formed on the target substrate in a thermally pressing method.

6. The method of claim 1, wherein the method further comprises: transferring the plurality of LEDs of the second relay substrate to the target substrate in a thermally pressing method.

7. The method of claim 6, wherein the method further comprises: electrically and physically connecting the plurality of LEDs transferred to the target substrate to an anisotropic conductive film layer formed on the target substrate by the thermally pressing method.

8. A method for manufacturing a display module, the method comprising:
    transporting a plurality of light emitting diodes (LEDs) of a substrate to a first relay substrate in an array of the substrate;
    transporting the plurality of LEDs of the first relay substrate to a second relay substrate, the plurality of LEDs on the second relay substrate comprising a first LED immediately adjacent a second LED in one direction from among a row direction and a column direction and a third LED being immediately adjacent the first LED in the other direction from among the row direction and the column direction, the first LED and the second LED being arrayed at a first chip pitch and the first LED and the third LED being arrayed at a second chip pitch;
    transporting the plurality of LEDs of the second relay substrate to a third relay substrate, the first LED and the second LED on the third relay substrate being arrayed at a third chip pitch in the one direction from among the row direction and the column direction;
    transporting the plurality of LEDs of the third relay substrate to a fourth relay substrate; and
    transporting the plurality of LEDs of the fourth relay substrate to a target substrate, first LED and the second LED on the target substrate being to be arrayed at a first display pitch, which is equal to the third chip pitch, the first LED and the third LED being arrayed at a second display pitch;
    wherein the third chip pitch is greater than the first chip pitch and the second display pitch is greater than the second chip pitch.

9. The method of claim 8, wherein, the first chip pitch and third chip pitch comprise a row direction chip pitch, and the second chip pitch comprises a column direction chip pitch that is greater than the second chip pitch.

* * * * *